United States Patent
Oga et al.

(10) Patent No.: US 12,406,889 B2
(45) Date of Patent: Sep. 2, 2025

(54) ELECTRONIC DEVICE MANUFACTURING METHOD

(71) Applicant: Gigaphoton Inc., Tochigi (JP)

(72) Inventors: Toshihiro Oga, Oyama (JP); Koichi Fujii, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 438 days.

(21) Appl. No.: 18/165,288

(22) Filed: Feb. 6, 2023

(65) Prior Publication Data

US 2023/0187286 A1 Jun. 15, 2023

Related U.S. Application Data

(63) Continuation of application No. PCT/JP2020/036019, filed on Sep. 24, 2020.

(51) Int. Cl.
*H01L 21/66* (2006.01)
*H01L 21/268* (2006.01)

(52) U.S. Cl.
CPC ............ *H01L 22/12* (2013.01); *H01L 21/268* (2013.01)

(58) Field of Classification Search
CPC .... G03F 7/20; G03F 7/70041; G03F 7/70058; G03F 7/70125; G03F 7/70441;
(Continued)

(56) References Cited

U.S. PATENT DOCUMENTS

| 5,095,190 A | 3/1992 | Aketagawa et al. |
| 5,739,899 A | 4/1998 | Nishi et al. |

(Continued)

FOREIGN PATENT DOCUMENTS

| JP | S63-213928 A | 9/1988 |
| JP | F08-305034 A | 11/1996 |

(Continued)

OTHER PUBLICATIONS

International Search Report issued in PCT/JP2020/036019; mailed Dec. 8, 2020.

(Continued)

*Primary Examiner* — Deoram Persaud
(74) *Attorney, Agent, or Firm* — Studebaker Brackett PLLC

(57) ABSTRACT

An electronic device manufacturing method according to an aspect of the present disclosure includes determining magnification in a scanning width direction based on a pattern formed in a scanning field of a wafer; measuring a wafer height at points in the scanning field and determining an average value of the wafer height in the scanning width direction; determining a wavelength range of a pulse laser beam in which an allowable CD value is obtained in a case of a focus position based on the average value of the wafer height; determining a first wavelength of the pulse laser beam at which the determined magnification is obtained and determining a target wavelength based on the wavelength range and the first wavelength; outputting a pulse laser beam controlled to have the target wavelength for each pulse; and performing exposure of the scanning field of the wafer to the pulse laser beam.

19 Claims, 52 Drawing Sheets

(58) Field of Classification Search
CPC ............ G03F 7/70558; G03F 7/70575; H01L 21/268; H01L 22/12; H01S 3/08059; H01S 3/094076; H01S 3/0941; H01S 3/1301; H01S 3/1305; H01S 3/1306; H01S 3/131; H01S 3/134; H01S 3/137; H01S 3/1625; H01S 3/1636; H01S 3/2251; H01S 3/2366; H01S 3/2375
See application file for complete search history.

(56) References Cited

U.S. PATENT DOCUMENTS

| | | | |
|---|---|---|---|
| 5,838,426 A | 11/1998 | Shinonaga et al. | |
| 6,256,086 B1 | 7/2001 | Sumiyoshi | |
| 2011/0205512 A1 | 8/2011 | Seong et al. | |
| 2015/0070673 A1 | 3/2015 | Lalovic et al. | |
| 2017/0241914 A1* | 8/2017 | Van Heumen | G03F 7/70033 |
| 2018/0159297 A1 | 6/2018 | Ahlawat et al. | |
| 2022/0373893 A1* | 11/2022 | Fujii | G03F 7/70441 |
| 2022/0373896 A1* | 11/2022 | Fujii | H01S 5/0687 |
| 2023/0098685 A1* | 3/2023 | Fujii | H01S 3/225 372/25 |

FOREIGN PATENT DOCUMENTS

| | | |
|---|---|---|
| JP | H08-316123 A | 11/1996 |
| JP | 2000-182952 A | 6/2000 |
| JP | 2001-076995 A | 3/2001 |

OTHER PUBLICATIONS

International Preliminary Report On Patentability and Written Opinion issued in PCT/JP2020/036019; issued Mar. 28, 2023.

* cited by examiner

| n | MAGNIFICATION $\beta cy(n)$ |
|---|---|
| 1 | $\beta cy(1)$ |
| 2 | $\beta cy(2)$ |
| 3 | $\beta cy(3)$ |
| ⋮ | ⋮ |
| n | $\beta cy(n)$ |
| ⋮ | ⋮ |
| N | $\beta cy(N)$ |

● : WAFER HEIGHT MEASUREMENT POINT

| n | FOCUS POSITION Fcy(n) |
|---|---|
| 1 | Fcy(1) |
| 2 | Fcy(2) |
| 3 | Fcy(3) |
| ⋮ | ⋮ |
| ⋮ | ⋮ |
| n | Fcy(n) |
| ⋮ | ⋮ |
| N | Fcy(N) |

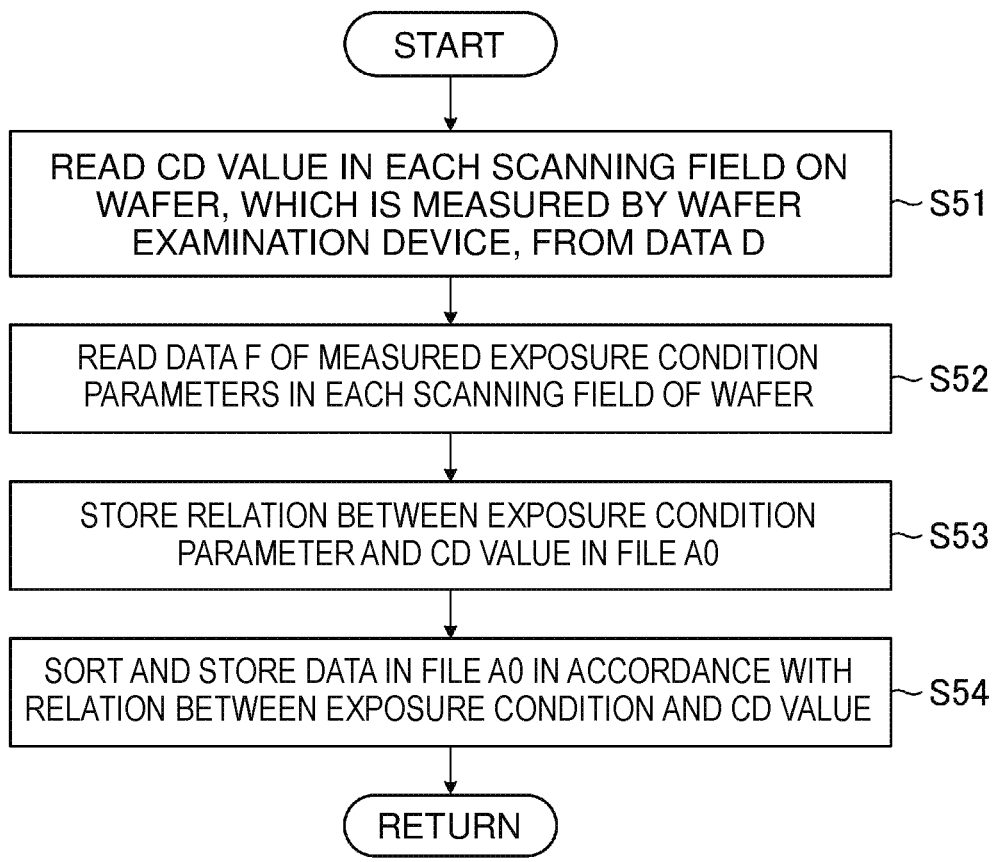

Fig. 25

| No. | EXPOSURE CONDITION PARAMETER ||||||| FOCUS POSITION Fcy | MAGNIFICATION $\beta$cy | CD VALUE |
| --- | --- | --- | --- | --- | --- | --- | --- | --- | --- |
| | ILLUMINATION OPTICAL SYSTEM PARAMETER IL | PROJECTION OPTICAL SYSTEM PARAMETER PJ | MASK PARAMETER M | DOSE D | WAVELENGTH $\lambda$ | SPECTRUM LINE WIDTH $\Delta\lambda$ | | | |
| 1 | IL1 | PJ1 | M1 | D1 | $\lambda$1 | $\Delta\lambda$1 | Fcy1 | Bcy1 | CD1 |
| 2 | IL2 | PJ2 | M2 | D2 | $\lambda$2 | $\Delta\lambda$2 | Fcy2 | Bcy2 | CD2 |
| 3 | IL3 | PJ3 | M3 | D3 | $\lambda$3 | $\Delta\lambda$3 | Fcy3 | Bcy3 | CD3 |
| ..... | ..... | ..... | ..... | ..... | ..... | ..... | ..... | ..... | ..... |
| k | ILk | PJk | Mk | Dk | $\lambda$k | $\Delta\lambda$k | Fcyk | Bcyk | CDk |
| ..... | ..... | ..... | ..... | ..... | ..... | ..... | ..... | ..... | ..... |
| ..... | ..... | ..... | ..... | ..... | ..... | ..... | ..... | ..... | ..... |
| r | ILr | PJr | Mr | Dr | $\lambda$r | $\Delta\lambda$r | Fcyr | Bcyr | CDr |

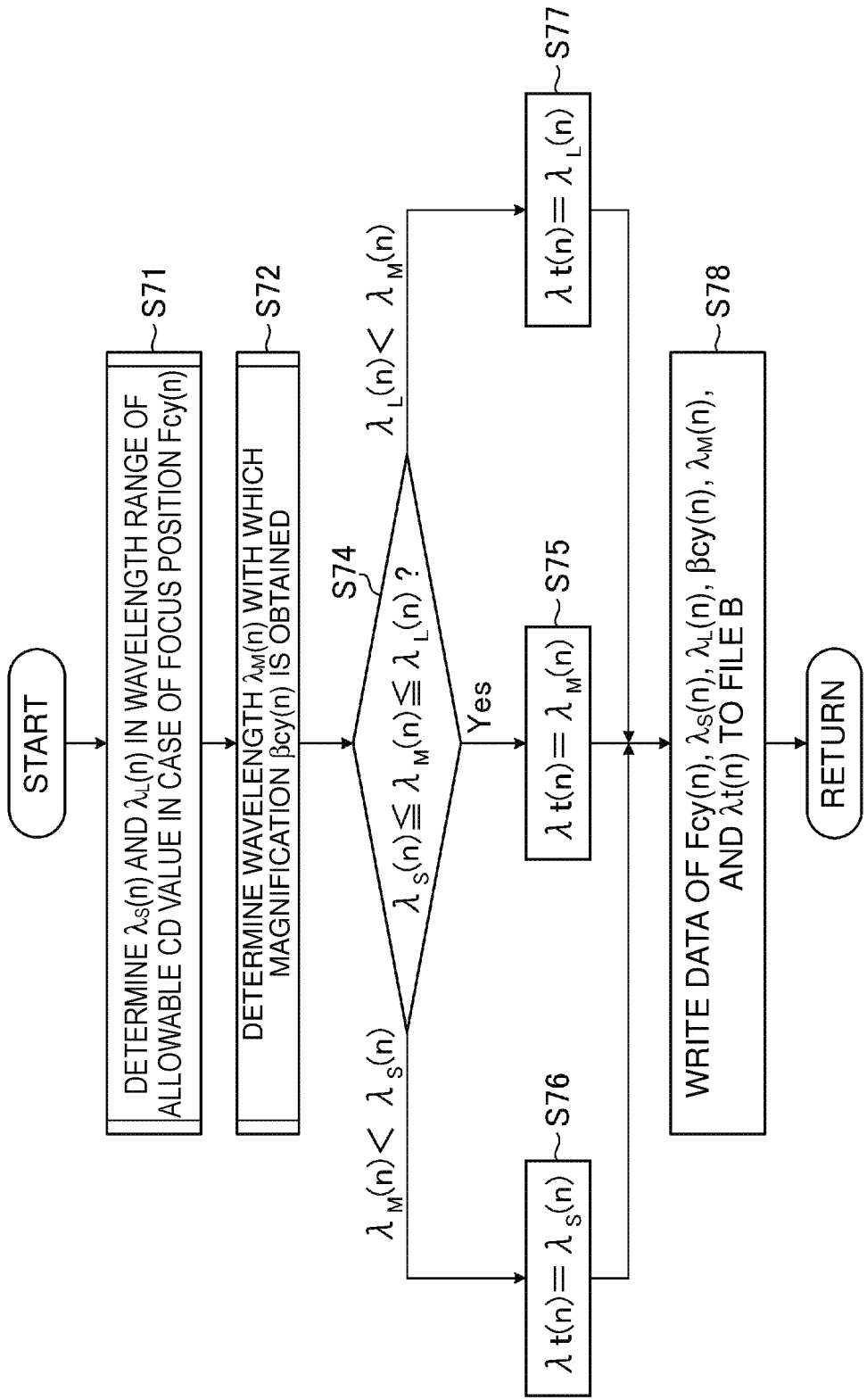

Fig. 28

| n | FOCUS POSITION Fcy(n) | WAVELENGTH RANGE WITH WHICH ALLOWABLE CD VALUE IS OBTAINED IN CASE OF FOCUS POSITION Fcy(n) | | MAGNIFICATION $\beta cy(n)$ | WAVELENGTH $\lambda_M(n)$ WITH WHICH MAGNIFICATION $\beta cy(n)$ IS OBTAINED | TARGET WAVELENGTH |
|---|---|---|---|---|---|---|
| | | SHORTEST WAVELENGTH $\lambda_S(n)$ | LONGEST WAVELENGTH $\lambda_L(n)$ | | | |
| 1 | Fcy(1) | $\lambda_S(1)$ | $\lambda_L(1)$ | $\beta cy(1)$ | $\lambda_M(1)$ | $\lambda t(1)$ |
| 2 | Fcy(2) | $\lambda_S(2)$ | $\lambda_L(2)$ | $\beta cy(2)$ | $\lambda_M(2)$ | $\lambda t(2)$ |
| 3 | Fcy(3) | $\lambda_S(3)$ | $\lambda_L(3)$ | $\beta cy(3)$ | $\lambda_M(3)$ | $\lambda t(3)$ |
| ..... | ..... | ..... | ..... | ..... | ..... | ..... |
| n | Fcy(n) | $\lambda_S(n)$ | $\lambda_L(n)$ | $\beta cy(n)$ | $\lambda_M(n)$ | $\lambda t(n)$ |
| ..... | ..... | ..... | ..... | ..... | ..... | ..... |
| N | Fcy(N) | $\lambda_S(N)$ | $\lambda_L(N)$ | $\beta cy(N)$ | $\lambda_M(N)$ | $\lambda t(N)$ |

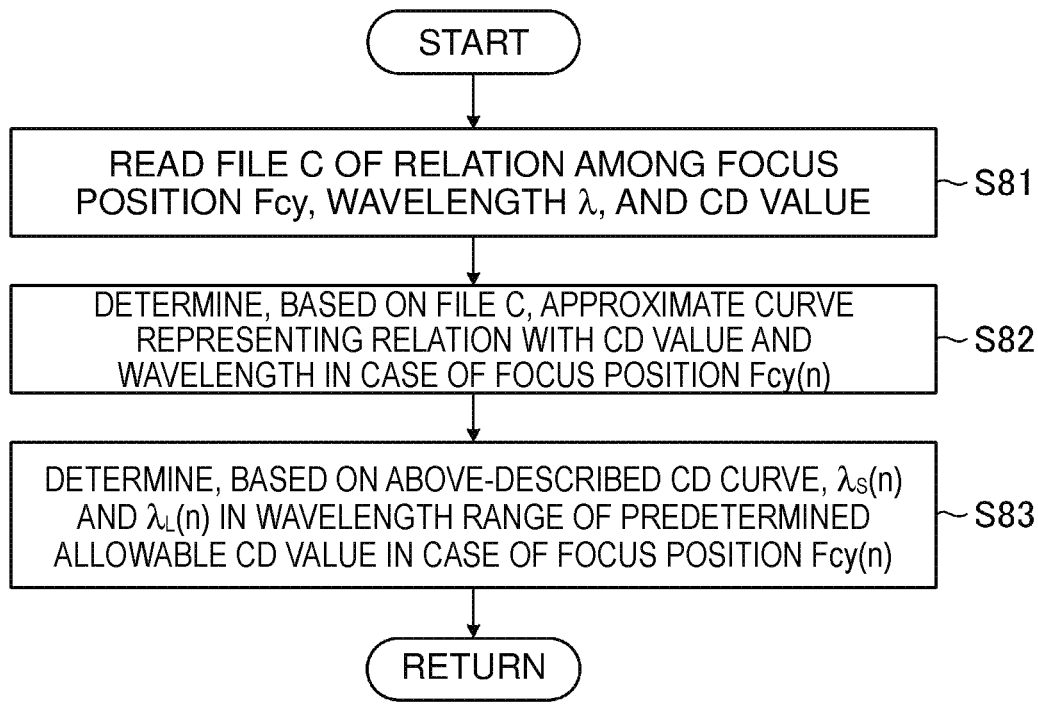

Fig. 30

|  | λ1 | λ2 | λ3 | ... | λp | ... | λP |
|---|---|---|---|---|---|---|---|
| Fcy1 | CD(1,1) | CD(2,1) | CD(3,1) | ... | CD(p,1) | ... | CD(P,1) |
| Fcy2 | CD(1,2) | CD(2,2) | CD(3,2) | ... | CD(p,2) | ... | CD(P,2) |
| Fcy3 | CD(1,3) | CD(2,3) | CD(3,3) | ... | CD(p,3) | ... | CD(P,3) |
| ... | ... | ... | ... | ... | ... | ... | ... |
| ... | ... | ... | ... | ... | ... | ... | ... |
| Fcyq | CD(1,q) | CD(2,q) | CD(3,q) | ... | CD(p,q) | ... | CD(p,Q) |
| ... | ... | ... | ... | ... | ... | ... | ... |
| FcyQ | CD(1,Q) | CD(2,Q) | CD(3,Q) | ... | CD(P,q) | ... | CD(P,Q) |

| k | WAVELENGTH $\lambda_k$ | MAGNIFICATION $\beta\, cy_k$ |
|---|---|---|
| 1 | $\lambda_1$ | $\beta\, cy_1$ |
| 2 | $\lambda_2$ | $\beta\, cy_2$ |
| 3 | $\lambda_3$ | $\beta\, cy_3$ |
| ⋮ | ⋮ | ⋮ |
| ⋮ | ⋮ | ⋮ |
| k | $\lambda_k$ | $\beta\, cy_k$ |
| ⋮ | ⋮ | ⋮ |
| K | $\lambda_K$ | $\beta\, cy_K$ |

| k | WAVELENGTH $\lambda_k$ | FOCUS POSITION $Fb_k$ |
|---|---|---|
| 1 | $\lambda_1$ | $Fb_1$ |
| 2 | $\lambda_2$ | $Fb_2$ |
| 3 | $\lambda_3$ | $Fb_3$ |
| ⋮ | ⋮ | ⋮ |
| ⋮ | ⋮ | ⋮ |
| k | $\lambda_k$ | $Fb_k$ |
| ⋮ | ⋮ | ⋮ |
| K | $\lambda_K$ | $Fb_K$ |

ELECTRONIC DEVICE MANUFACTURING METHOD

CROSS-REFERENCE TO RELATED APPLICATIONS

The present application is a continuation application of International Application No. PCT/JP2020/036019, filed on Sep. 24, 2020, the entire contents of which are hereby incorporated by reference.

BACKGROUND

1. Technical Field

The present disclosure relates to an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of the gas laser apparatus for exposure include a KrF excimer laser apparatus configured to output a laser beam having a wavelength of 248 nm approximately, and an ArF excimer laser apparatus configured to output a laser beam having a wavelength of 193 nm approximately.

The KrF excimer laser apparatus and the ArF excimer laser apparatus each have a wide spectrum line width of 350 pm to 400 pm approximately for spontaneous oscillation light. Thus, chromatic aberration occurs in some cases when a projection lens is made of a material that transmits ultraviolet such as KrF and ArF laser beams. This can lead to resolving power decrease. Thus, the spectrum line width of a laser beam output from the gas laser apparatus needs to be narrowed so that chromatic aberration becomes negligible. To narrow the spectrum line width, a line narrowing module (LNM) including a line narrowing element (for example, etalon or grating) is provided in a laser resonator of the gas laser apparatus in some cases. In the following, a gas laser apparatus that achieves narrowing of the spectrum line width is referred to as a line narrowed gas laser apparatus.

LIST OF DOCUMENTS

Patent Documents

Patent Document 1: Japanese Unexamined Patent Application Publication No. 2001-076995
Patent Document 2: US Patent Application Publication No. 2018/0159297
Patent Document 3: US Patent Application Publication No. 2015/0070673
Patent Document 4: US Patent Application Publication No. 2011/0205512

SUMMARY

An electronic device manufacturing method according to an aspect of the present disclosure is an electronic device manufacturing method including performing scanning exposure of a wafer to a pulse laser beam in an exposure apparatus. The electronic device manufacturing method includes determining magnification that is a distortion component in a scanning width direction orthogonal to a scanning direction based on a pattern formed on the wafer in a scanning field of the wafer; measuring a wafer height at a plurality of points in the scanning field of the wafer and determining an average value of the wafer height in the scanning width direction in the scanning field based on results of the measurement of the wafer height; determining a wavelength range of the pulse laser beam in which an allowable critical dimension (CD) value is obtained in a case of a focus position based on the average value of the wafer height; determining a first wavelength of the pulse laser beam at which the magnification is obtained; determining a target wavelength of the pulse laser beam based on the wavelength range and the first wavelength; generating, by the laser apparatus, the pulse laser beam that has the target wavelength for each pulse and outputting the pulse laser beam to the exposure apparatus; and performing exposure of the scanning field of the wafer to the pulse laser beam.

An electronic device manufacturing method according to another aspect of the present disclosure is an electronic device manufacturing method including performing scanning exposure of a wafer to a pulse laser beam in an exposure apparatus. The electronic device manufacturing method includes determining magnification that is a distortion component in a scanning width direction orthogonal to a scanning direction based on a pattern formed on the wafer in a scanning field of the wafer; measuring a focus position at a plurality of points in the scanning field of the wafer and determining an average value of the focus position in the scanning width direction in the scanning field based on results of the measurement of the focus position; determining a wavelength range of the pulse laser beam in which an allowable critical dimension (CD) value is obtained in a case of the average value of the focus position; determining a first wavelength of the pulse laser beam at which the magnification is obtained; determining a target wavelength of the pulse laser beam based on the wavelength range and the first wavelength; generating, by the laser apparatus, a pulse laser beam that has the target wavelength for each pulse and outputting the pulse laser beam to the exposure apparatus; and performing exposure of the scanning field of the wafer to the pulse laser beam.

An electronic device manufacturing method according to another aspect of the present disclosure is an electronic device manufacturing method including performing scanning exposure of a wafer to a pulse laser beam in an exposure apparatus. The electronic device manufacturing method includes determining magnification that is a distortion component in a scanning width direction orthogonal to a scanning direction based on a pattern formed on the wafer in a scanning field of the wafer; measuring a focus position at a plurality of points in the scanning field of the wafer and determining an average value of the focus position in a direction orthogonal to the scanning direction in the scanning field based on results of the measurement of the focus position; determining a first wavelength of the pulse laser beam at which the magnification is obtained; setting a target wavelength of the pulse laser beam to the first wavelength; determining a target focus position at which a critical dimension (CD) value is in an allowable range when the wavelength of the pulse laser beam is the first wavelength; controlling a wafer stage of the exposure apparatus based on the target focus position; generating, by the laser apparatus, a pulse laser beam that has the target wavelength for each pulse and outputting the pulse laser beam to the exposure apparatus; and performing exposure of the scanning field of the wafer to the pulse laser beam.

BRIEF DESCRIPTION OF THE DRAWINGS

Embodiments of the present disclosure will be described below merely as examples with reference to the accompanying drawings.

FIG. 24 is a flowchart illustrating an exemplary subroutine applied to step S15 in FIG. 12.

FIG. 25 illustrates an exemplary list of the relation among exposure condition parameters, the magnification βcy, and a CD value stored in a file A0.

FIG. 27 is a flowchart illustrating an exemplary subroutine applied to step S62 in FIG. 26.

FIG. 28 is a table listing an exemplary data table stored in a file B.

FIG. 29 is a flowchart illustrating an exemplary subroutine applied to step S71 in FIG. 27.

FIG. 30 is a table listing exemplary table data stored in a file C.

DESCRIPTION OF EMBODIMENTS

Contents

Figure 1:
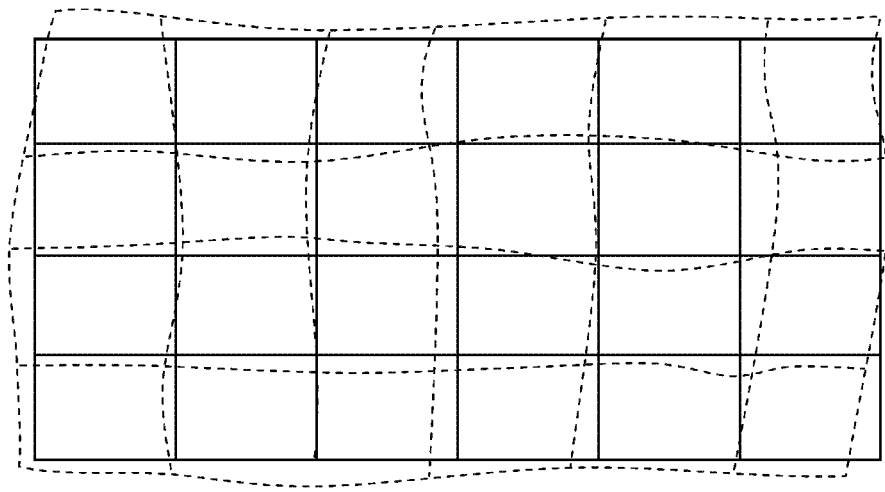
FIG. 1 illustrates the concept of distortion.

1. Terms
2. Overview of exposure and measurement flow in semiconductor manufacturing process
3. Overview of exposure system according to comparative example
   3.1 Configuration
   3.2 Operation
   3.3 Exemplary exposure operation on wafer
   3.4 Relation between scanning field and static exposure area
   3.5 Exemplary laser apparatus
      3.5.1 Configuration
      3.5.2 Operation
      3.5.3 Other
4. Problem
5. Embodiment 1
   5.1 Configuration
   5.2 Operation
      5.2.1 Overview of operation of lithography system
      5.2.2 Exemplary contents of processing by lithography control unit
      5.2.3 Exemplary contents of processing by exposure control unit
      5.2.4 Description of X axial-direction magnification βcy and focus position Fcy
      5.2.5 Exemplary subroutine of calculating and storing X axial-direction magnification βcy
      5.2.6 Exemplary subroutine of calculating and storing focus position Fcy
      5.2.7 Average value of wafer height
      5.2.8 Exemplary subroutine of storing relation between exposure condition and CD value
      5.2.9 Exemplary subroutine of determining target wavelength λt of each pulse based on magnification βcy, focus position Fcy, and CD
   5.3 Effect
6. Embodiment 2
   6.1 Configuration
   6.2 Operation
      6.2.1 Exemplary contents of processing by lithography control unit
      6.2.2 Exemplary contents of processing by exposure control unit
   6.3 Effect
7. Embodiment 3
   7.1 Configuration
   7.2 Operation
   7.3 Effect
   7.4 Modification
8. Embodiment 4
   8.1 Configuration
   8.2 Operation
   8.3 Effect
   8.4 Modification 1
   8.5 Modification 2
9. Embodiment 5
   9.1 Configuration
   9.2 Operation
   9.3 Effect
   9.4 Modification
   9.5 Other
10. Exemplary excimer laser apparatus that uses solid-state laser device as oscillator
    10.1 Configuration
    10.2 Operation
    10.3 Description of semiconductor laser system
       10.3.1 Configuration
       10.3.2 Operation
    10.4 Effect
    10.5 Modification
    10.6 Other
11. Hardware configurations of various control units
12. Electronic device manufacturing method
13. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

Terms used in the present disclosure are defined as described below.

A critical dimension (CD) is the dimension of a minute pattern formed on a wafer such as a semiconductor.

Overlay is overlay of a minute pattern formed on a wafer such as a semiconductor.

A spectrum line width $\Delta\lambda$ is an index value of a spectrum line width that affects exposure performance. The spectrum line width $\Delta\lambda$ may be, for example, a bandwidth over which the integral energy of a laser spectrum is 95%.

An optical proximity effect (OPE) is a phenomenon that the dimensions of patterns exposed on a wafer change in accordance with the distance between the patterns. An easily understandable example is a phenomenon that line patterns having the same dimension on a mask have dimensions different from each other when exposed on a wafer, depending on whether they are in a state of being closely spaced or a state of being isolated from each other.

Figure 2:
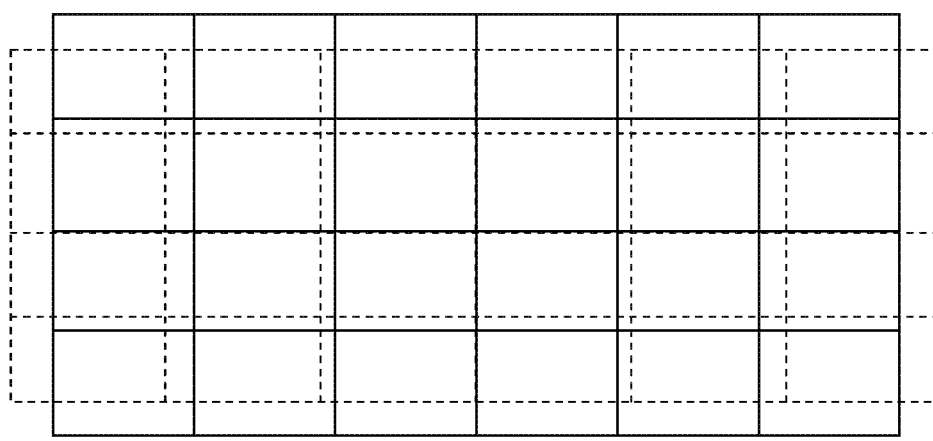
FIG. 2 illustrates the concept of magnification distortion.

Distortion and its component, which is magnification distortion, will be described below with reference to FIGS. 1 and 2. FIG. 1 illustrates the concept of distortion. In FIG.

1, solid lines represent an ideal grid (positions to be exposed) on a wafer, and dashed lines represent actually exposed positions. When a wafer such as a semiconductor is exposed by an exposure apparatus, the shape of a scanning field deviates from an accurate rectangle due to various causes. Deformation also occurs inside the scanning field, and a pattern deviates from a position where the pattern should be, for example, from a grid in some cases. Such a phenomenon is called distortion. The causes of distortion are, for example, aberration of a projection optical system, the accuracy of synchronization of a wafer stage and a reticle stage in scanning exposure, and wafer deformation due to wafer chuck.

Magnification distortion is a component of the above-described distortion, with which a positional shift is proportional to the coordinates of a pattern. Magnification distortion is also simply referred to as "magnification". Typically, information of "magnification" is obtained by disassembling distortion into components such as "simple shift", "magnification", and "high-order undulation". Thus, magnification is one of distortion components. FIG. 2 illustrates the concept of magnification distortion. In FIG. 2, the lateral direction is defined as an X axial direction, and the longitudinal direction is defined as a Y axial direction. At each position (actually exposed position) illustrated with dashed lines in FIG. 2, the amount of shift in the X axial direction from an ideal grid illustrated with solid lines is proportional to the distance from the center in the X axial direction. The same shift occurs in the Y axial direction as well but does not necessarily occur with the same direction and the same proportional coefficient in the X and Y axial directions.

The term "parallel" in the present specification may include the concept of being substantially parallel, which can be regarded as an equivalent to being parallel in effect in technological meaning. In addition, the term "vertical" or "orthogonal" in the present specification may include the concept of being substantially vertical or substantially orthogonal, which can be regarded as an equivalent to being vertical in effect or orthogonal in effect in technological meaning.

Figure 3:
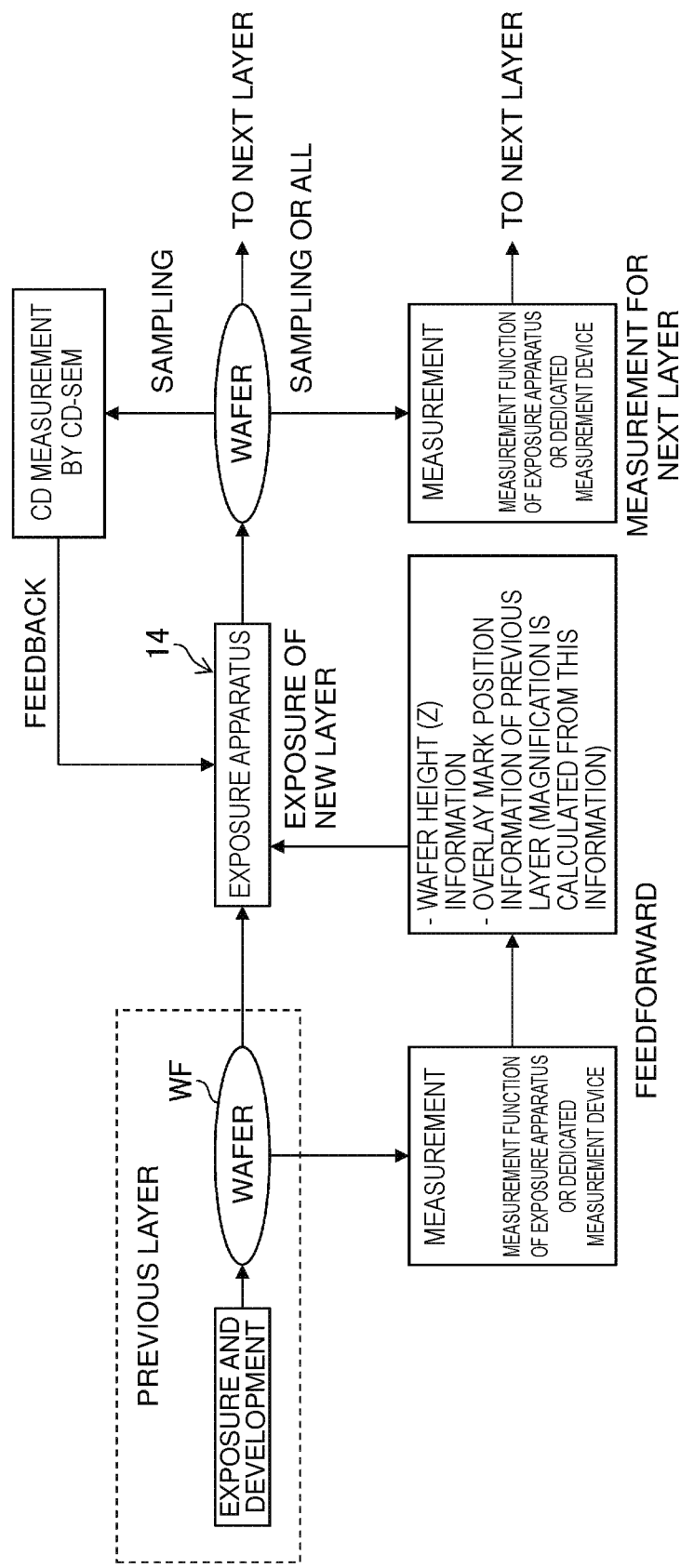
FIG. 3 illustrates the concept of an exposure and measurement flow in an exemplary semiconductor manufacturing process.

2. Overview of Exposure and Measurement Flow in Semiconductor Manufacturing Process FIG. 3 illustrates the concept of an exposure and measurement flow in an exemplary semiconductor manufacturing process. When a wafer WF after exposure and image development of the previous layer is to be subjected to exposure with a new layer by an exposure apparatus 14, measurement for acquiring height information and distortion information including magnification is performed on the wafer WF to be subjected to the exposure, and feedforward control is performed based on a result of the measurement. The measurement of the wafer WF is performed by a measurement function of the exposure apparatus having performed exposure of the previous layer or by a dedicated measurement device.

Measurement items include the height information of the wafer WF and place-over mark position information of the previous layer. The height information of the wafer WF is position (height) information in the thickness direction of the wafer WF, in other words, a Z direction and is also referred to as Z information. Magnification of distortion is calculated based on the place-over mark position information of the previous layer.

A knob of the feedforward control is control of, for example, the vertical position (Z direction position) of the wafer, relative scanning speeds of the wafer and a reticle (mask), and the magnification of the projection optical system.

CD information is controlled based on feedback information from the previous wafer because exposure is yet to be performed. A knob of the feedback control is, for example, the vertical position of the wafer and the amount of exposure, but is the amount of exposure only in most cases in reality.

CD measurement is performed by sampling part of the wafer WF exposed with the exposure apparatus 14 and by using, for example, a critical dimension-scanning electron microscope (CD-SEM).

3. Overview of Exposure System According to Comparative Example

3.1 Configuration

Figure 4:
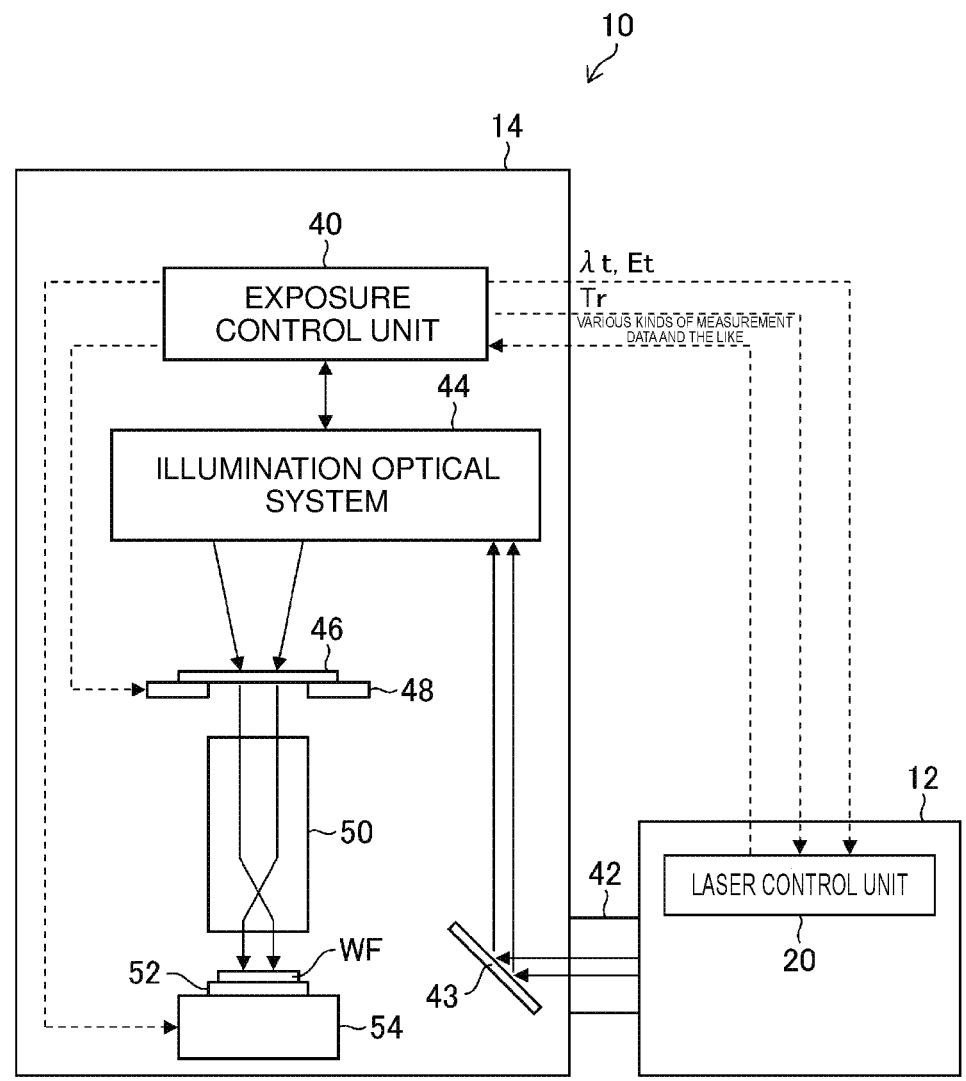
FIG. 4 schematically illustrates the configuration of an exposure system according to a comparative example.

FIG. 4 schematically illustrates the configuration of an exposure system 10 according to a comparative example. The comparative example of the present disclosure is an example that the applicant recognizes as known only by the applicant, but is not a publicly known example that is recognized by the applicant. The exposure system 10 includes a laser apparatus 12 and the exposure apparatus 14. The laser apparatus 12 is a wavelength-variable narrow-band oscillation ArF laser apparatus including a laser control unit 20, a non-illustrated laser chamber, and a non-illustrated line narrowing module.

The exposure apparatus 14 includes an exposure control unit 40, a beam delivery unit (BDU) 42, a high reflective mirror 43, an illumination optical system 44, a reticle 46, a reticle stage 48, a projection optical system 50, a wafer holder 52, and a wafer stage 54. "Reticle" is synonymous with "mask".

The wafer holder 52 holds a wafer WF. The illumination optical system 44 is an optical system through which a pulse laser beam is guided to the reticle 46. The illumination optical system 44 shapes the laser beam into a scanning beam having a substantially rectangular shape and uniform light intensity distribution. In addition, the illumination optical system 44 controls the incident angle of the laser beam on the reticle 46. The projection optical system 50 images a reticle pattern on the wafer WF.

The exposure control unit 40 is connected to the reticle stage 48 and the wafer stage 54. The exposure control unit 40 is also connected to the laser control unit 20. Each of the exposure control unit 40 and the laser control unit 20 is configured as a non-illustrated processor and includes a storage device such as a memory. The storage device may be mounted on the processor.

3.2 Operation

The exposure control unit 40 transmits a target wavelength $\lambda t$ to the laser apparatus 12 at each burst.

The laser control unit 20 controls a selection wavelength of the line narrowing module so that a wavelength $\lambda$ of a pulse laser beam output from the laser apparatus 12 becomes equal to the target wavelength $\lambda t$, and also controls excitation intensity so that pulse energy E becomes equal to target pulse energy Et, thereby outputting the pulse laser beam in accordance with a light emission trigger signal Tr. In addition, the laser control unit 20 transmits, to the exposure control unit 40, various measurement data of the pulse laser beam output in accordance with the light emission trigger signal Tr. The various measurement data includes, for example, the wavelength λ and the pulse energy E.

By a step-and-scan scheme, the exposure control unit 40 transmits control parameters of a target laser beam to the laser control unit 20 at each burst and controls the reticle stage 48 and the wafer stage 54 while transmitting the light emission trigger signal Tr to perform scanning exposure of an image of the reticle 46 to the wafer WF. The control parameters of the target laser beam include, for example, the target wavelength λt and the target pulse energy Et. Note that the phrase "target laser beam" means "target pulse laser beam". "Pulse laser beam" is simply written as "laser beam" in some cases.

3.3 Exemplary Exposure Operation on Wafer

Figure 5:
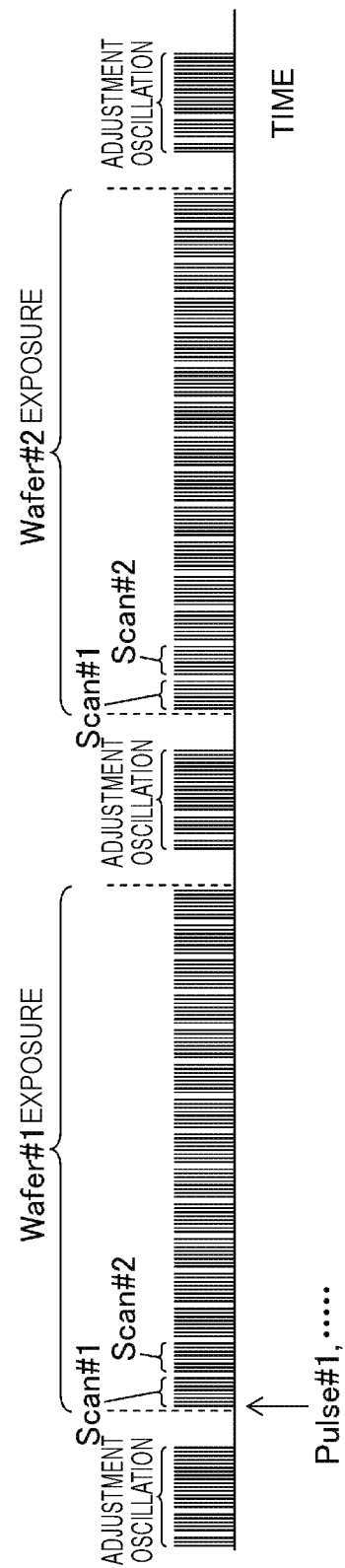
FIG. 5 illustrates an exemplary output pattern of a light emission trigger signal Tr transmitted from an exposure control unit to a laser control unit.

FIG. 5 illustrates an exemplary output pattern of the light emission trigger signal Tr transmitted from the exposure control unit 40 to the laser control unit 20. In the example illustrated in FIG. 5, an actual exposure pattern starts after adjustment oscillation is performed for each wafer WF. Specifically, the laser apparatus 12 first performs the adjustment oscillation and then performs burst operation for first wafer (Wafer #1) exposure after a predetermined time interval.

The adjustment oscillation is oscillation with emission of an adjustment pulse laser beam but no irradiation of the wafer WF with the pulse laser beam. The adjustment oscillation is performed under a predetermined condition until the laser stabilizes in a state in which exposure is possible, and is performed before lot of wafer production. A pulse laser beam is output at a predetermined frequency of, for example, several hundreds Hz to several kHz approximately. In wafer exposure, it is typical to perform burst operation that repeats a burst duration and an oscillation stop duration. The burst operation is performed in the adjustment oscillation as well.

In FIG. 5, each interval in which pulses are closely spaced is the burst duration in which the pulse laser beam is continuously output for a predetermined duration. In FIG. 5, each interval in which no pulse exists is the oscillation stop duration. Note that, in the adjustment oscillation, the length of each continuous emission duration of pulses does not need to be constant, but continuous emission operation may be performed in continuous emission durations with different lengths for adjustment. After the adjustment oscillation is performed, followed by a relatively large time interval, the first wafer (Wafer #1) exposure is performed at the exposure apparatus 14.

Figure 6:
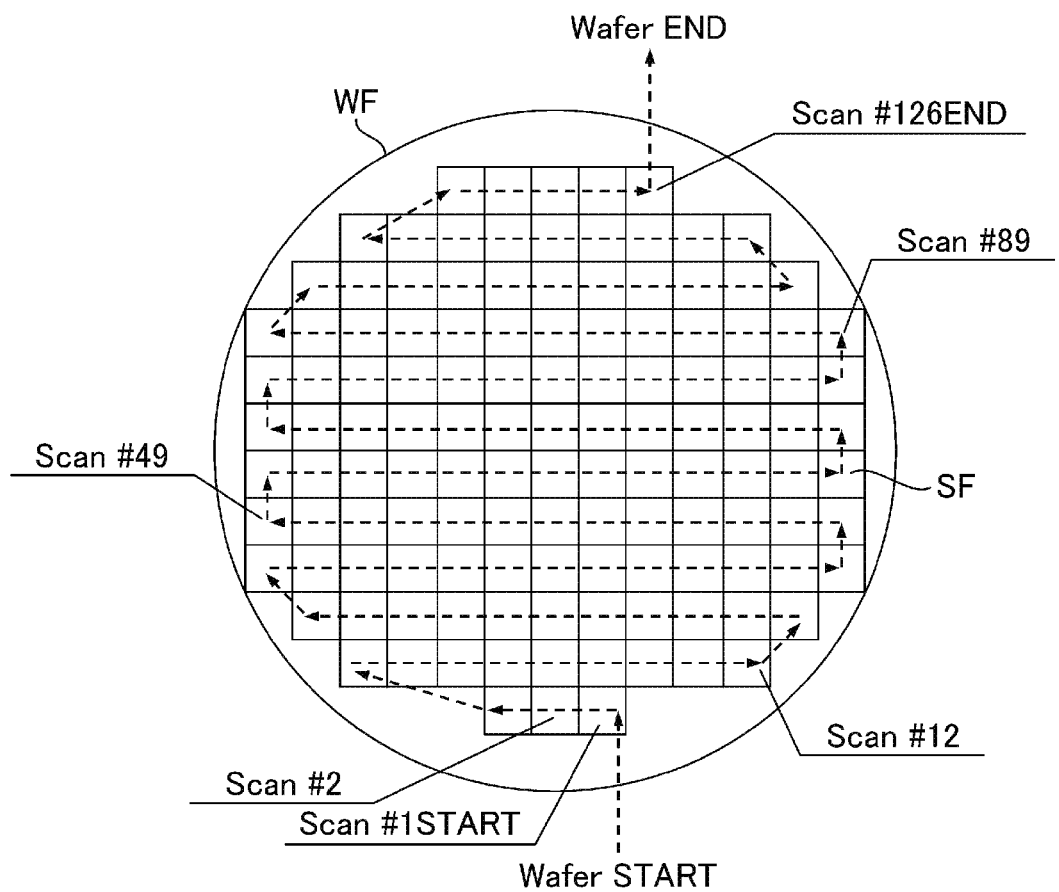
FIG. 6 illustrates an exemplary exposure pattern of step-and-scan exposure on a wafer.

FIG. 6 illustrates an exemplary exposure pattern of step-and-scan exposure on the wafer WF. Each of a plurality of rectangular regions illustrated in the wafer WF in FIG. 6 is a scanning field SF. The scanning field SF is an exposure region of one scanning exposure and also referred to as a scanning region. As illustrated in FIG. 6, wafer exposure is performed by dividing the wafer WF into a plurality of exposure regions (scanning fields) of a predetermined size and performing scanning exposure in each exposure region in a duration between start (Wafer START) and end (Wafer END) of the wafer exposure.

Specifically, the wafer exposure repeats steps such as the first scanning exposure (Scan #1) in a first predetermined exposure region of the wafer WF and the second scanning exposure (Scan #2) in a second predetermined exposure region. During one scanning exposure, a plurality of pulse laser beams (Pulse #1, Pulse #2, . . . ) can be continuously output from the laser apparatus 12. When such scanning exposure is sequentially repeated, and completed for all exposure regions of the first wafer WF, the adjustment oscillation is performed again and then wafer exposure (Wafer #2) of the second wafer WF is performed.

The step-and-scan exposure is performed in an order illustrated with dashed line arrows in FIG. 6, namely, Wafer START→Scan #1→Scan #2→ . . . →Scan #126→Wafer END. Each wafer WF is an example of a semiconductor substrate (photosensitive substrate) on which resist is applied.

3.4 Relation Between Scanning Field and Static Exposure Area

Figure 7:
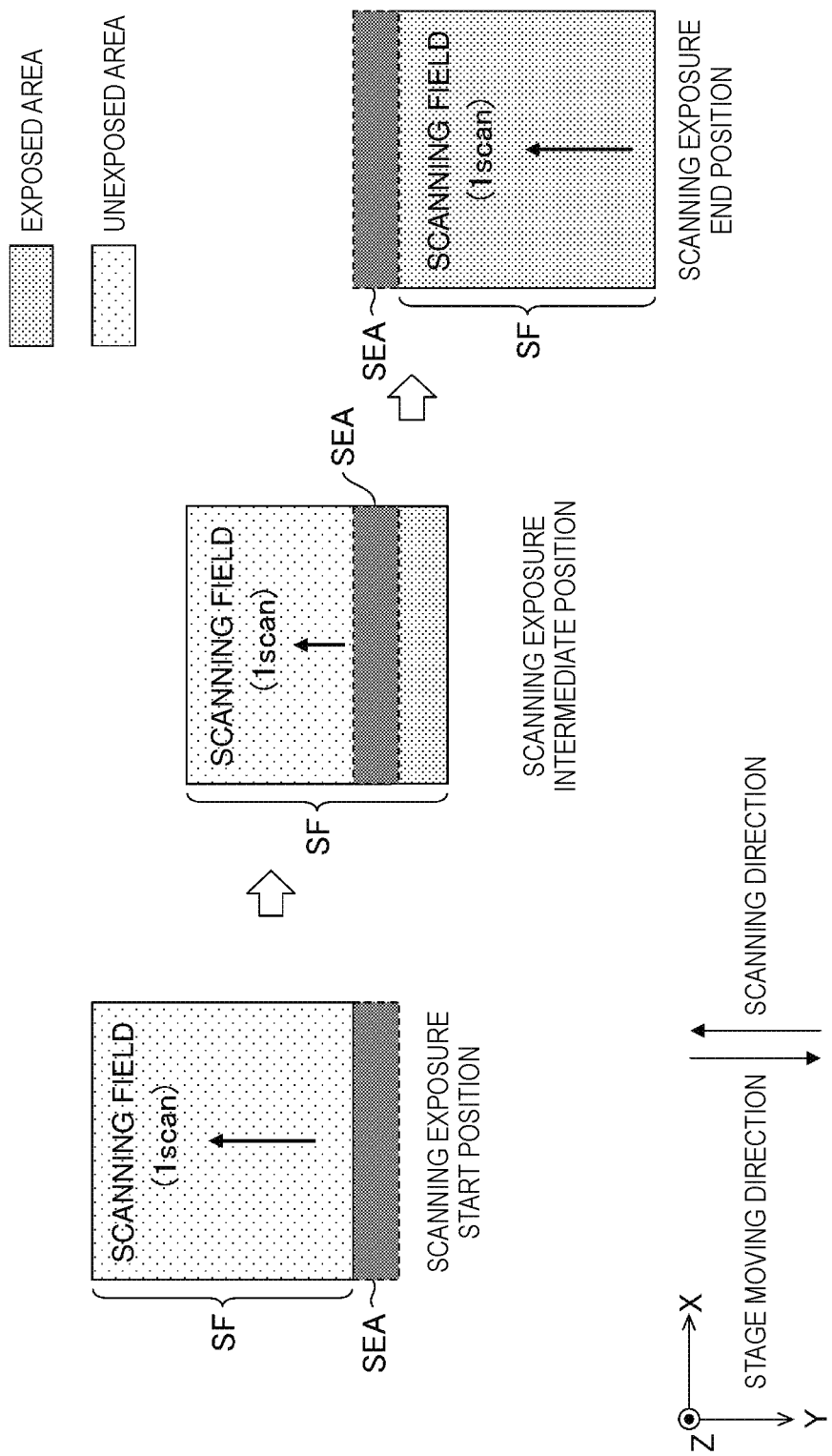
FIG. 7 illustrates the relation between one scanning field on the wafer and a static exposure area.

FIG. 7 illustrates the relation between one scanning field SF on the wafer WF and a static exposure area SEA. The static exposure area SEA is a beam irradiation region having a substantially rectangular shape and substantially uniform light intensity distribution and used for scanning exposure in the scanning field SF. Exposure is performed as the reticle 46 is irradiated with a substantially rectangular and substantially uniform scanning beam shaped through the illumination optical system 44, and, while the reticle 46 and the wafer WF are moved in mutually different directions along a short axial direction (in this example, the Y axial direction) of the scanning beam in accordance with a scaling-down ratio of the projection optical system 50. Accordingly, each scanning field SF on the wafer WF is subjected to scanning exposure of a reticle pattern. The static exposure area SEA can be understood as an area in which collective exposure by a scanning beam is possible. The area in which collective exposure is possible may be interpreted as an area in which static exposure is possible.

In FIG. 7, a direction toward the negative Y axial direction side in the upward longitudinal direction is a scanning direction, and a direction toward the positive Y axial direction side is a wafer moving direction (stage moving direction). A direction (X axial direction) parallel to the sheet of FIG. 7 and orthogonal to the Y axial direction is referred to as a scanning width direction. The size of each scanning field SF on the wafer WF is, for example, 33 mm in the Y axial direction and 26 mm in the X axial direction.

Figure 8:
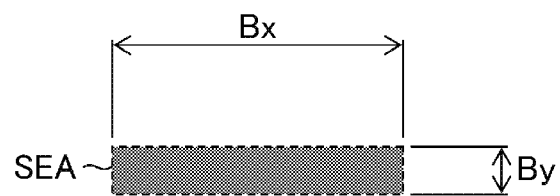
FIG. 8 is an explanatory diagram of the static exposure area.

FIG. 8 is an explanatory diagram of the static exposure area SEA. When Bx represents the length of the static exposure area SEA in the X axial direction and By represents the width of the static exposure area SEA in the Y axial direction, Bx corresponds to the size of each scanning field SF in the X axial direction and By is sufficiently smaller than the size of each scanning field SF in the Y axial direction. The width By of the static exposure area SEA in the Y axial direction is referred to as an N slit. The number NSL of pulses to which resist on the wafer WF is exposed is given by an expression below.

$$NSL=(By/Vy) \cdot f$$

Vy: scanning speed of the wafer in the Y axial direction
f: laser repetition frequency (Hz)

3.5 Exemplary Laser Apparatus

3.5.1 Configuration

Figure 9:
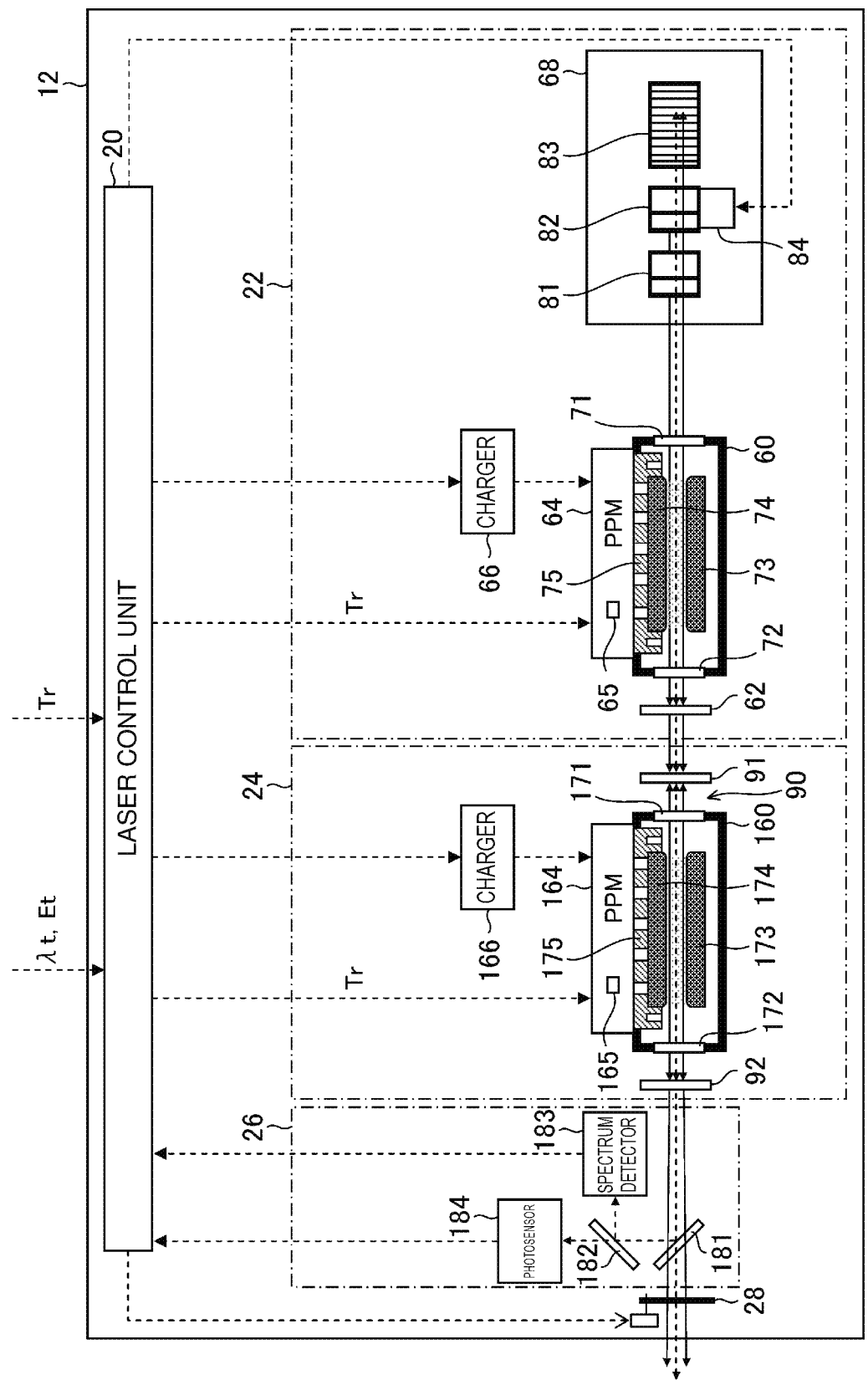
FIG. 9 schematically illustrates an exemplary configuration of a laser apparatus.

FIG. 9 schematically illustrates an exemplary configuration of the laser apparatus 12. The laser apparatus 12 illustrated in FIG. 9 is a line narrowing ArF laser apparatus and includes the laser control unit 20, an oscillator 22, an amplifier 24, a monitor module 26, and a shutter 28. The oscillator 22 includes a chamber 60, an output coupling mirror 62, a pulse power module (PPM) 64, a charger 66, and a line narrowing module (LNM) 68.

The chamber 60 includes windows 71 and 72, a pair of electrodes 73 and 74, and an electrically insulating member 75. The PPM 64 includes a switch 65 and a non-illustrated charging capacitor and is connected to the electrode 74 via feed-through of the electrically insulating member 75. The electrode 73 is connected to the chamber 60 that is grounded. The charger 66 charges the charging capacitor of the PPM 64 in accordance with a command from the laser control unit 20.

The line narrowing module 68 and the output coupling mirror 62 constitute an optical resonator. The chamber 60 is disposed such that a discharge region of the electrodes 73 and 74 is disposed on the optical path of the resonator. The output coupling mirror 62 is coated with a multi-layered film that reflects part of a laser beam generated in the chamber 60 and transmits other part of the laser beam.

The line narrowing module 68 includes two prisms 81 and 82, a grating 83, and a rotation stage 84 configured to rotate the prism 82. The line narrowing module 68 changes the incident angle of a pulse laser beam on the grating 83 by rotating the prism 82 by using the rotation stage 84, and accordingly, controls the oscillation wavelength of the pulse laser beam. The rotation stage 84 may include a piezoelectric element capable of performing high-speed response so that response to each pulse is possible.

The amplifier 24 includes an optical resonator 90, a chamber 160, a PPM 164, and a charger 166. The configurations of the chamber 160, the PPM 164, and the charger 166 are the same as the configurations of the corresponding elements of the oscillator 22. The chamber 160 includes windows 171 and 172, a pair of electrodes 173 and 174, and an electrically insulating member 175. The PPM 164 includes a switch 165 and a non-illustrated charging capacitor.

The optical resonator 90 is a Fabry-Perot optical resonator constituted by a rear mirror 91 and an output coupling mirror 92. The rear mirror 91 partially reflects part of a laser beam and transmits other part of the laser beam. The output coupling mirror 92 partially reflects part of a laser beam and transmits other part of the laser beam. The reflectance of the rear mirror 91 is, for example, 80% to 90%. The reflectance of the output coupling mirror 92 is, for example, 10% to 30%.

The monitor module 26 includes beam splitters 181 and 182, a spectrum detector 183, and a photosensor 184 configured to detect pulse energy E of a laser beam. The spectrum detector 183 may be, for example, an etalon spectrometer. The photosensor 184 may be, for example, a photodiode.

3.5.2 Operation

When having received data of the target wavelength $\lambda t$ and the target pulse energy Et from the exposure control unit 40, the laser control unit 20 controls the rotation stage 84 of the LNM 68 so that an emission wavelength becomes equal to the target wavelength $\lambda t$, and controls at least the charger 166 of the amplifier 24 so that the target pulse energy Et is obtained.

When having received the light emission trigger signal Tr from the exposure control unit 40, the laser control unit 20 provides a trigger signal to each of the switch 165 of the PPM 164 and the switch 65 of the PPM 64 so that discharge occurs when a pulse laser beam output from the oscillator 22 enters a discharge space of the chamber 160 of the amplifier 24. As a result, the pulse laser beam output from the oscillator 22 is subjected to amplified oscillation at the amplifier 24. The amplified pulse laser beam is sampled by the beam splitter 181 of the monitor module 26 to measure the pulse energy E and the wavelength $\lambda$.

The laser control unit 20 acquires data of the pulse energy E and the wavelength $\lambda$ measured by using the monitor module 26 and controls the charging voltage of the charger 166 and the oscillation wavelength of the oscillator 22 so that the difference between the pulse energy E and the target pulse energy Et and the difference between the wavelength $\lambda$ and the target wavelength $\lambda t$ each approach zero.

The laser control unit 20 can control the pulse energy E and the wavelength $\lambda$ for each pulse.

The pulse laser beam having transmitted through the beam splitter 181 of the monitor module 26 enters the exposure apparatus 14 through the shutter 28. The spectrum line width $\Delta\lambda$ of the pulse laser beam output from the laser apparatus 12 can be controlled by controlling the delay time $\Delta t$ between the discharge timings of the chamber 60 of the oscillator 22 and the chamber 160 of the amplifier 24.

3.5.3 Other

Although the optical resonator 90 is a Fabry-Perot resonator in the example illustrated in FIG. 9, the amplifier may include a ring resonator.

4. Problem

In the case of the exposure system 10 according to the comparative example, the target wavelength $\lambda t$ of a burst pulse in scanning exposure Scan #k is calculated at each burst such that a focus position corresponding to the average height of the wafer WF is achieved. Target wavelength data is transmitted to the laser control unit 20, and scanning exposure is performed.

However, a wafer height Hcy in a scanning field SF of Scan #k changes in the scanning direction (Y axial direction) (refer to a graph G1 illustrated at the middle part of FIG. 10), and thus focus positional shift occurs in a region shifted from the average value (average height) in some cases.

Furthermore, when overlay accuracy is to be increased, magnification βcy changes in a direction (the X axial direction) orthogonal to the scanning direction (refer to a graph G2 illustrated at the lower part of FIG. 10), and thus correction of the X axial-direction magnification βcy is needed as well.

Figure 10:
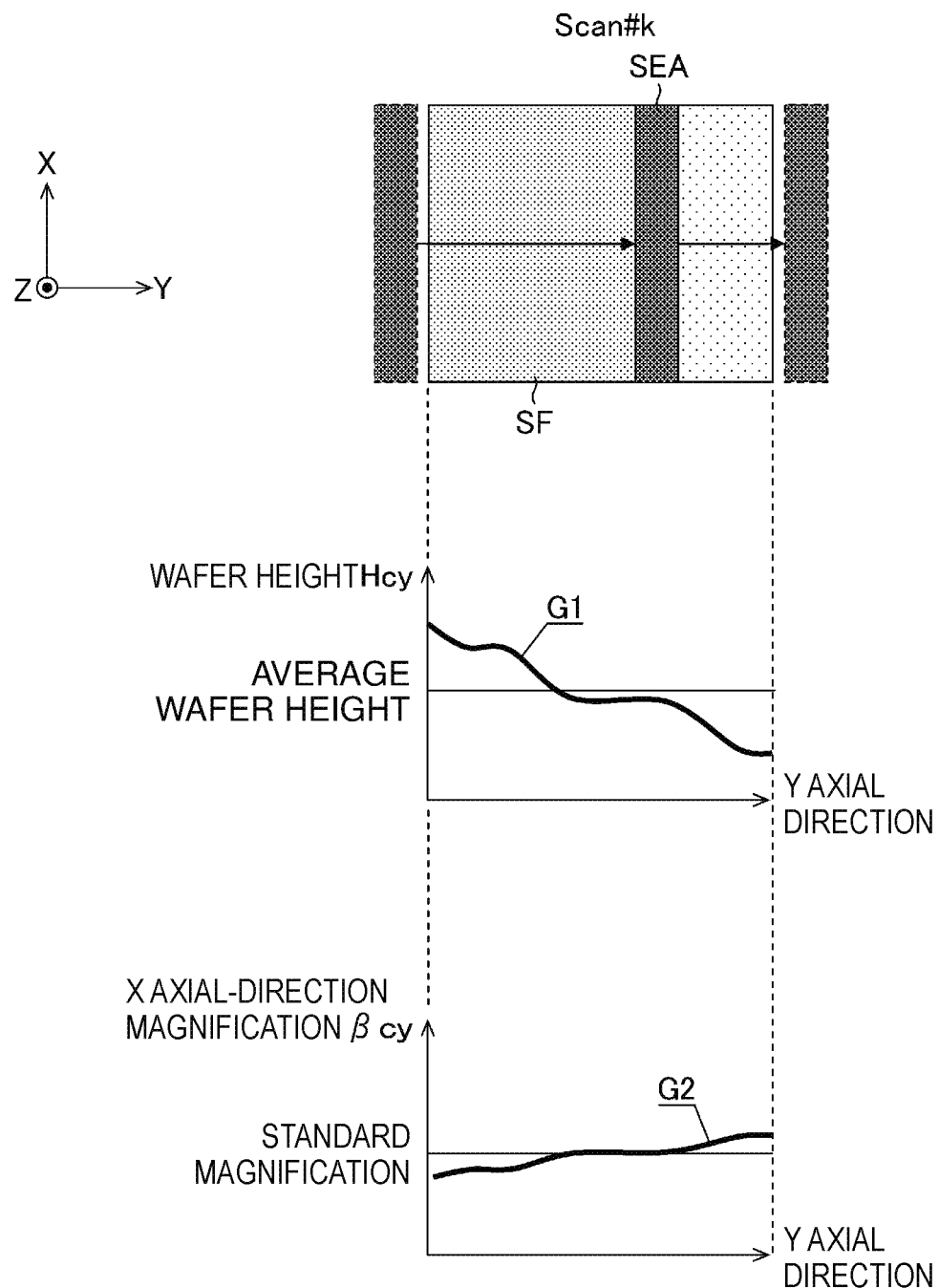
FIG. 10 is an explanatory diagram exemplarily illustrating Y-axial-direction dependency of a wafer height in the scanning field and Y-axial-direction dependency of magnification in an X axial direction.

FIG. 10 is an explanatory diagram exemplarily illustrating Y axial-direction dependency of the wafer height Hcy and Y axial-direction dependency of the X axial-direction magnification βcy in the scanning field SF.

The upper part of FIG. 10 schematically illustrates a state in which scanning exposure is performed in the scanning field SF of Scan #k. The middle part of FIG. 10 illustrates the graph G1 representing Y axial-direction dependency of the actually measured wafer height Hcy in the scanning field SF of Scan #k, and a wafer average height. The wafer average height may be the average value of height in the scanning field SF of Scan #k or may be the average value of height over the entire wafer WF.

The lower part of FIG. 10 illustrates the graph G2 representing Y axial-direction dependency of the actually measured X axial-direction magnification βcy in the scanning field SF of Scan #k, and standard magnification.

As illustrated in FIG. 10, it is needed to achieve both correction of the magnification βcy and correction of the focus position in the scanning field SF due to wavelength change of a laser beam for each pulse.

5. Embodiment 1

5.1 Configuration

Figure 11:
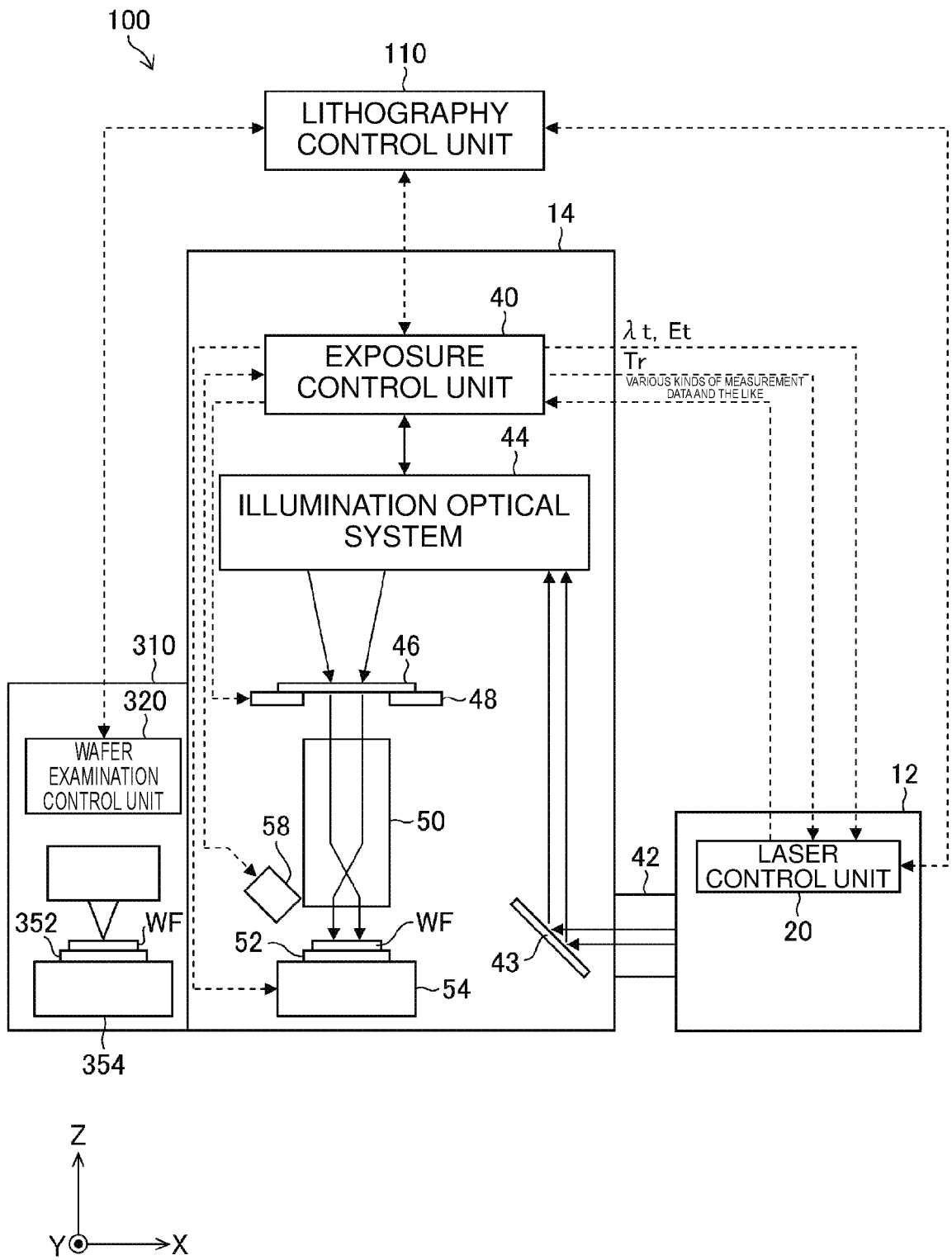
FIG. 11 schematically illustrates an exemplary configuration of a lithography system according to Embodiment 1.

FIG. 11 schematically illustrates an exemplary configuration of a lithography system 100 according to Embodiment 1. Description will be made on the difference of the configuration illustrated in FIG. 11 from the configuration illustrated in FIG. 4. The lithography system 100 illustrated in FIG. 11 is an entire system including a wafer examination device 310 and a lithography control unit 110 in addition to the configuration of the exposure system 10 illustrated in FIG. 4.

The wafer examination device 310 can measure the CD, the height of the wafer WF, and overlay by irradiating the wafer WF with light and measuring reflected light or diffracting light thereof. The wafer examination device 310 may be a high-resolution scanning electron microscope (SEM). The wafer examination device 310 includes a wafer examination control unit 320, a wafer holder 352, and a wafer stage 354. The wafer examination device 310 is an example of an "examination device" in the present disclosure. The wafer examination device 310 may include a plurality of meters.

The lithography control unit 110 is configured as a non-illustrated processor. The lithography control unit 110 includes a storage device such as a memory. The processor may include the storage device. The lithography control unit 110 is connected to a signal line through which data and the like are transmitted to and received from each of the wafer examination control unit 320, the exposure control unit 40, and the laser control unit 20.

The exposure apparatus 14 in the lithography system 100 includes a focus sensor 58 configured to measure the height of the wafer WF. The focus sensor 58 is connected to the exposure control unit 40.

5.2 Operation

5.2.1 Overview of Operation of Lithography System

The wafer examination device 310 examines a wafer WF yet to be exposed, measures the positions, dimensions, and the like of each scanning field SF, the height of the wafer WF in the scanning field SF, and a fabrication pattern, and transmits measurement data corresponding to each scanning field SF of the wafer WF to the lithography control unit 110.

The lithography control unit 110 calculates a focus position Fcy and the magnification βcy in the direction orthogonal to the scanning direction in each scanning field SF of the wafer WF based on the average value of the height of the wafer WF and the position of the pattern.

The lithography control unit 110 calculates the target wavelength λt based on the focus position Fcy, which depends on the position of each scanning field SF in the scanning direction, and based on the magnification βcy and the CD value. Note that the CD value of the exposure system 10 has wavelength dependency.

The lithography control unit 110 transmits the target wavelength λt of each pulse to the laser apparatus 12 through the exposure control unit 40 of the exposure apparatus 14.

Exposure operation is the same as the exposure operation of the exposure system 10 illustrated in FIG. 4.

5.2.2 Exemplary Contents of Processing by Lithography Control Unit

Figure 12:
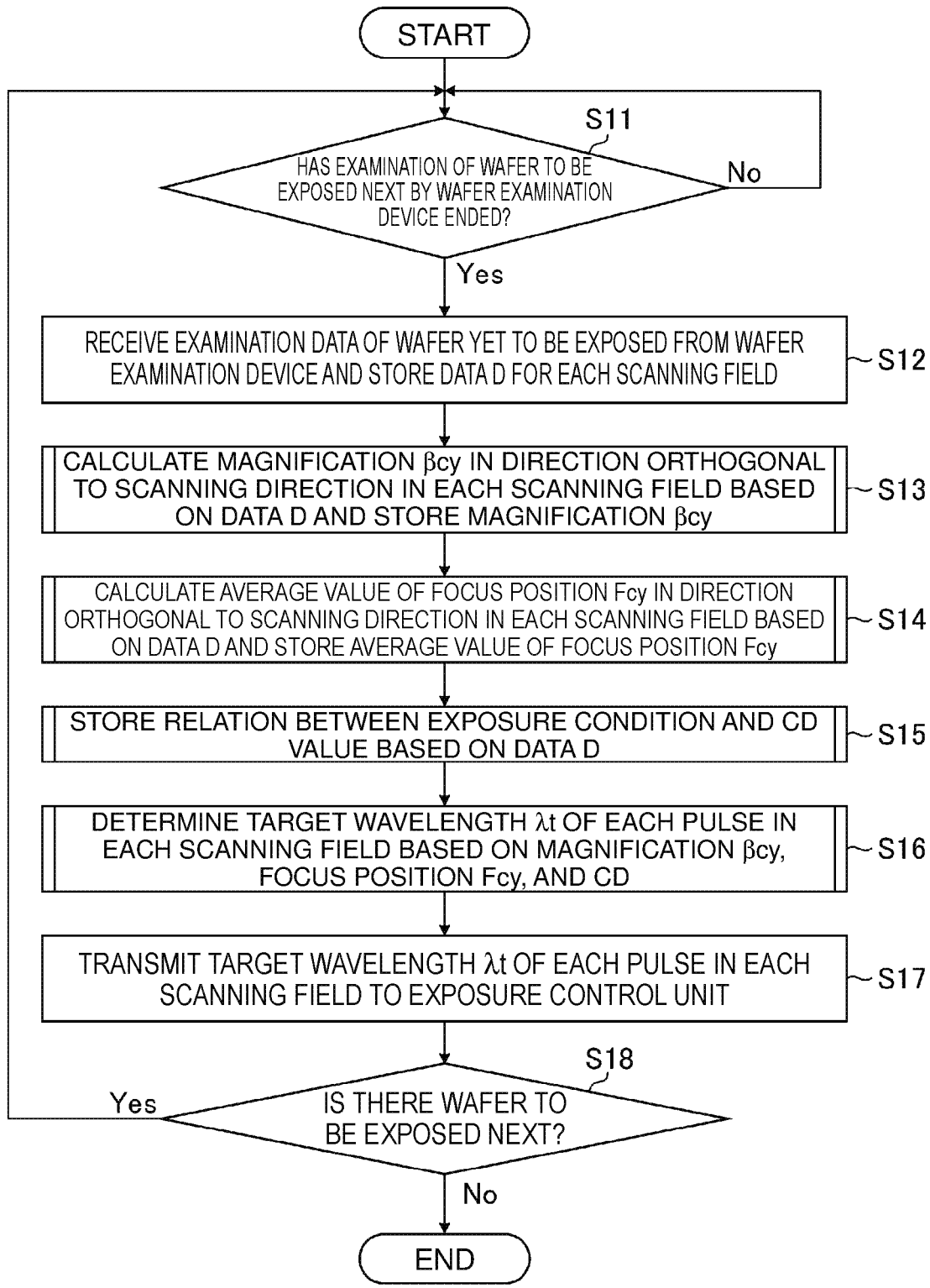
FIG. 12 is a flowchart illustrating exemplary contents of processing by a lithography control unit in Embodiment 1.

FIG. 12 is a flowchart illustrating exemplary contents of processing by the lithography control unit 110 in Embodiment 1. Each step illustrated in FIG. 12 is achieved as a computer program is executed by the processor functioning as the lithography control unit 110.

At step S11, the lithography control unit 110 determines whether examination of a wafer WF to be exposed next by the wafer examination device 310 has ended. When the examination of the wafer WF has ended, the wafer examination device 310 transmits an end signal of the wafer examination to the lithography control unit 110. The lithography control unit 110 determines whether the wafer examination of the wafer WF to be exposed next has ended by determining whether the end signal indicating that the examination has ended has been received from the wafer examination device 310.

When the result of the determination at step S11 is "No", the lithography control unit 110 repeats step S11.

When the result of the determination at step S11 is "Yes", the lithography control unit 110 proceeds to step S12.

At step S12, the lithography control unit 110 receives examination data of the wafer WF yet to be exposed from the wafer examination device 310 and stores data D for each scanning field SF. The data D includes information of a measured wafer height, position information of a mark on the wafer WF, information of the CD value, and information of a process to which the CD value belongs, and is a data group in which these pieces of information are related to information specifying the measured position of the scanning field SF.

Subsequently at step S13, the lithography control unit 110 calculates the magnification βcy in the direction orthogonal to the scanning direction in each scanning field SF based on the data D and stores the magnification βcy.

At step S14, the lithography control unit 110 calculates the focus position Fcy, which is the average value of the focus position in the direction orthogonal to the scanning direction in each scanning field SF, based on the data D and stores the focus position Fcy.

At step S15, the lithography control unit 110 stores the relation between an exposure condition and the CD value based on the data D. Note that the processing orders of steps S13 to S15 are not limited to those in the example illustrated in FIG. 12 but may be interchanged as appropriate, and a plurality of steps may be processed in parallel.

Subsequently at step S16, the lithography control unit 110 determines the target wavelength λt of each pulse in each scanning field SF based on the magnification βcy, the focus position Fcy, and the CD. The CD value used at step S16 is feedback data obtained from the CD value in an exposure result stored for any different wafer WF exposed in the past.

At step S17, the lithography control unit 110 transmits the target wavelength λt of each pulse in each scanning field SF to the exposure control unit 40. In the present embodiment, the lithography control unit 110 collectively transmits data of the target wavelength λt of each pulse in each scanning field SF to the exposure control unit 40.

Subsequently at step S18, the lithography control unit 110 determines whether there is a wafer WF to be exposed next. When the result of the determination at step S18 is "Yes", the lithography control unit 110 returns to step S11.

When the result of the determination at step S18 is "No", the lithography control unit 110 ends the flowchart in FIG. 12.

5.2.3 Exemplary Contents of Processing by Exposure Control Unit

Figure 13:
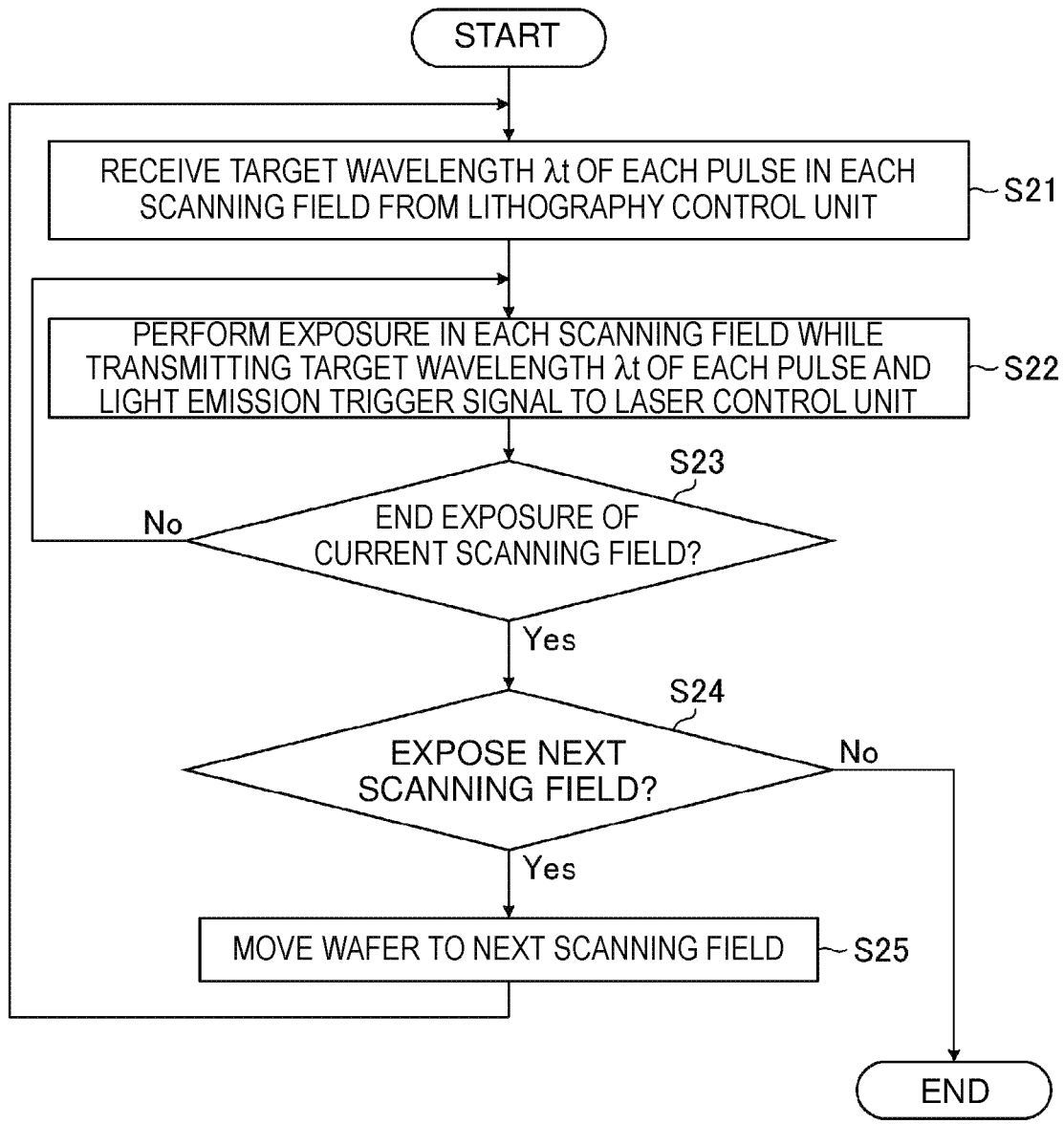
FIG. 13 is a flowchart illustrating exemplary contents of processing by the exposure control unit in Embodiment 1.

FIG. 13 is a flowchart illustrating exemplary contents of processing by the exposure control unit 40 in Embodiment 1. Each step illustrated in FIG. 13 is achieved as the processor functioning as the exposure control unit 40 executes a computer program.

At step S21, the exposure control unit 40 receives the target wavelength λt of each pulse in each scanning field SF from the lithography control unit 110. In the present embodiment, the exposure control unit 40 collectively receives data of the target wavelength λt of each pulse in each scanning field SF from the lithography control unit 110.

Subsequently at step S22, the exposure control unit 40 performs exposure in each scanning field SF while transmitting the target wavelength λt of each pulse and the light emission trigger signal Tr to the laser control unit 20. In other words, the exposure control unit 40 performs transmission of the target wavelength λt and transmission of the light emission trigger signal Tr to the laser control unit 20 for each pulse. In this case, the exposure control unit 40 performs scanning exposure by moving the reticle 46 and the wafer WF in opposite directions in synchronization with the light emission trigger signal Tr.

Subsequently at step S23, the exposure control unit 40 determines whether to end exposure of a scanning field SF being currently exposed. The result of the determination at step S23 is "No" when the scanning field SF being currently exposed is halfway through scanning and a region yet to be exposed remains in the scanning field SF. When the result of the determination at step S23 is "No", the exposure control unit 40 returns to step S22 and continues the scanning exposure of the scanning field SF.

When the scanning exposure of the scanning field SF is completed and the result of the determination at step S23 is "Yes", the exposure control unit 40 proceeds to step S24.

At step S24, the exposure control unit 40 determines whether to expose the next scanning field SF. The result of the determination at step S24 is "Yes" when a scanning field SF yet to be exposed remains in the wafer WF. When the result of the determination at step S24 is "Yes", the exposure control unit 40 proceeds to step S25.

At step S25, the exposure control unit 40 moves the wafer WF to the next scanning field SF. After step S25, the exposure control unit 40 returns to step S21.

When the result of the determination at step S24 is "No", the exposure control unit 40 ends the flowchart in FIG. 13.

5.2.4 Description of X Axial-Direction Magnification βCy and Focus Position Fcy The following describes the X axial-direction magnification βcy and the focus position Fcy calculated from a wafer height average value Havy in the X axial direction in each scanning field SF.

Figure 14:
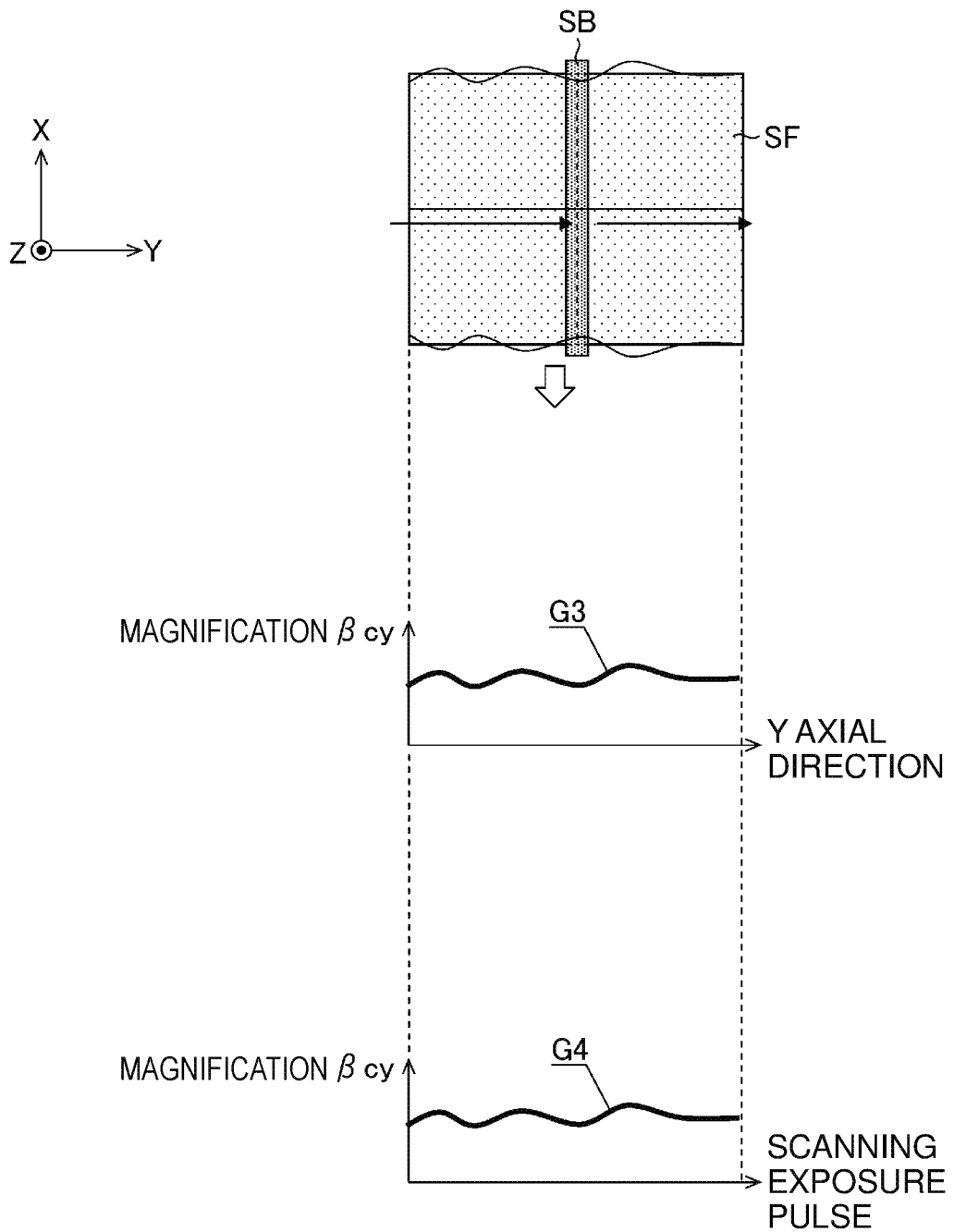
FIG. 14 is an explanatory diagram exemplarily illustrating X axial-direction magnification βcy at each position in a Y axial direction in the scanning field.

FIG. 14 is an explanatory diagram exemplarily illustrating the X axial-direction magnification βcy at positions in the Y axial direction in the scanning field SF. The upper part of FIG. 14 schematically illustrates scanning exposure of the scanning field SF of the wafer WF to a scanning beam SB. Each wave line illustrated at an end part of the scanning field SF in the X axial direction represents a position changed due to the X axial-direction magnification βcy as a distortion component.

A graph G3 illustrated at the middle part of FIG. 14 is an example of the X axial-direction magnification βcy determined based on a result of examination by the wafer examination device 310 for the scanning field SF illustrated at the upper part. A graph G4 illustrated at the lower part of FIG. 14 is obtained by converting the horizontal axis of the graph G3 illustrated at the middle part into a pulse number of a scanning exposure pulse. The pulse number of a scanning exposure pulse is a number indicating the order of a pulse radiated in the scanning field SF.

Figure 15:
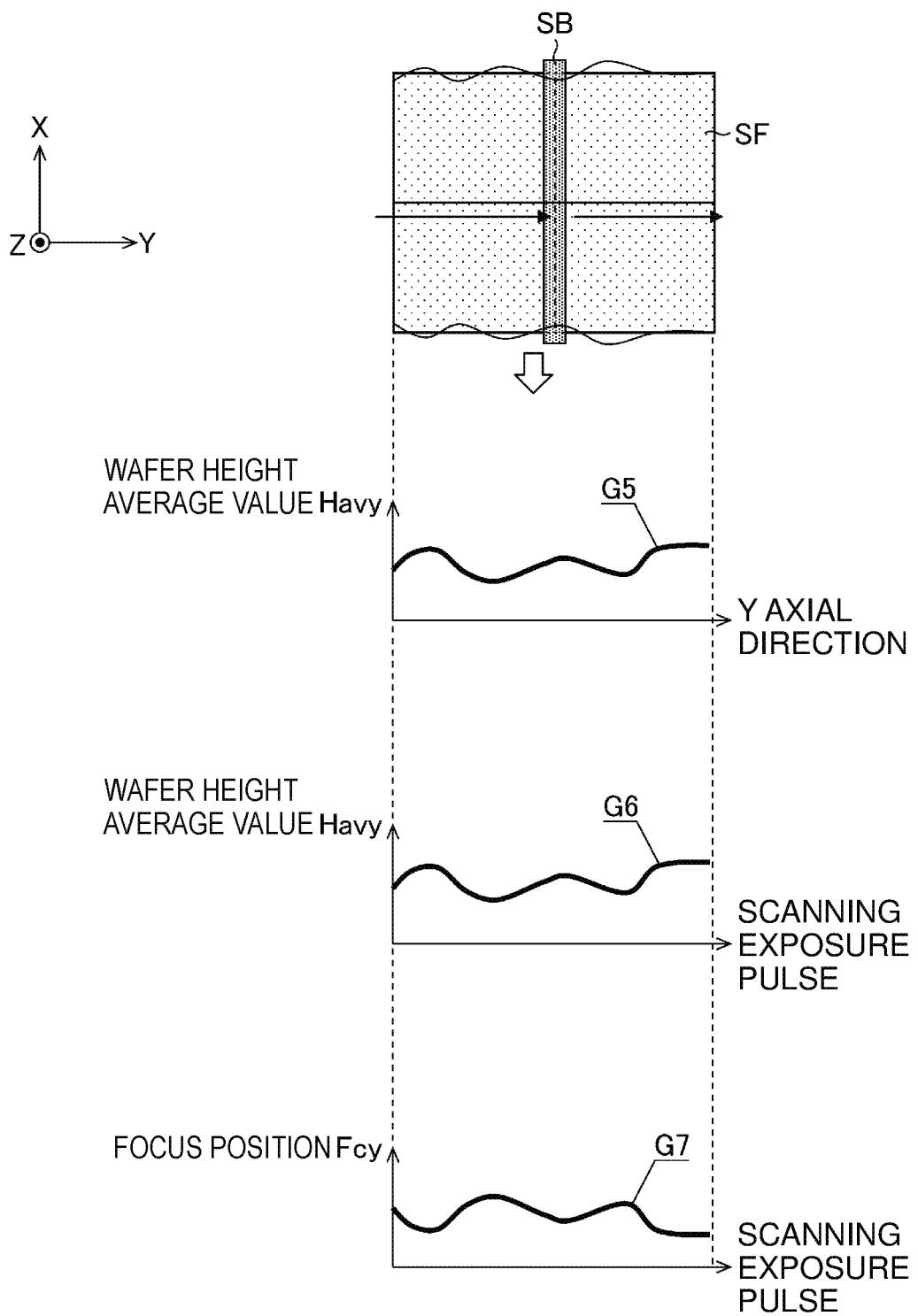
FIG. 15 is an explanatory diagram exemplarily illustrating the relation between the average value of the height of the wafer in the X axial direction and a focus position at positions in the Y axial direction in the scanning field.

FIG. 15 is an explanatory diagram exemplarily illustrating the relation between the average value (hereinafter referred to as "wafer height average value") Havy of the height of the wafer WF in the X axial direction and a focus position Fc at positions in the Y axial direction in the scanning field SF. The upper part of FIG. 15 illustrates the same scanning field SF as at the upper part of FIG. 14. A graph G5 illustrated below the scanning field SF in FIG. 15 is an example of the wafer height average value Havy determined based on a result of examination by the wafer examination device 310 for the scanning field SF illustrated at the upper part. A graph G6 illustrated below the graph G5 is obtained by converting the horizontal axis of the graph G5 into the pulse number of a scanning exposure pulse. A graph G7 illustrated at the lowest part of FIG. 15 is an example of the focus position Fcy calculated from the wafer height average value Havy and a reference focus position F0.

As illustrated with the graph G3 in FIG. 14 and the graph G5 in FIG. 15, the lithography control unit 110 determines the X axial-direction magnification βcy at a Y axial-direction position (Y coordinate) in each scanning field SF and the average value (wafer height average value Havy) of the height of the wafer WF in the X axial direction based on a result of examination by the wafer examination device 310.

Then, the lithography control unit 110 substitutes the pulse number of a scanning exposure pulse in the scanning field SF for the Y axial-direction position and substitutes data of the magnification βcy and the wafer height average value Havy corresponding to the pulse number (refer to the graph G4 in FIG. 14 and the graph G6 in FIG. 15).

In addition, the lithography control unit 110 determines the focus position Fcy, which is the average value of the distance between the projection optical system 50 and the surface of the wafer WF in the X axial direction, by Expression (1) below based on the wafer height average value Havy and the reference focus position F0, and substitutes the focus position Fcy (refer to the graph G7 in FIG. 15).

$$Fcy = F0 - Havy \tag{1}$$

Figure 16:
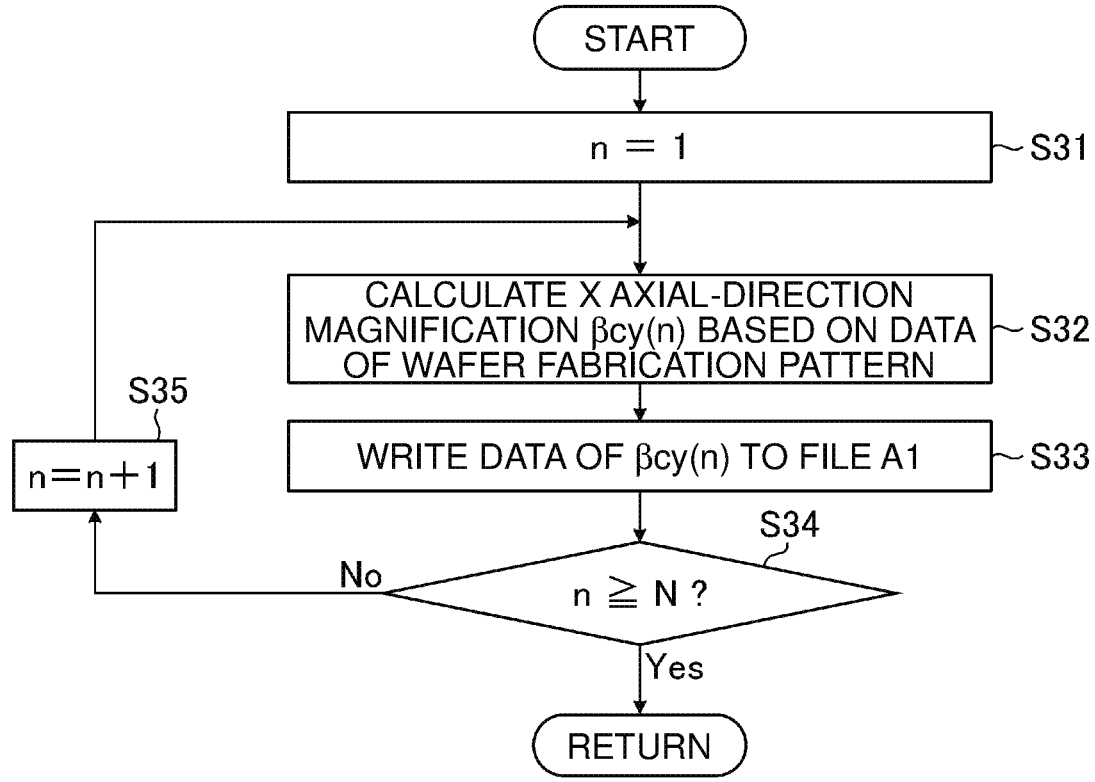
FIG. 16 is a flowchart illustrating an exemplary subroutine applied to step S13 in FIG. 12.

5.2.5 Exemplary Subroutine of Calculating and Storing X Axial-Direction Magnification βCy FIG. 16 is a flowchart illustrating an exemplary subroutine applied to step S13 in FIG. 12. At step S31 in FIG. 16, the lithography control unit 110 sets, to one, an index n indicating a pulse number of a pulse laser beam radiated during one scanning. The index n of "1" is the pulse number of the first pulse radiated during one scanning.

Subsequently at step S32, the lithography control unit 110 calculates X axial-direction magnification βcy(n) based on data of a fabrication pattern on the wafer WF. The interval between measurement points in the Y axial direction is preferably equal to a distance L by which the wafer WF moves in a time corresponding to the interval between pulses of the scanning beam SB. When V represents the moving speed of the wafer WF and f represents the laser repetition frequency of the scanning beam SB, the distance L is expressed by Expression (2) below.

$$L = V \cdot (1/f) \qquad (2)$$

At step S33, the lithography control unit 110 writes data of the magnification βcy(n) to a file A1.

Subsequently at step S34, the lithography control unit 110 determines whether the index n is equal to or larger than N. The number N as a comparison reference is the pulse number of the last pulse radiated during one scanning.

When the result of the determination at step S34 is "No", the lithography control unit 110 proceeds to step S35. At step S35, the lithography control unit 110 increments the value of the index n and returns to step S32.

When the result of the determination at step S34 is "Yes", the lithography control unit 110 ends the flowchart in FIG. 16 and returns to the main flow in FIG. 12.

Figure 17:
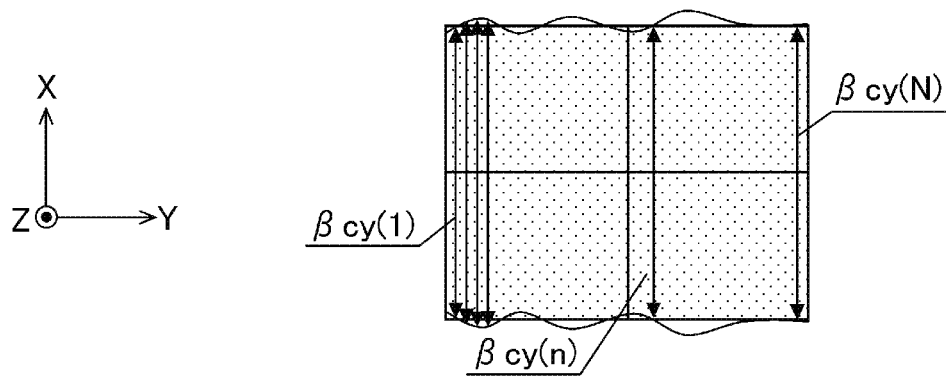
FIG. 17 is a schematic diagram of magnification βcy(n) calculated for each pulse number n in the scanning field.

FIG. 17 is a schematic diagram of the magnification βcy(n) calculated for each pulse number n in the scanning field SF. The magnification βcy(n) corresponding to each pulse number of 1 to N is calculated.

Figures 18, 19:
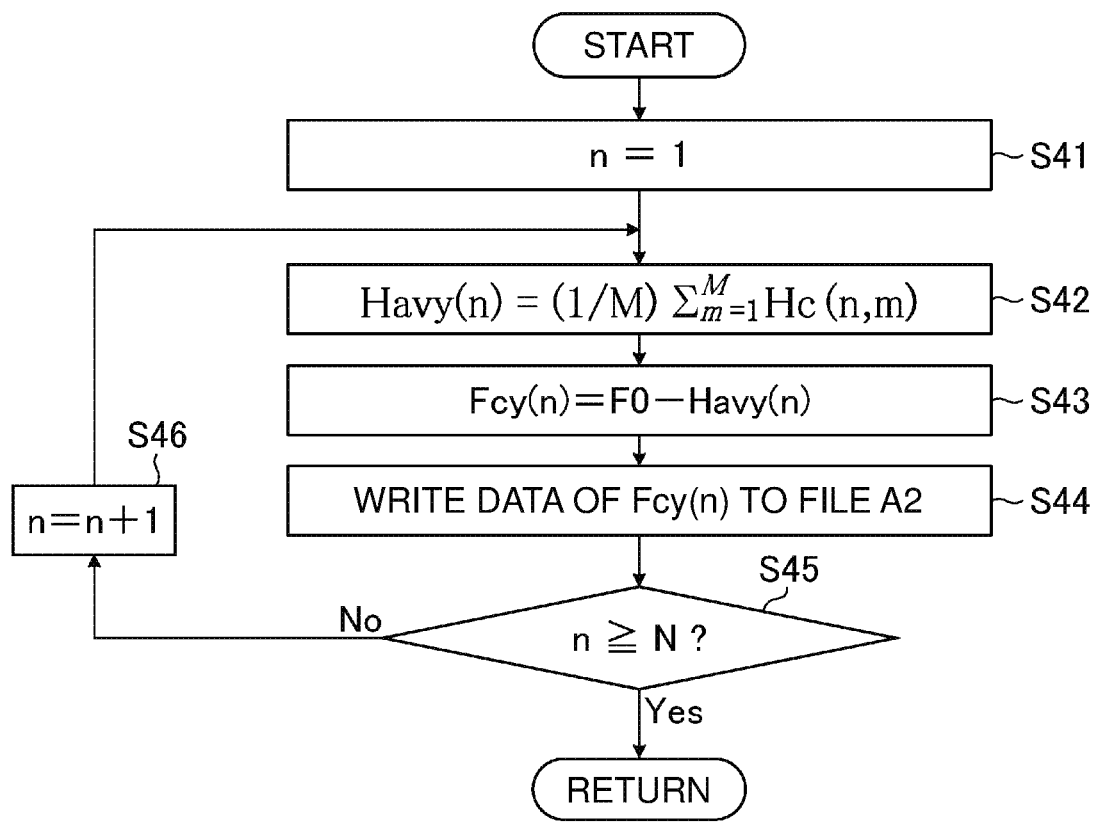
FIG. 18 is a table listing exemplary data stored in a file A1.
FIG. 19 is a flowchart illustrating an exemplary subroutine applied to step S14 in FIG. 12.

FIG. 18 is a table listing exemplary data stored in the file A1. As illustrated in FIG. 18, data of the magnification βcy(n) corresponding to the pulse number n is stored in the file A1.

5.2.6 Exemplary Subroutine of Calculating and Storing Focus Position Fcy

FIG. 19 is a flowchart illustrating an exemplary subroutine applied to step S14 in FIG. 12. At step S41 in FIG. 19, the lithography control unit 110 sets, to one, the index n indicating the pulse number of a pulse laser beam radiated during one scanning.

Subsequently at step S42, the lithography control unit 110 calculates an X axial-direction average value Havy(n) of a wafer height Hc(n, m) at a Y axial-direction position corresponding to a radiation position of the n-th pulse in the scanning field SF. The number m is an index indicating the X axial-direction position of a measurement point at which the wafer height is measured by the wafer examination device 310 (refer to FIG. 20). As described above, the interval between measurement points in the Y axial direction is preferably equal to the distance L by which the wafer WF moves in a time corresponding to the interval between pulses of the scanning beam SB.

When M measurement points in the X axial direction are set for each Y axial-direction position corresponding to the pulse number n (n=1 to N) in the scanning field SF, m can have a value of 1 to M.

The wafer height average value Havy(n) is given by Expression (3) below.

[Expression 1]

$$Havy(n) = \left(\frac{1}{M}\right)\sum_{m=1}^{M} Hc(n, m) \qquad (3)$$

In this example, the simple average value Hc(n, m) is calculated as the wafer height average value Havy(n), but a weighted average value may be employed as described later.

Subsequently at step S43, the lithography control unit 110 calculates the focus position Fcy(n) in accordance with Expression (4) based on the wafer height average value Havy(n) and the reference focus position F0.

$$Fcy(n) = F0 - Havy(n) \qquad (4)$$

Then, at step S44, the lithography control unit 110 writes data of the focus position Fcy(n) to a file A2.

Subsequently at step S45, the lithography control unit 110 determines whether or not the index n is equal to or larger than N.

When the result of the determination at step S45 is "No", the lithography control unit 110 proceeds to step S46. At step S46, the lithography control unit 110 increments the value of the index n and returns to step S42.

When the result of the determination at step S45 is "Yes", the lithography control unit 110 ends the flowchart in FIG. 19 and returns to the main flow in FIG. 12.

Figures 20, 21:
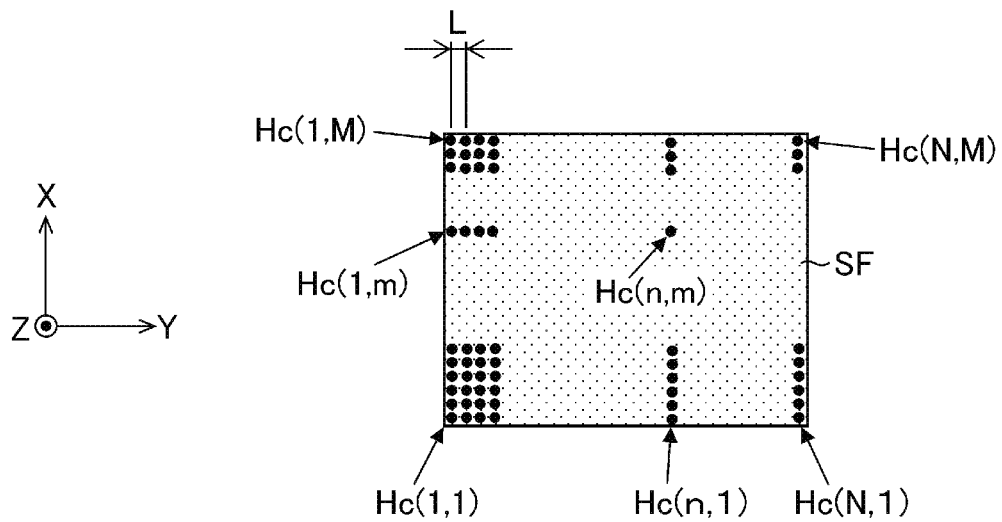
FIG. 20 is a schematic diagram of wafer height measurement points in a scanning field SF.
FIG. 21 is a table listing exemplary data stored in a file A2.

FIG. 20 is a schematic diagram of wafer height measurement points in the scanning field SF. Each of a plurality of black circles illustrated in FIG. 20 represents a wafer height measurement point. Although the number of wafer height measurement points is omitted in FIG. 20, N×M wafer height measurement points are provided in the scanning field SF. The wafer height Hc(n, m) is the wafer height measured at a measurement point (n, m). The plurality of measurement points illustrated with (n, m) in FIG. 20 are examples of "a plurality of points" in the present disclosure.

FIG. 21 is a table listing exemplary data stored in the file A2. As illustrated in FIG. 21, data of a focus position Fcy(n) corresponding to the pulse number n is stored in the file A2.

5.2.7 Average Value of Wafer Height

Figure 22:
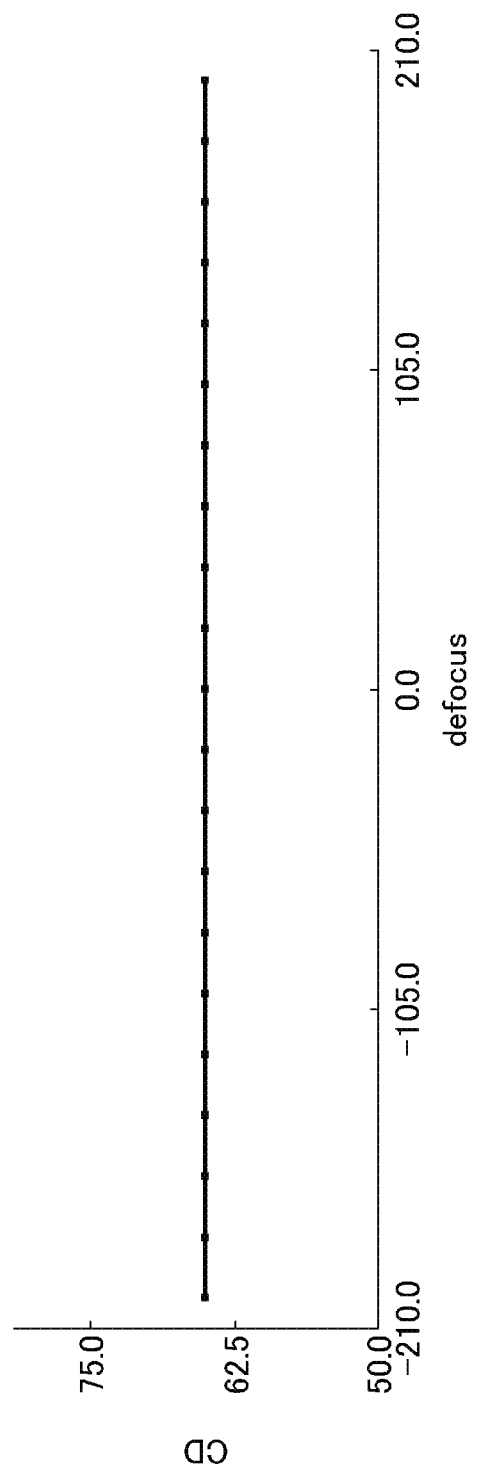
FIG. 22 is a graph illustrating an exemplary relation between a CD and the focus position when exposure of a closely-spaced pattern is performed.
Figure 23:
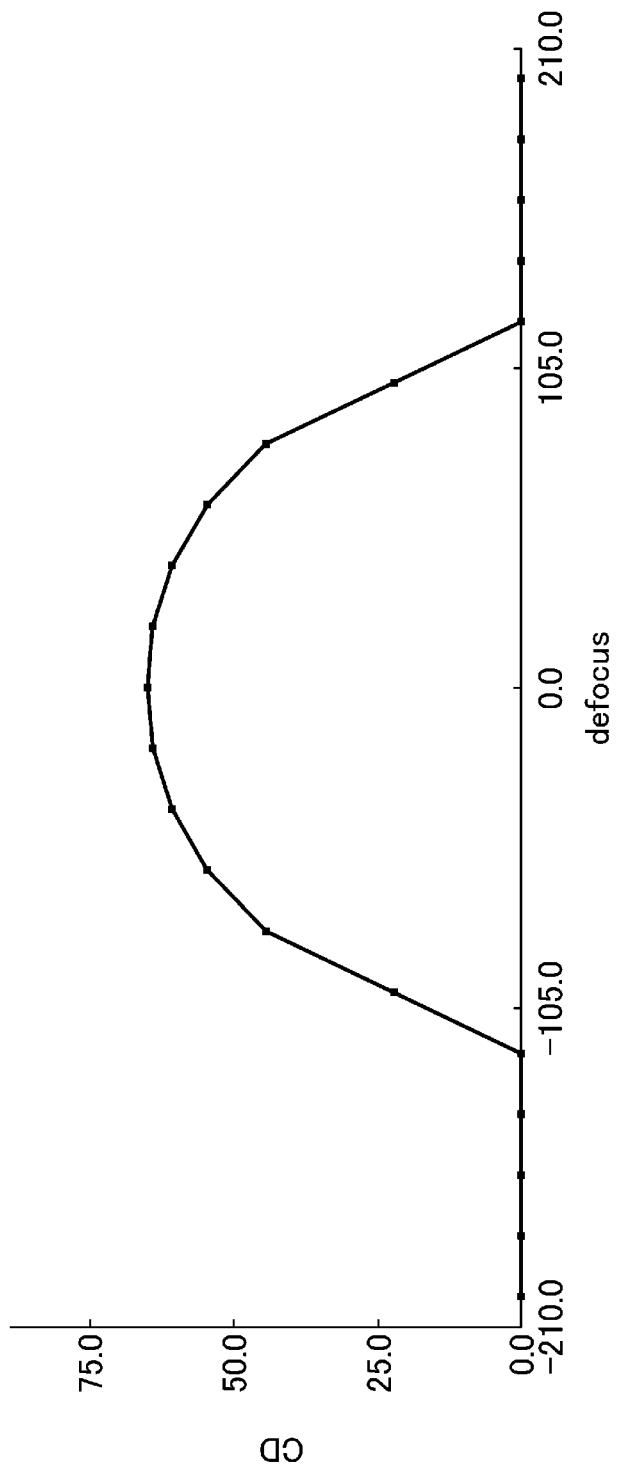
FIG. 23 is a graph illustrating an exemplary relation between the CD and the focus position when exposure of an isolated pattern is performed.

As illustrated in FIGS. 22 and 23, the sensitivity of focusing differs depending on the shape of a mask pattern for exposure. FIG. 22 is a graph illustrating an exemplary relation between the CD and the focus position when exposure of a closely-spaced pattern is performed. The horizontal axis represents the amount of defocus from a best focus position (0.0), and the vertical axis represents the CD value. The graph illustrated in FIG. 22 is an example of a CD-focus curve of 65 nm line/130 pitch as the closely-spaced pattern. FIG. 23 is a graph illustrating an exemplary relation between the CD and the focus position when exposure of an isolated pattern is performed. The horizontal axis represents the amount of defocus from the best focus position, and the vertical axis represents the CD value. The graph illustrated in FIG. 23 is an example of a CD-focus curve of 65 nm line/600 pitch as the isolated pattern. Note that each CD-focus curve changes with settings of the exposure apparatus 14.

As illustrated in FIGS. 22 and 23, the tendency of each CD-focus curve changes depending on a mask pattern for exposure. In the case of the closely-spaced pattern, as illustrated in FIG. 22, the CD-focus curve is flat for defocus in the range of ±210, in other words, the CD value hardly changes as the focus position changes. However, in the case of the isolated pattern, as illustrated in FIG. 23, the CD-focus curve has an upward convex shape and the CD value largely changes as the focus position changes.

Thus, when the average of the wafer height is to be calculated, for example, a weighted average with a larger weight for a part where the isolated pattern is disposed and a smaller weight for a part where the closely-spaced pattern is disposed can be employed instead of simple average. Accordingly, the wafer height can be controlled with appropriate consideration of a pattern that is sensitive to focusing, and overall CD variation can be reduced.

The weighted average may be calculated with a larger weight not only for a part with such pattern sensitivity to the focus position but also, for example, for a part where a pattern that largely affects chip performance is disposed. The phrase "average value" in the present specification includes not only the simple average value but also the weighted average value unless explicitly stated otherwise.

5.2.8 Exemplary Subroutine of Storing Relation Between Exposure Condition and CD Value FIG. 24 is a flowchart illustrating an exemplary subroutine applied to step S15 in FIG. 12. At step S51 in FIG. 24, the lithography control unit 110 reads the CD value in each scanning field SF on the wafer WF, which is measured by the wafer examination device 310, from the data D. As described above with reference to FIG. 11, the CD value in each scanning field SF on the wafer WF is measured by the wafer examination device 310. The lithography control unit 110 reads such data D.

Subsequently at step S52, the lithography control unit 110 reads data F of measured exposure condition parameters in each scanning field SF of the wafer WF. The data F is data that the lithography control unit 110 receives from the exposure control unit 40 as exposure conditions of wafer exposure of the target wafer WF.

At step S53, the lithography control unit 110 stores the relation between each exposure condition parameter and the CD value in a file A0. Specifically, the lithography control unit 110 stores the relation between each exposure condition parameter and the CD value based on the data D and the data F in the file A0.

Subsequently at step S54, the lithography control unit 110 sorts each data in the file A0 in accordance with the relation between the exposure condition and the CD value and separately stores the data in a file. For example, the lithography control unit 110 sorts each data in the file A0 in accordance with the relation between each exposure condition parameter and the CD value and stores the data in a file B, a file C, a file D, a file E, or the like to be described later.

After step S54, the lithography control unit 110 ends the flowchart in FIG. 24 and returns to the main flow in FIG. 12.

FIG. 25 illustrates an exemplary list of the relation among the exposure condition parameters, the magnification βcy, and the CD value stored in the file A0.

The exposure condition parameters include, for example, a parameter IL of the illumination optical system 44, a parameter PJ of the projection optical system 50, a parameter M of the mask, a dose D, the wavelength λ, the spectrum line width Δλ, and the focus position Fcy.

Examples of the parameter IL of the illumination optical system 44 include σ (sigma) of normal illumination, σ of annular illumination, an annular ratio, and the angle, position, and size of quadrupole illumination.

Examples of the parameter PJ of the projection optical system 50 include chromatic aberration correction and a numerical aperture NA.

Examples of the parameter M of the mask include the dimension, material, and kind of the mask.

The parameter IL of the illumination optical system 44, the parameter PJ of the projection optical system 50, the parameter M of the mask, and the dose D illustrated in FIG. 25 are exposure condition parameters received from the exposure apparatus 14. The spectrum line width Δλ and the wavelength λ are exposure condition parameters received from the exposure apparatus 14 or the laser apparatus 12. The magnification βcy and the focus position Fcy are parameters received from the exposure apparatus 14 or the wafer examination device 310. The CD value is a parameter received from the wafer examination device 310.

Step S54 in FIG. 24 is, for example, a step of extracting data of a common exposure condition parameter from data in the file A0 and producing data or the like in the file B, the file C, the file D, the file E, or the like.

Note that the exposure condition parameters are not limited to those exemplarily described above but may include, for example, parameters of the resist. The parameters may include the kind, sensitivity, thickness, bake condition, and the like of the resist.

Figure 26:
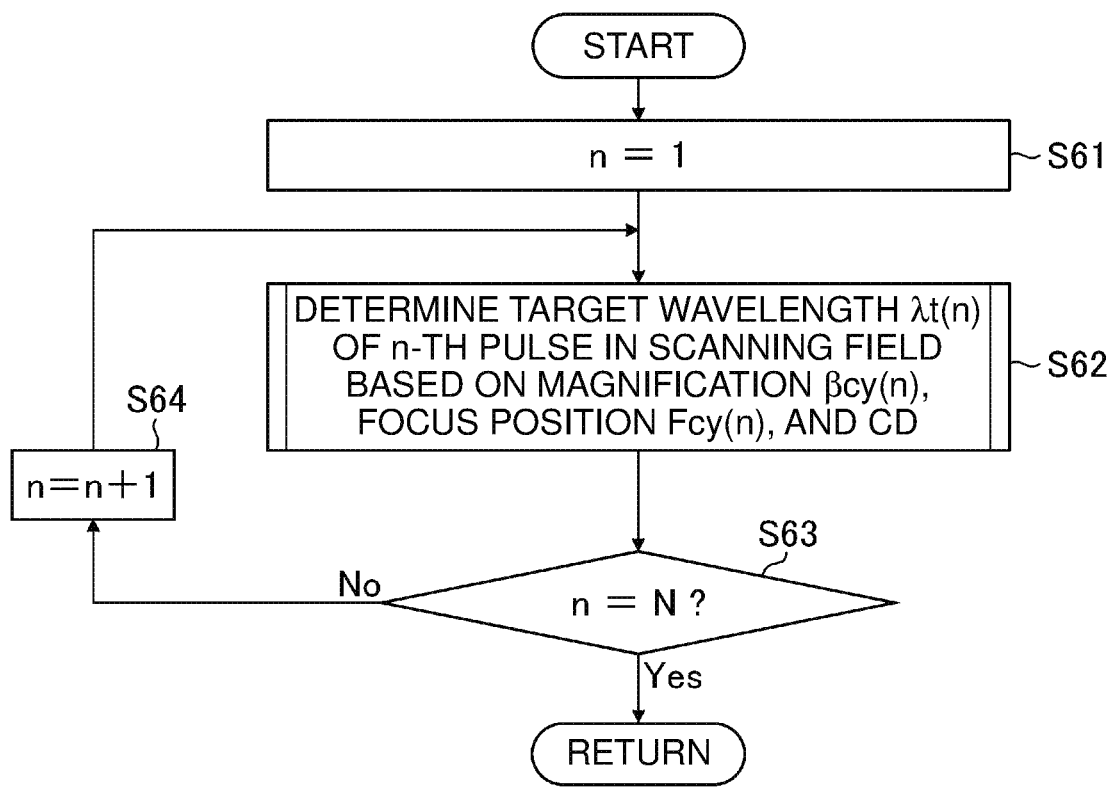
FIG. 26 is a flowchart illustrating an exemplary subroutine applied to step S16 in FIG. 12.

5.2.9 Exemplary Subroutine of Determining Target Wavelength λt of Each Pulse Based on Magnification βCy, Focus Position Fcy, and CD FIG. 26 is a flowchart illustrating an exemplary subroutine applied to step S16 in FIG. 12.

At step S61, the lithography control unit 110 sets, to one, the index n indicating the pulse number of a pulse laser beam radiated during one scanning.

Subsequently at step S62, the lithography control unit 110 determines a target wavelength λt(n) of the n-th pulse in the scanning field SF based on the magnification βcy(n), the focus position Fcy(n), and the CD.

Subsequently at step S63, the lithography control unit 110 determines whether the index n is equal to N.

When the result of the determination at step S63 is "No", the lithography control unit 110 proceeds to step S64. At step S64, the lithography control unit 110 increments the value of the index n and returns to step S62.

When the result of the determination at step S63 is "Yes", the lithography control unit 110 ends the flowchart in FIG. 26 and returns to the main flow in FIG. 12.

FIG. 27 is a flowchart illustrating an exemplary subroutine applied to step S62 in FIG. 26. At step S71 in FIG. 27, the lithography control unit 110 determines a shortest wavelength $\lambda_S(n)$ and a longest wavelength $\lambda_L(n)$ in the wavelength range of an allowable CD value in the case of the focus position Fcy(n).

Subsequently at step S72, the lithography control unit 110 determines a wavelength $\lambda_M(n)$ with which the magnification βcy(n) is obtained. Note that the orders of steps S71 and S72 may be interchanged or these steps may be performed in parallel.

Subsequently at step S74, the lithography control unit 110 determines whether the wavelength $\lambda_M(n)$ satisfies $\lambda_S(n) \leq \lambda_M(n) \leq \lambda_L(n)$, $\lambda_M(n) < \lambda_S(n)$, or $\lambda L(n) < \lambda_M(n)$.

When the result of the determination at step S74 satisfies $\lambda_S(n) \leq \lambda_M(n) \leq \lambda_L(n)$, the lithography control unit 110 proceeds to step S75 and sets the target wavelength λt(n) as $\lambda_M(n)$.

When the result of the determination at step S74 satisfies $\lambda_M(n) < \lambda_S(n)$, the lithography control unit 110 proceeds to step S76 and sets the target wavelength λt(n) as $\lambda_S(n)$.

When the result of the determination at step S74 satisfies $\lambda_L(n) < \lambda_M(n)$, the lithography control unit 110 proceeds to step S77 and sets the target wavelength λt(n) as $\lambda_L(n)$.

After step S75, step S76, or step S77, the lithography control unit 110 proceeds to step S78.

At step S78, the lithography control unit 110 writes data of Fcy(n), $\lambda_S(n)$, $\lambda_L(n)$, βcy(n), $\lambda_M(n)$, and λt(n) to the file B.

After step S78, the lithography control unit 110 ends the flowchart in FIG. 27 and returns to the flowchart in FIG. 26.

FIG. 28 is a diagram illustrating an exemplary data table stored in the file B. As illustrated in FIG. 28, a record including data of Fcy(n), $\lambda_S(n)$, $\lambda_L(n)$, βcy(n), $\lambda_M(n)$, and λt(n) is produced for each pulse number n.

FIG. 29 is a flowchart illustrating an exemplary subroutine applied to step S71 in FIG. 27. At step S81 in FIG. 29, the lithography control unit 110 reads the file C of the relation among the focus position Fcy, the wavelength λ, and the CD value. Relation data of each focus position Fcy with the wavelength λ and the CD value based on a result of optical simulation or test exposure is stored in the file C in advance. FIG. 30 illustrates an example of the file C. The lithography control unit 110 reads the file C stored in advance.

At step S82, the lithography control unit 110 determines, based on the file C, an approximate curve (CD curve) representing the relation with the CD value and the wavelength λ in the case of the focus position Fcy(n).

Subsequently at step S83, the lithography control unit 110 determines, based on the CD curve determined at step S82, the shortest wavelength $\lambda_S(n)$ and the longest wavelength $\lambda_L(n)$ in the wavelength range of a predetermined allowable CD value in the case of the focus position Fcy(n).

After step S83, the lithography control unit 110 ends the flowchart in FIG. 29 and returns to the flowchart in FIG. 27.

Figure 31:
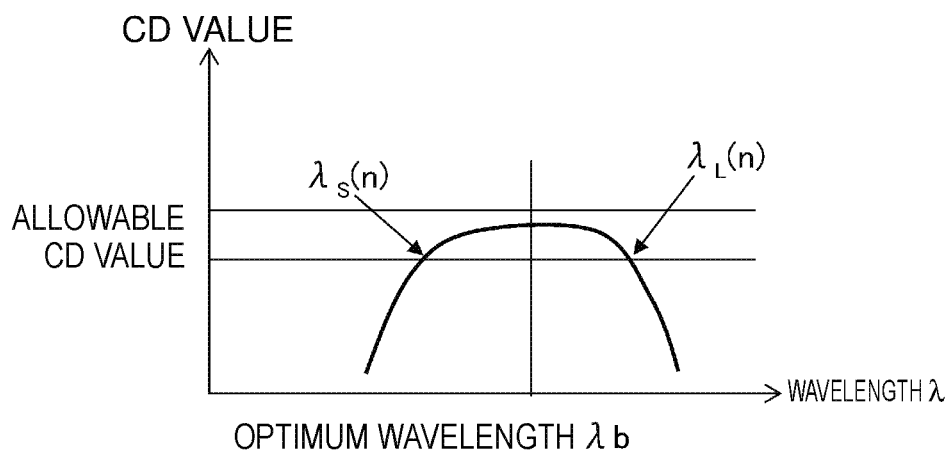
FIG. 31 is a graph illustrating an exemplary CD curve obtained at step S82 in FIG. 30.

FIG. 31 is a graph illustrating an example of the CD curve obtained at step S82 in FIG. 29. FIG. 31 illustrates an example of the predetermined allowable CD value used at step S83 in FIG. 29 and examples of the shortest wavelength $\lambda_S(n)$ and the longest wavelength $\lambda L(n)$ determined based on the allowable CD value and the CD curve. An optimum wavelength λb may be, for example, a value at the center of the wavelength range defined with the shortest wavelength $\lambda_S(n)$ and the longest wavelength $\lambda_L(n)$. The CD curve illustrated in FIG. 31 is an example of a "first approximate curve" in the present disclosure.

Figure 32:
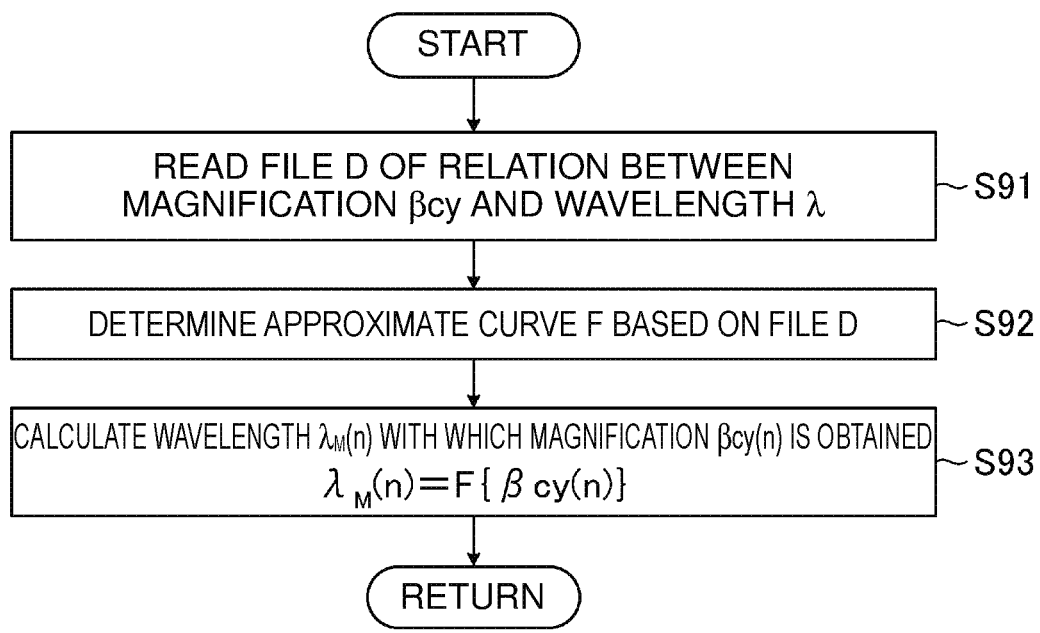
FIG. 32 is a flowchart illustrating an exemplary subroutine applied to step S72 in FIG. 27.
Figures 33, 34:
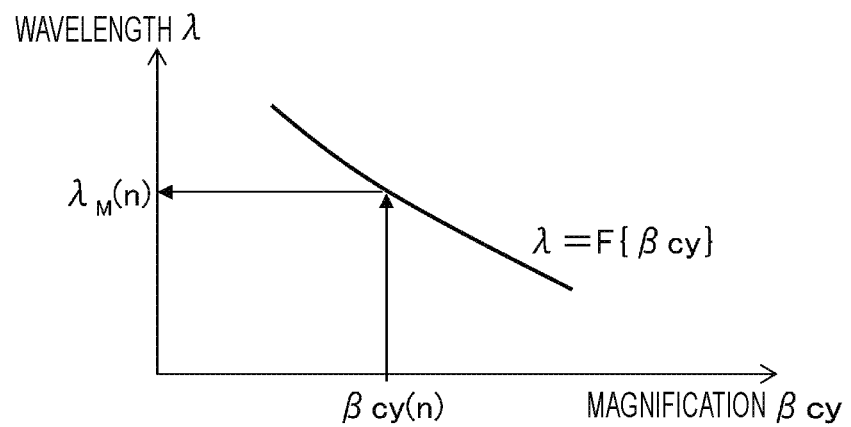
FIG. 33 is a table listing exemplary table data stored in a file D.
FIG. 34 is a graph illustrating an exemplary approximate curve F obtained at step S92 in FIG. 32.

FIG. 32 is a flowchart illustrating an exemplary subroutine applied to step S72 in FIG. 27. At step S91 in FIG. 32, the lithography control unit 110 reads the file D of the relation between the magnification βcy and the wavelength λ. Relation data of the magnification βcy and the wavelength λ based on a result of optical simulation or test exposure is stored in the file D in advance. FIG. 33 illustrates an example of the file D. The lithography control unit 110 reads the file D stored in advance.

Subsequently at step S92, the lithography control unit 110 determines, based on the file D, an approximate curve F that defines the relation between the magnification βcy and the wavelength λ.

Subsequently at step S93, the lithography control unit 110 calculates the wavelength $\lambda_M(n)$ with which the magnification βcy(n) is obtained by using the function of the approximate curve F. When the function of the approximate curve F is represented by λ=F{βcy}, the lithography control unit 110 calculates the wavelength $\lambda_M(n)$ by $\lambda_M(n)$=F{βcy(n)}.

After step S93, the lithography control unit 110 ends the flowchart in FIG. 32 and returns to the flowchart in FIG. 27.

FIG. 34 is a graph illustrating an example of the approximate curve F obtained at step S92 in FIG. 32. FIG. 34 illustrates the idea of a calculation method of determining the wavelength $\lambda_M(n)$ with which the magnification βcy(n) is obtained by using the function of the approximate curve F. The wavelength $\lambda_M(n)$ is an example of a "first wavelength" in the present disclosure. The approximate curve F is an example of a "second approximate curve" in the present disclosure.

5.3 Effect

The lithography system 100 according to Embodiment 1 calculates the height of a pattern fabricated on the wafer WF and the target wavelength λt of each pulse with which a value closer to the magnification βcy is obtained, and performs scanning projection exposure in a scanning field SF by using a pulse laser beam having the target wavelength λt. Thus, the magnification in the direction orthogonal to the scanning direction and the focus position can be both corrected. As a result, overlay accuracy and CD accuracy are simultaneously improved.

6. Embodiment 2

6.1 Configuration

In the example described in Embodiment 1, the wafer height Hc is measured by using the wafer examination device 310 and the focus position Fcy is determined based on a result of the measurement. However, in Embodiment 2, the focus position Fcy is measured by using the focus sensor 58 disposed in the exposure apparatus 14 immediately before exposure.

Figure 35:
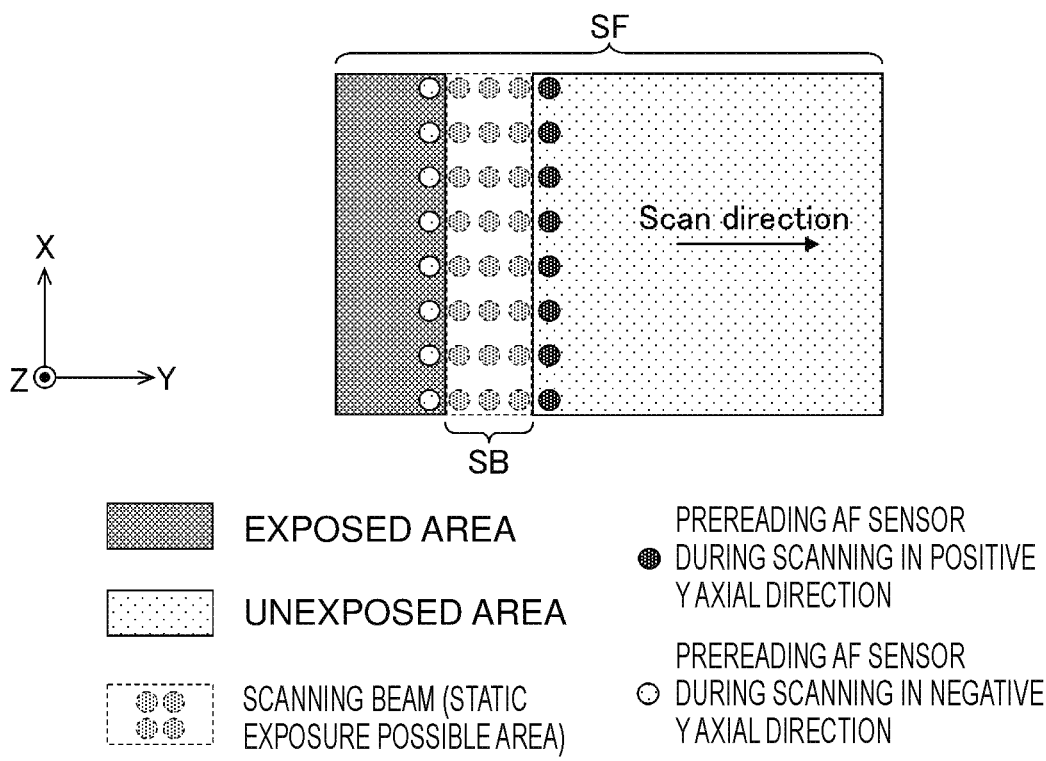
FIG. 35 is an explanatory diagram schematically illustrating exemplary points on the wafer at which measurement is performed by a focus sensor disposed in an exposure apparatus of a lithography system according to Embodiment 2.

FIG. 35 is an explanatory diagram schematically illustrating exemplary points on the wafer WF at which measurement is performed by the focus sensor 58 disposed in the exposure apparatus 14 of the lithography system 100 according to Embodiment 2. The focus sensor 58 applied in Embodiment 2 includes a plurality of autofocus (AF) sensors capable of measuring the wafer height at a plurality of positions in the wafer WF. Each AF sensor includes a light emitting element and a light receiving element.

FIG. 35 illustrates a scanning field SF in scanning exposure to the scanning beam SB in a state in which the scanning beam SB moves in the positive Y axial direction relative to the scanning field SF. A plurality of dot marks arranged in the scanning field SF in FIG. 35 schematically illustrate measurement points of the respective AF sensors, which are not illustrated. In FIG. 35, a reduced number of measurement points are illustrated for simplification of illustration, but the number of measurement points in reality may be larger.

Marks on the wafer WF are unnecessary for measurement of the height of the wafer WF by the AF sensors, and the measurement is possible irrespective of the existence of a pattern on the wafer WF. The measurement by the AF sensors is performed in real time during scanning exposure.

The AF sensors are classified into three kinds, depending on their functions. AF sensors of the first kind are used to measure the wafer height in an area in exposure to the scanning beam SB. AF sensors of the second kind are used for prereading of the wafer height at scanning in the positive Y axial direction. AF sensors of the third kind are used for prereading of the wafer height at scanning in the negative Y axial direction. "Prereading" is measurement of the wafer height in an unexposed region in the scanning field SF ahead of exposure operation and includes measurement of the wafer height immediately before exposure.

Figure 36:
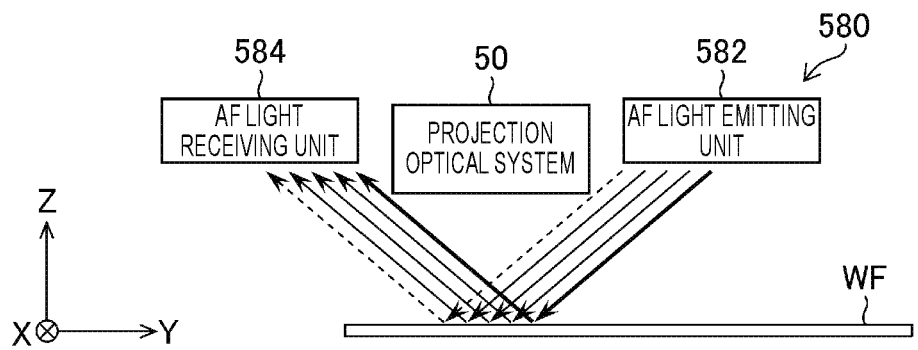
FIG. 36 is a side view schematically illustrating an exemplary configuration of an AF sensor unit applied to the exposure apparatus of the lithography system according to Embodiment 2.

FIG. 36 is a side view schematically illustrating an exemplary configuration of an AF sensor unit 580 applied to the exposure apparatus 14 of the lithography system according to Embodiment 2. The exposure apparatus 14 of Embodiment 2 includes, as the focus sensor 58, the AF sensor unit 580 including a plurality of AF sensors. The AF sensor unit 580 includes an AF light emitting unit 582 and an AF light receiving unit 584. The AF light emitting unit 582 and the AF light receiving unit 584 are arranged in the Y axial direction with the projection optical system 50 interposed therebetween.

The AF light emitting unit 582 includes light emitting elements of the AF sensors of the first kind, light emitting elements of the AF sensors of the second kind, and light emitting elements of the AF sensors of the third kind. The AF light receiving unit 584 includes light receiving elements of the AF sensors of the first kind, light receiving elements of the AF sensors of the second kind, and light receiving elements of the AF sensors of the third kind.

In FIG. 36, bold line arrows represent light emitted from the light emitting elements of the AF sensors of the second kind that perform prereading during scanning in the positive Y axial direction. In FIG. 36, thin line arrows represent light emitted from the light emitting elements of the AF sensors of the first kind. In FIG. 36, dashed line arrows represent light emitted from the light emitting elements of the AF sensors of the third kind that perform prereading during scanning in the negative Y axial direction.

6.2 Operation

6.2.1 Exemplary Contents of Processing by Lithography Control Unit

Figure 37:
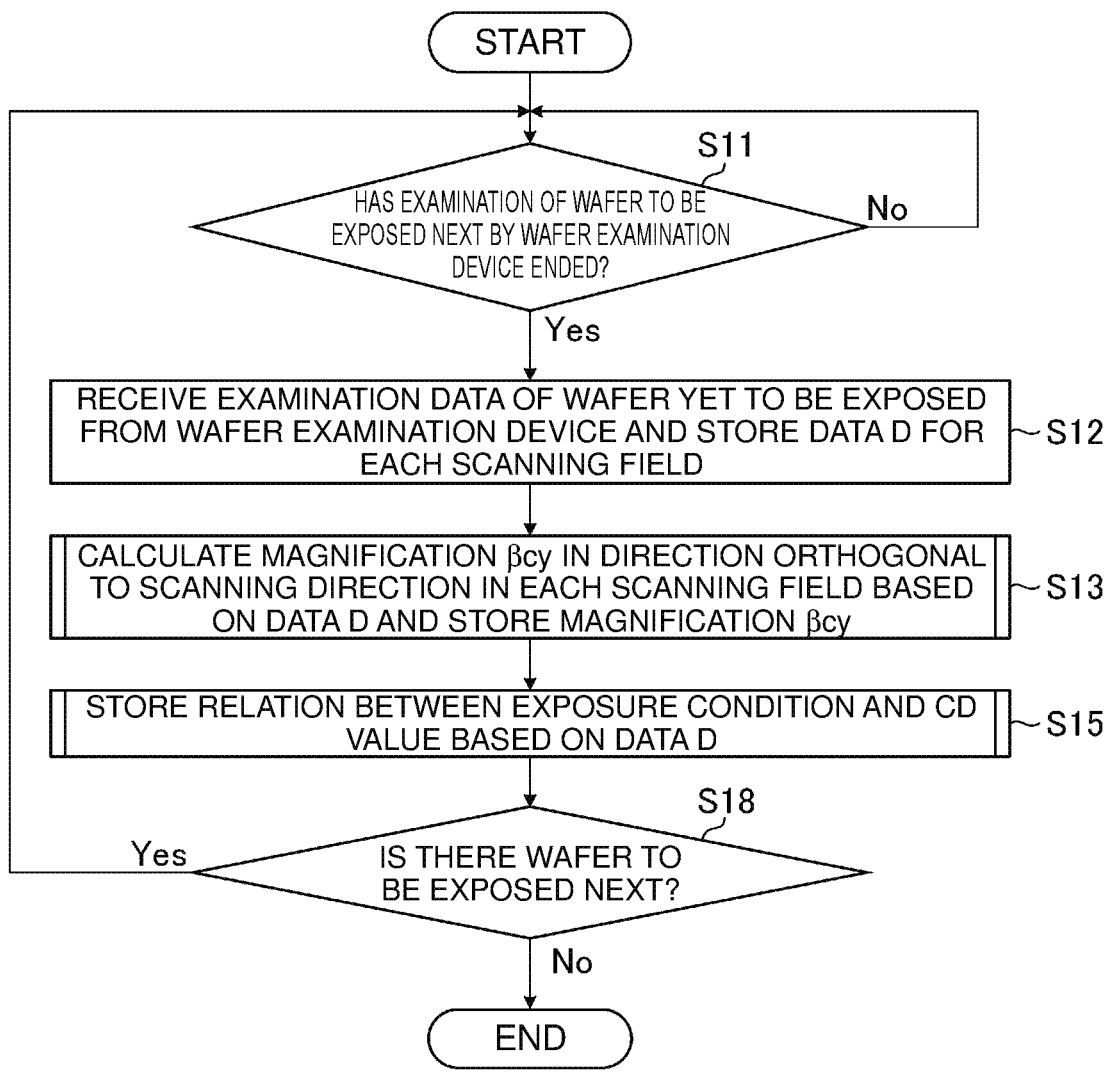
FIG. 37 is a flowchart illustrating exemplary contents of processing by the lithography control unit in the lithography system according to Embodiment 2.

FIG. 37 is a flowchart illustrating exemplary contents of processing by the lithography control unit 110 in the lithography system 100 according to Embodiment 2. In FIG. 37, any step common to a step illustrated in FIG. 12 is denoted by the same step number, and duplicate description thereof is omitted. Description will be made on the difference of FIG. 37 from FIG. 12.

The flowchart illustrated in FIG. 37 does not include steps S14, S16, and S17 in FIG. 12 and proceeds to step S15 after step S13 and then to step S18 after step S15. The other steps are the same as in FIG. 12.

In the case of the lithography system 100 according to Embodiment 2, file data of the file A1, the file C, and the file D can be written and browsed at the lithography control unit 110 and the exposure control unit 40. The file A1 includes table data of the pulse number n and the magnification βcy. The file C includes table data of the relation of each focus position Fc with the wavelength λ and the CD value. The file D includes table data of the relation between the wavelength λ and the magnification 03.

6.2.2 Exemplary Contents of Processing by Exposure Control Unit

Figure 38:
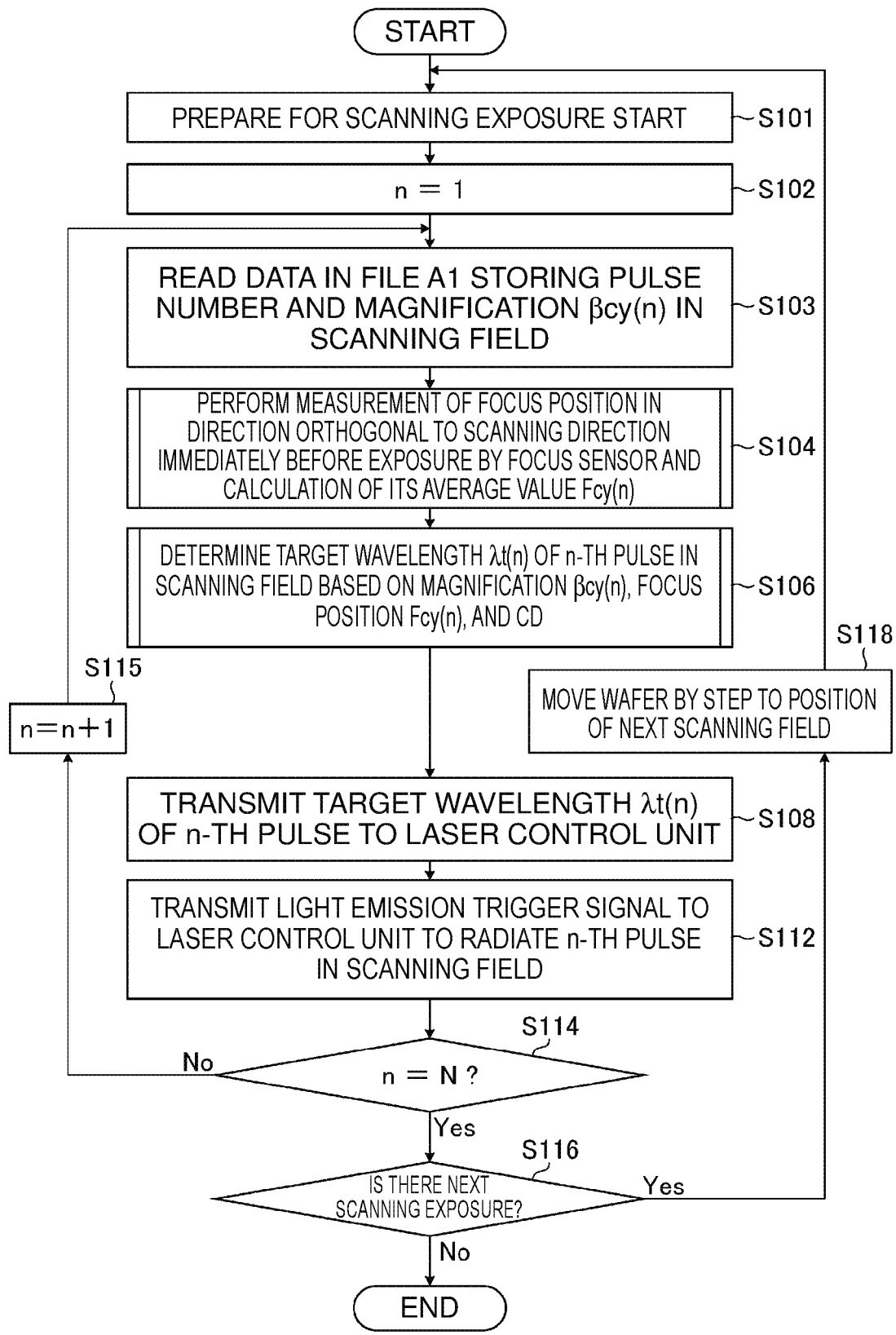
FIG. 38 is a flowchart illustrating exemplary contents of processing by the exposure control unit in the lithography system according to Embodiment 2.

FIG. 38 is a flowchart illustrating exemplary contents of processing by the exposure control unit 40 in the lithography system 100 according to Embodiment 2. The exposure control unit 40 may execute processing in the flowchart illustrated in FIG. 38 in place of the flowchart described above with reference to FIG. 13.

At step S101, the exposure control unit 40 prepares for scanning exposure start.

Subsequently at step S102, the exposure control unit 40 sets the index n of the pulse number of a scanning exposure pulse radiated during one scanning to "1".

Subsequently at step S103, the exposure control unit 40 reads data in the file A1 storing the pulse number and the magnification βcy(n) in a scanning field SF.

Subsequently at step S104, the exposure control unit 40 performs measurement of the focus position in the direction orthogonal to the scanning direction immediately before exposure by the focus sensor 58 and calculation of the focus position Fcy(n) as the average value of the focus position.

Subsequently at step S106, the exposure control unit 40 determines the target wavelength λt(n) of the n-th pulse in the scanning field based on the magnification βcy(n), the focus position Fcy(n), and the CD. The processing at step S106 may be the same as in the flowchart in FIG. 27.

Subsequently at step S108, the exposure control unit 40 transmits the target wavelength λt(n) of the n-th pulse to the laser control unit 20.

Subsequently at step S112, the exposure control unit 40 transmits the light emission trigger signal Tr to the laser control unit 20 to radiate the n-th pulse in the scanning field SF.

Subsequently at step S114, the exposure control unit 40 determines whether the pulse number n is equal to the pulse number N of the last pulse to be radiated during one scanning.

When the result of the determination at step S114 is "No", the exposure control unit 40 proceeds to step S115 to increment the value of the index n and returns to step S103.

When the result of the determination at step S114 is "Yes", the exposure control unit 40 proceeds to step S116. At step S116, the exposure control unit 40 determines whether there is a scanning field SF to be subjected to next scanning exposure target on the wafer WF.

When the result of the determination at step S116 is "Yes", the exposure control unit 40 proceeds to step S118 to move the wafer WF by a step to the position of the next scanning field, and then returns to step S101. When the result of the determination at step S116 is "No", the exposure control unit 40 ends the flowchart in FIG. 38.

Figure 39:
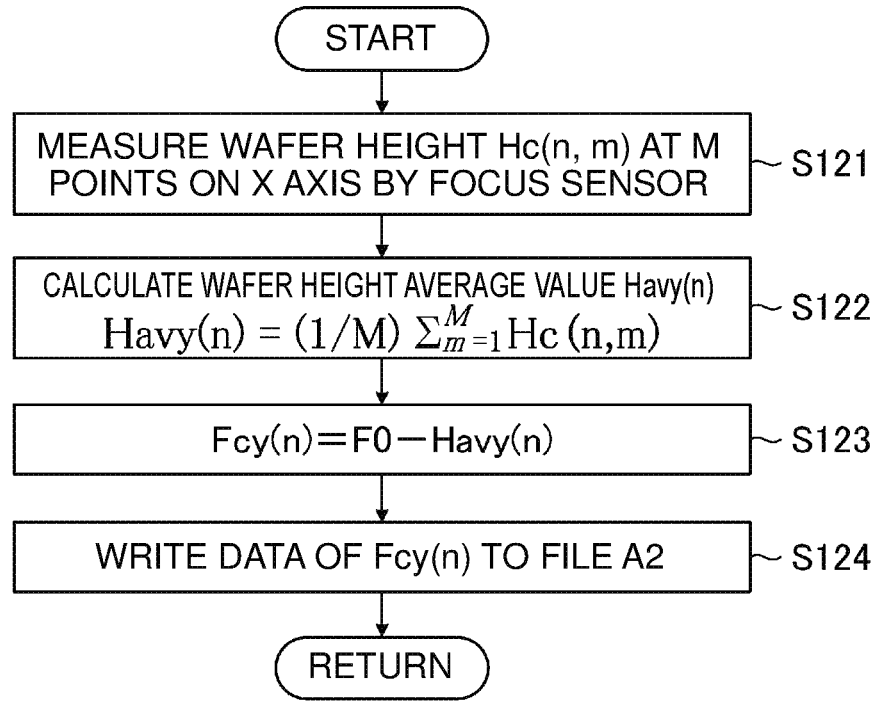
FIG. 39 is a flowchart illustrating an exemplary subroutine applied to step S104 in FIG. 38.

FIG. 39 is a flowchart illustrating an exemplary subroutine applied to step S104 in FIG. 38. At step S121, the exposure control unit 40 measures the wafer height Hc(n, m) at M points on the X axis by the focus sensor 58. For example, when the scanning direction is the positive Y axial direction as illustrated in FIG. 35, the wafer height Hc(n, m) immediately before exposure is measured at each of the M points on the X axis by positive Y axial-direction prereading AF sensors (AF sensors of the second kind) ahead of an area in which exposure to the scanning beam SB is possible in the positive Y axial direction.

Subsequently at step S122, the exposure control unit 40 calculates the average value Havy(n) of the wafer height. The calculation formula of Havy(n) may be Expression (3) described above.

Subsequently at step S123, the exposure control unit 40 determines the focus position Fcy(n) based on the difference between the reference focus position F0 and the average value Havy(n) of the wafer height.

Subsequently at step S124, the exposure control unit 40 writes data of the focus position Fcy(n) to the file A2.

After step S124, the exposure control unit 40 ends the flowchart in FIG. 39 and returns to the flowchart in FIG. 38.

6.3 Effect

With the lithography system 100 according to Embodiment 2, it is possible to measure the height of the wafer WF immediately before exposure and control the focus position in real time, and thus the correction accuracy of each of the magnification in the direction orthogonal to the scanning direction and the focus position further improves.

7. Embodiment 3

7.1 Configuration

Figure 40:
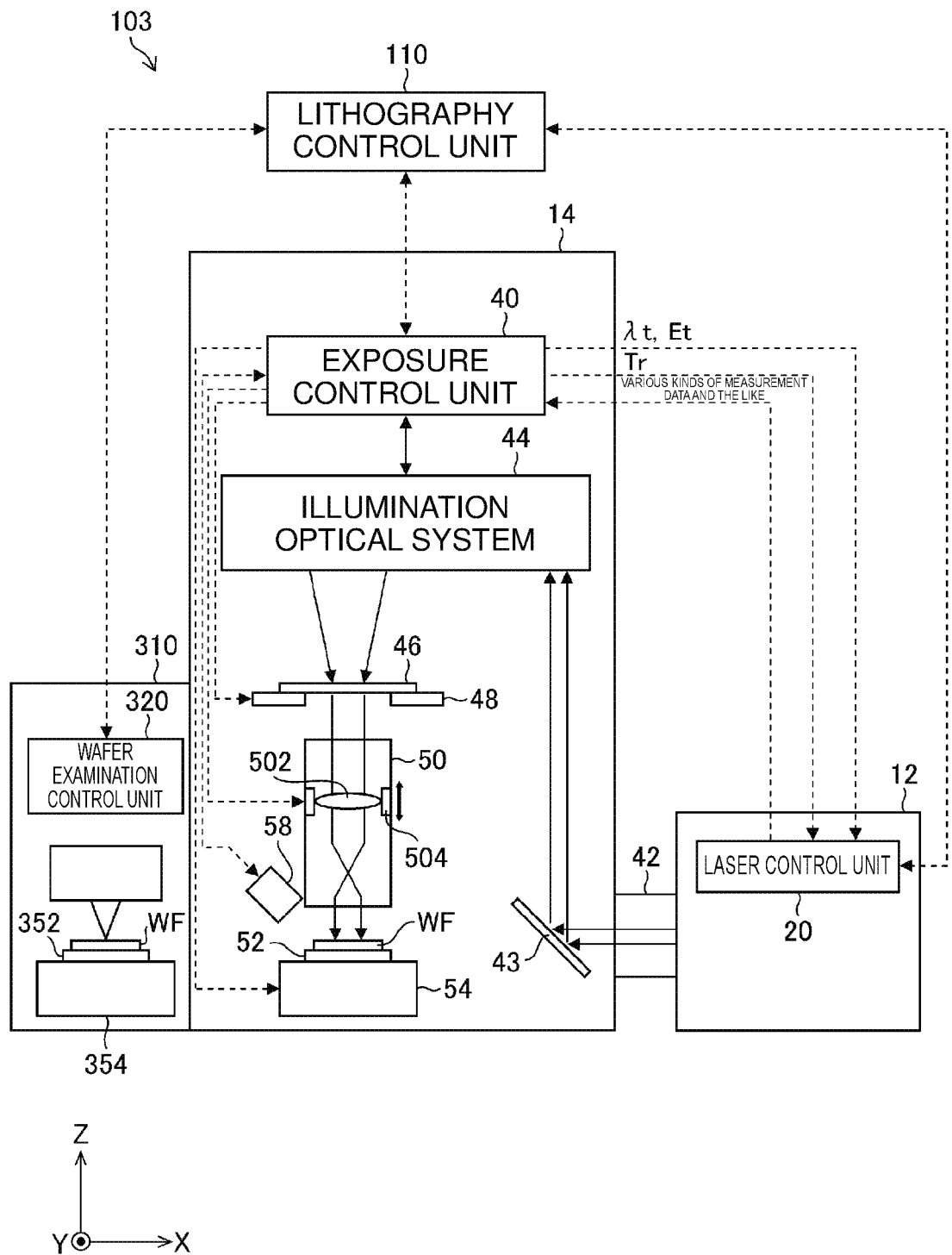
FIG. 40 schematically illustrates an exemplary configuration of a lithography system according to Embodiment 3.

FIG. 40 schematically illustrates an exemplary configuration of a lithography system 103 according to Embodiment 3. Description will be made on the difference of the configuration illustrated in FIG. 40 from the configuration illustrated in FIG. 11. The lithography system 103 illustrated in FIG. 40 includes, in addition to the configuration illustrated in FIG. 11, a piezoelectric actuator 504 configured to select, in the projection optical system 50, one or more lenses 502 capable of controlling the magnification of the entire projection optical system 50 and having small influence on imaging performance such as wavefront aberration and to drive each lens 502 at high speed on the optical axis. The one or more lenses 502 are referred to as a "magnification correction lens 502".

The exposure control unit 40 is connected to a signal line for controlling the piezoelectric actuator 504 to move the magnification correction lens 502 in the direction of the optical axis during scanning exposure.

7.2 Operation

The lithography system 103 according to Embodiment 3 performs, in addition to magnification correction by using the target wavelength λt, correction with the magnification correction lens 502 of the projection optical system 50 in a region in which magnification cannot be sufficiently corrected by using the target wavelength λt, in other words, a wavelength region in which the focus position is shifted.

The lithography control unit 110 or the exposure control unit 40 additionally has a function to control the position of the magnification correction lens 502 to reduce a magnification difference that cannot be sufficiently corrected by using the target wavelength λt of a laser beam output from the laser apparatus 12.

The contents of processing by the lithography control unit 110 may be the same as in the flowchart in FIG. 37.

Figure 41:
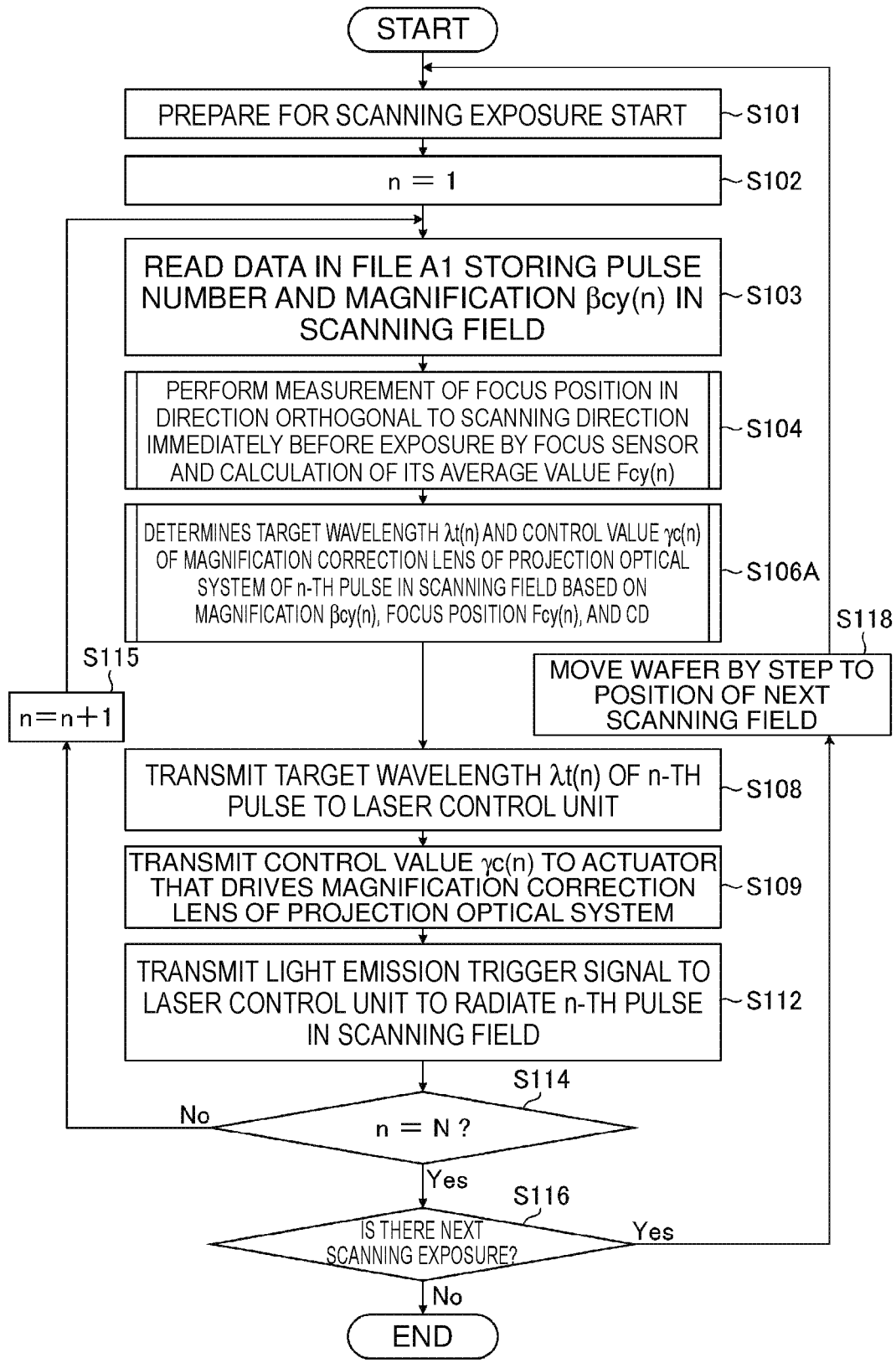
FIG. 41 is a flowchart illustrating exemplary contents of processing by the exposure control unit in the lithography system according to Embodiment 3.

FIG. 41 is a flowchart illustrating exemplary contents of processing by the exposure control unit 40 in the lithography system 103 according to Embodiment 3. The exposure control unit 40 may execute processing in the flowchart illustrated in FIG. 41 in place of the flowchart described above with reference to FIG. 38. In FIG. 41, any step common to a step illustrated in FIG. 38 is denoted by the same step number, and duplicate description thereof is omitted. Description will be made on the difference of the flowchart illustrated in FIG. 41 from the flowchart illustrated in FIG. 38.

The flowchart illustrated in FIG. 41 includes step S106A in place of step S106 in FIG. 38 and additionally includes step S109 between steps S108 and S112.

At step S106A in FIG. 41, the exposure control unit 40 determines the target wavelength λt(n) and a control value γc(n) of the magnification correction lens 502 of the projection optical system 50 of the n-th pulse in the scanning field SF based on the magnification βcy(n), the focus position Fcy(n), and the CD.

At step S109 after step S108, the exposure control unit 40 transmits the control value γc(n) to the piezoelectric actuator 504 that drives the magnification correction lens 502 of the projection optical system 50. The other steps may be the same as in FIG. 38.

Figure 42:
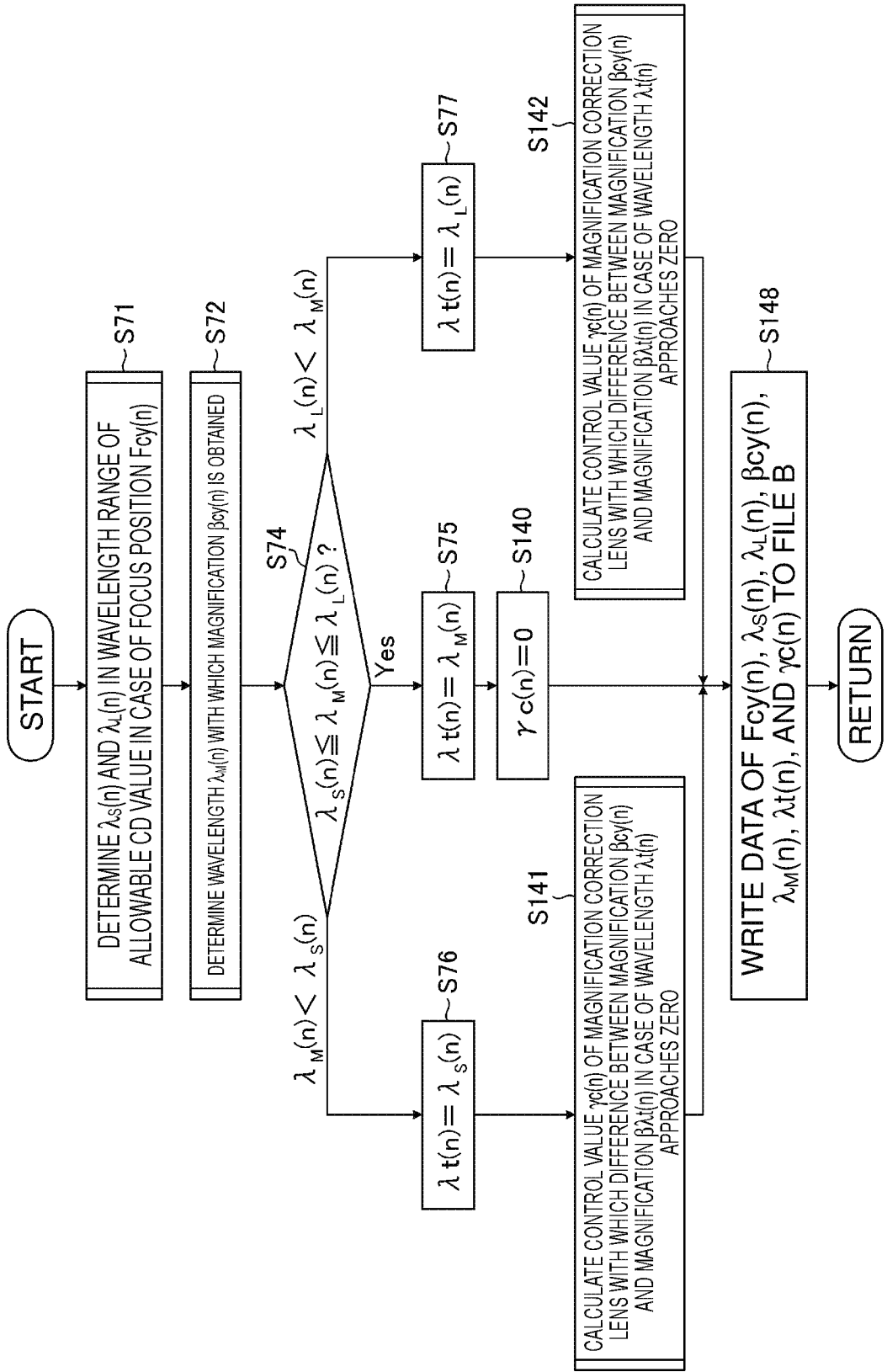
FIG. 42 is a flowchart illustrating an exemplary subroutine applied to step S106A in FIG. 41.

FIG. 42 is a flowchart illustrating an exemplary subroutine applied to step S106A in FIG. 41. Steps S71 to S77 in FIG. 42 are the same as in the flowchart in FIG. 27. Description will be made on the difference of the flowchart illustrated in FIG. 42 from the flowchart illustrated in FIG. 27. The flowchart illustrated in FIG. 42 includes steps S140, S141, S142, and S148 in place of step S78 in FIG. 27.

As illustrated in FIG. 42, after step S75, the exposure control unit 40 proceeds to step S140. At step S140, the exposure control unit 40 sets the control value γc(n) of the magnification correction lens 502 to "0".

After step S76, the exposure control unit 40 proceeds to step S141. At step S141, the exposure control unit 40 calculates the control value γc(n) of the magnification correction lens 502 with which the difference between the magnification βcy(n) and magnification βλt(n) in the case of the wavelength λt(n) approaches zero.

After step S77, the exposure control unit 40 proceeds to step S142. The contents of processing at step S142 may be the same as the contents of processing at step S141.

After step S140, step S141, or step S142, the exposure control unit 40 proceeds to step S148.

At step S148, the exposure control unit 40 writes data of Fcy(n), $λ_S(n)$, $λ_L(n)$, βcy(n), $λ_M(n)$, λt(n), and γc(n) to the file B. The file B applied in Embodiment 3 includes data of the control value γc(n) of the magnification correction lens 502 in addition to the data table of the file B exemplarily illustrated in FIG. 28.

After step S148, the exposure control unit 40 ends the flowchart in FIG. 42 and returns to the flowchart in FIG. 41.

Figure 43:
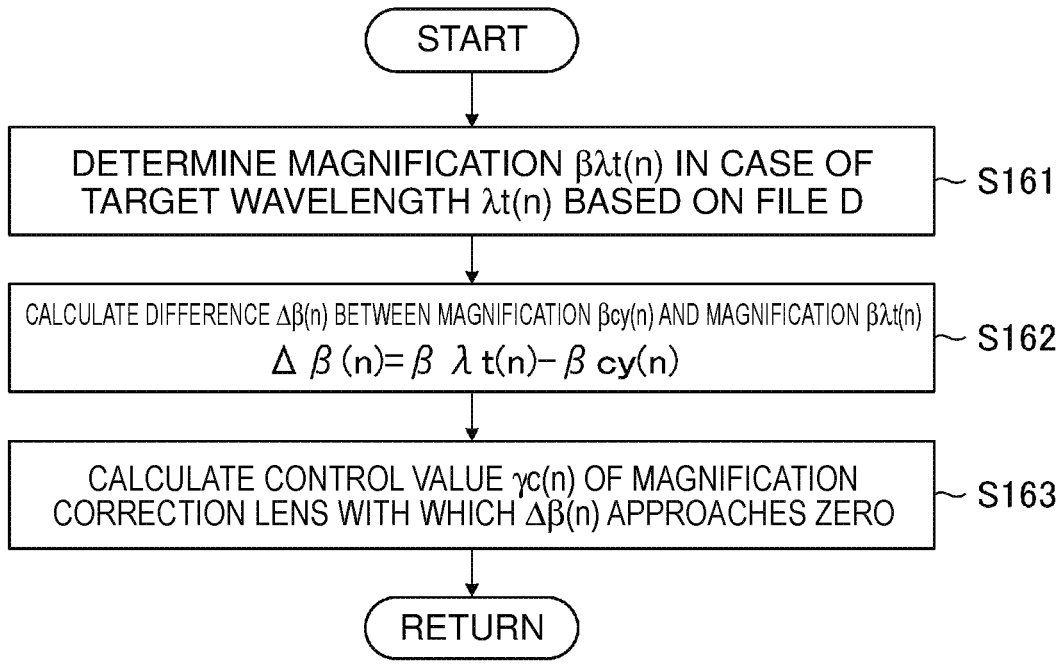
FIG. 43 is a flowchart illustrating an exemplary subroutine applied to steps S141 and S142 in FIG. 42.

FIG. 43 is a flowchart illustrating an exemplary subroutine applied to steps S141 and S142 in FIG. 42. At step S161 in FIG. 43, the exposure control unit 40 determines the magnification βλt(n) in the case of the target wavelength λt(n) based on the file D.

Subsequently at step S162, the exposure control unit 40 calculates difference Δβ(n) between the magnification βcy (n) and the magnification βλt(n) by using Expression (5) below.

$$Δβ(n)=βλt(n)-βcy(n) \quad (5)$$

The difference Δβ(n) calculated by using Expression (5) is equivalent to a magnification correction value.

Subsequently at step S163, the exposure control unit 40 calculates the control value γc(n) of the magnification correction lens 502 with which Δβ(n) approaches zero. The exposure control unit 40 may store the relation between Δβ and the control value γc of the magnification correction lens 502, for example, as table data or a function in a storage unit in advance and may calculate the control value γc(n) of the magnification correction lens 502 by calling the table data or the function.

After step S163, the exposure control unit 40 ends the flowchart in FIG. 43 and returns to the flowchart in FIG. 42.

7.3 Effect

With the lithography system 103 according to Embodiment 3, it is possible to set magnification closer to target magnification by controlling the magnification correction lens 502 in a region in which the magnification cannot be corrected with the configuration of Embodiment 1, in other words, a region of $λ_M(n)<λ_S(n)$ or $λL(n)<λ_M(n)$. Accordingly, overlay accuracy further improves.

7.4 Modification

In Embodiment 3, the height of the wafer WF is measured by the focus sensor 58 of the exposure apparatus 14, but the present invention is not limited to this example. Similarly to Embodiment 1, the wafer height may be measured by the wafer examination device 310 in advance and then processing may be performed. In this case, the lithography control unit 110 may execute the same calculation processing as step S106A described above with reference to FIG. 41 and may transmit data of the target wavelength λt(n) of the first pulse to the final pulse in the scanning field SF to the laser control unit 20 through the exposure control unit 40 and transmit data of the control value γc(n) of the magnification correction lens 502 to the exposure control unit 40 in advance. Then, the laser control unit 20 may output a laser beam having the target wavelength λt(n) for each pulse, and the exposure control unit 40 may control the magnification correction lens 502 to achieve the control value γc(n) of the magnification correction lens 502 for each pulse.

8. Embodiment 4

8.1 Configuration

Figure 44:
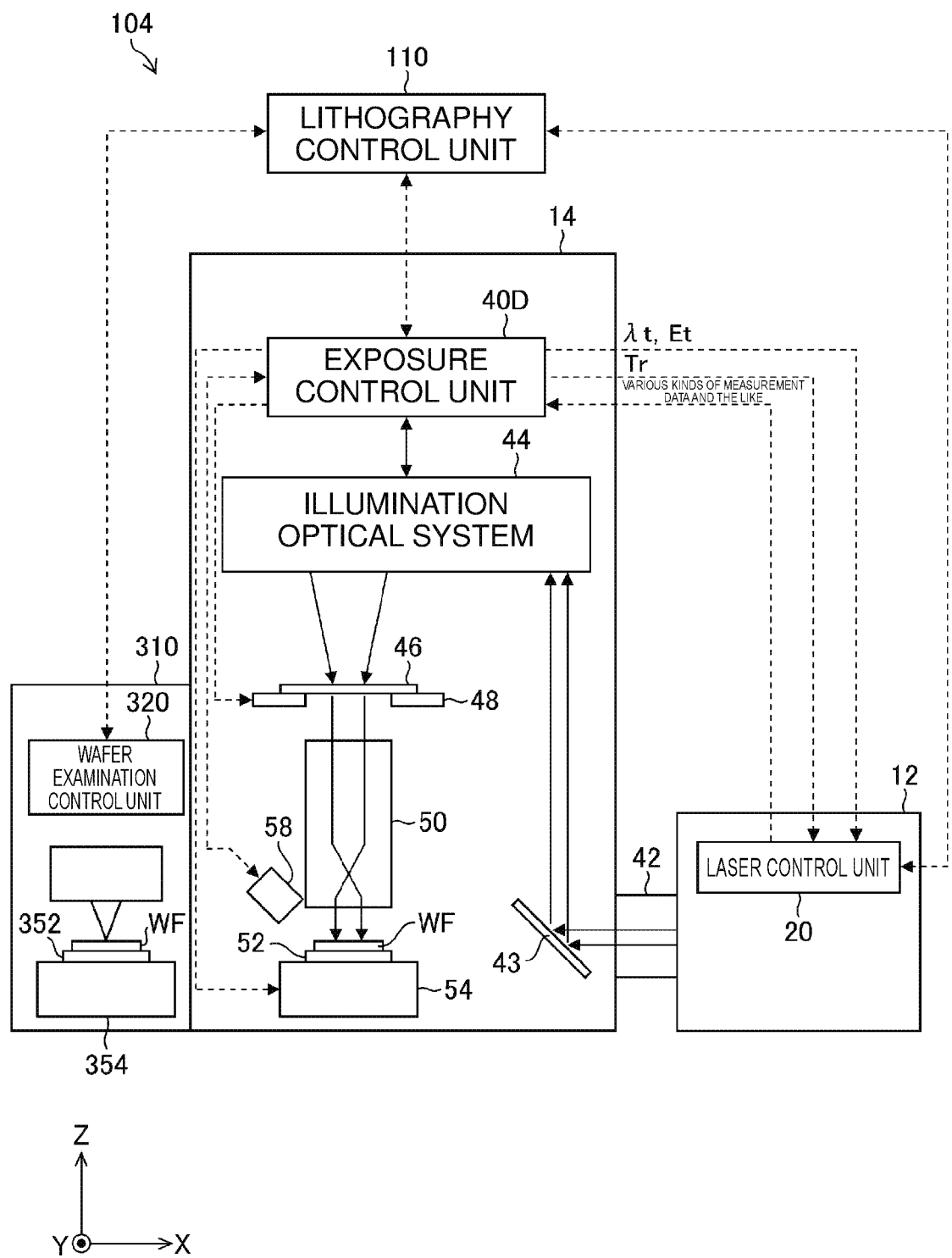
FIG. 44 schematically illustrates an exemplary configuration of a lithography system according to Embodiment 4.

FIG. 44 schematically illustrates an exemplary configuration of a lithography system 104 according to Embodiment 4. Description will be made on the difference of the configuration illustrated in FIG. 44 from the configuration illustrated in FIG. 11. The lithography system 104 illustrated in FIG. 44 includes an exposure control unit 40D in place of the exposure control unit 40 in FIG. 11. The other configuration is the same as in FIG. 11.

Similarly to the exposure control unit 40 in FIG. 11, the exposure control unit 40D corrects magnification by using the target wavelength λt and performs control to change the focus position by controlling a Z-axis stage of the wafer stage 54 in a wavelength region in which the focus position is shifted.

8.2 Operation

The lithography control unit 110 or the exposure control unit 40D corrects magnification by using the target wavelength λt of a laser beam output from the laser apparatus 12. In a region in which the CD value deviates from an allowable range despite the correction, the exposure control unit 40D controls the focus position by controlling the Z-axis stage of the wafer stage 54 so that the CD value enters the allowable range. The lithography control unit 110 may perform the same flowchart as in FIG. 37.

Figure 45:
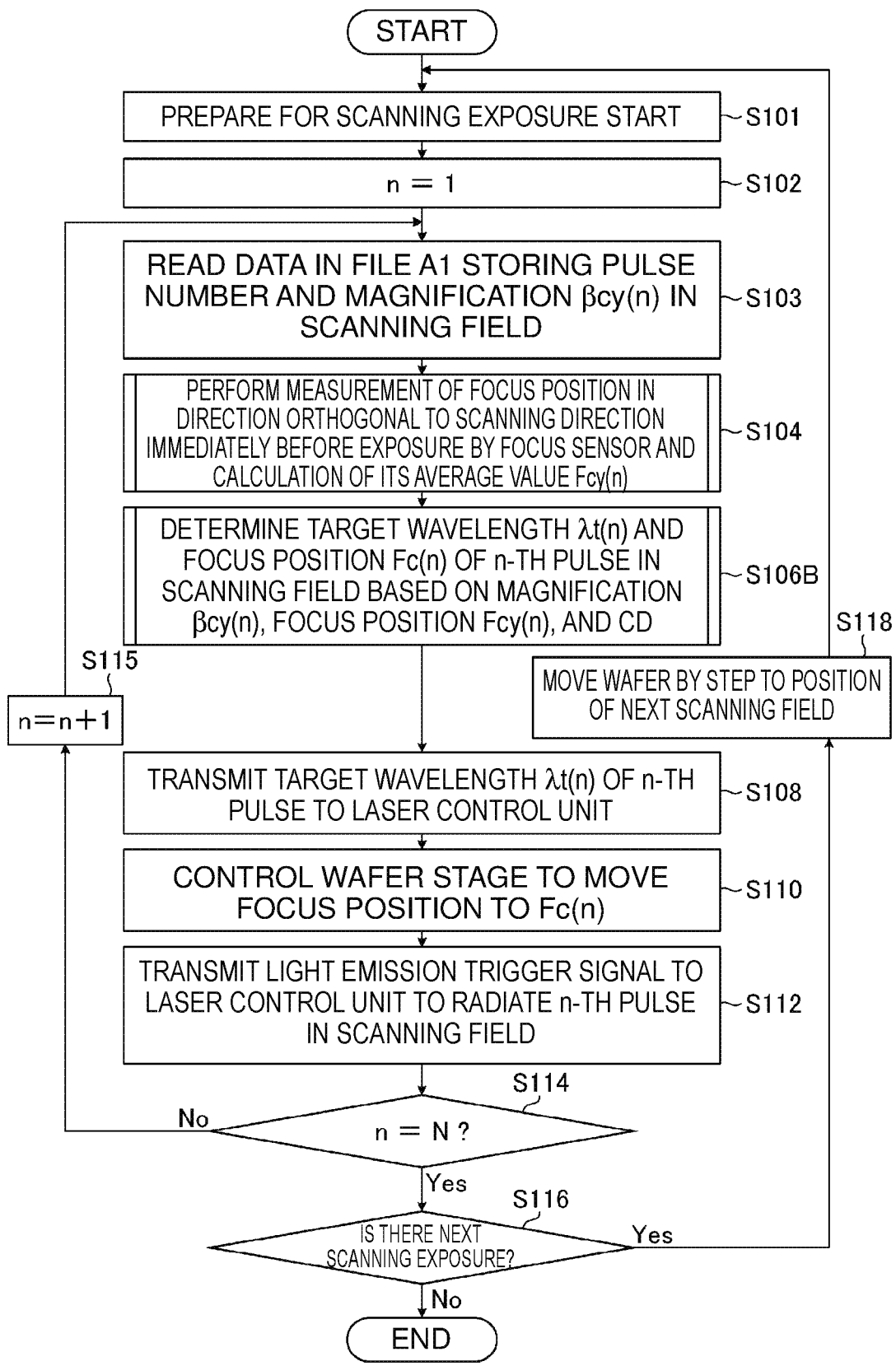
FIG. 45 is a flowchart illustrating exemplary contents of processing by the exposure control unit in the lithography system according to Embodiment 4.

FIG. 45 is a flowchart illustrating exemplary contents of processing by the exposure control unit 40D in the lithography system 104 according to Embodiment 4. The exposure control unit 40D may execute processing in the flowchart illustrated in FIG. 45 in place of the flowchart described above with reference to FIG. 38. In FIG. 45, any step identical to a step illustrated in FIG. 38 is denoted by the same step number, and description thereof is omitted. Description will be made on the difference of the flowchart illustrated in FIG. 45 from the flowchart illustrated in FIG. 38.

The flowchart illustrated in FIG. 45 includes step S106B in place of step S106 in FIG. 38 and additionally includes step S110 between steps S108 and S112.

At step S106B, the exposure control unit 40D determines the target wavelength λt(n) and a focus position Fc(n) of the n-th pulse in the scanning field SF based on the magnification βcy(n), the focus position Fcy(n), and the CD. The focus position Fc(n) is equivalent to a target focus position.

At step S110 after step S108, the exposure control unit 40D controls the wafer stage 54 to move the focus position to Fc(n). After step S110, the exposure control unit 40D proceeds to step S112. The other steps may be the same as in FIG. 38.

Figure 46:
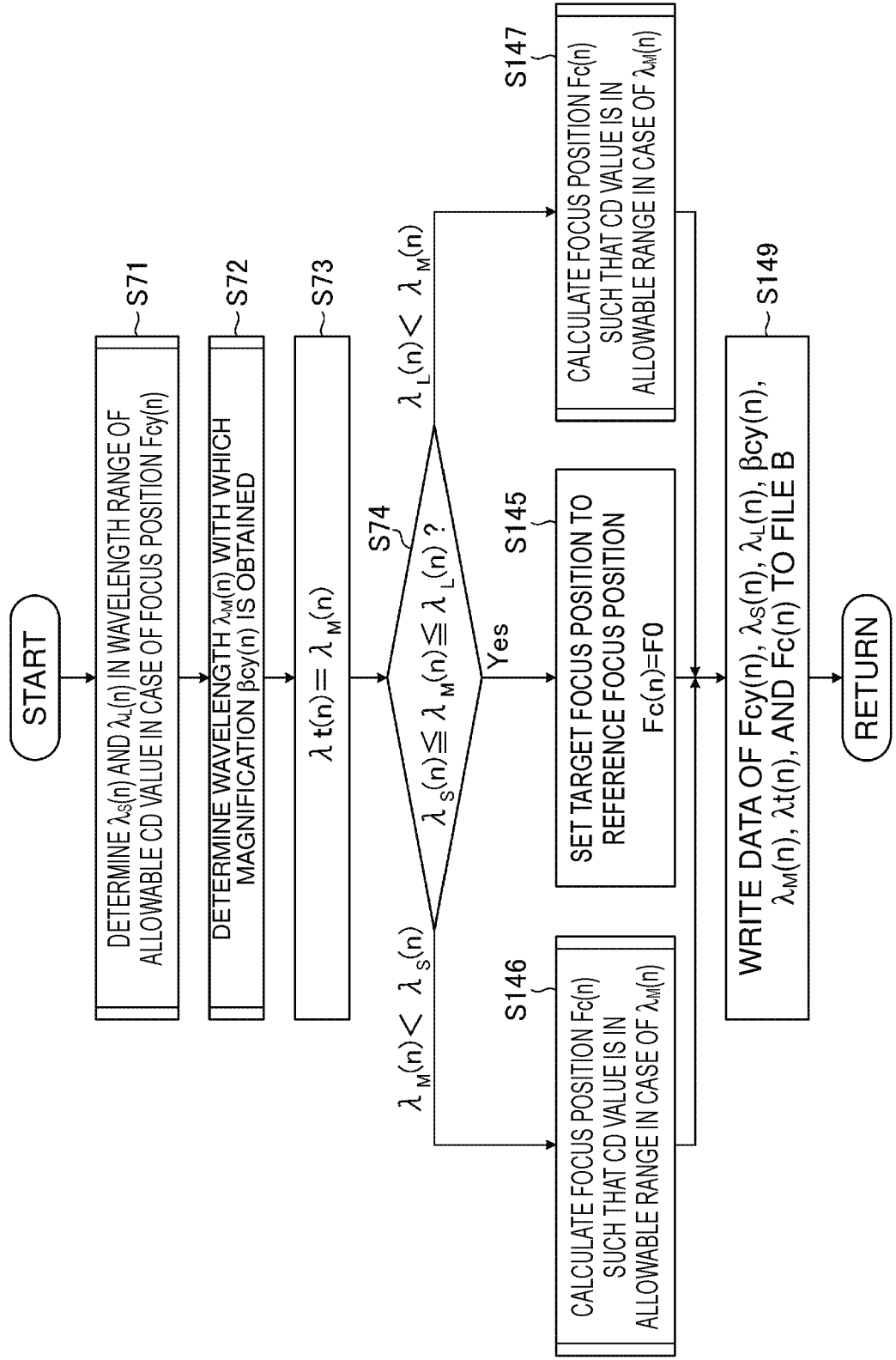
FIG. 46 is a flowchart illustrating an exemplary subroutine applied to step S106B in FIG. 45.

FIG. 46 is a flowchart illustrating an exemplary subroutine applied to step S106B in FIG. 45. Description will be made on the difference of the flowchart illustrated in FIG. 46 from the flowchart illustrated in FIG. 27. The flowchart illustrated in FIG. 46 includes step S73 between steps S72 and S74. The flowchart illustrated in FIG. 46 also includes steps S145 to S147 in place of steps S75 to S77 in FIG. 27 and includes step S149 in place of step S78 in FIG. 27.

After step S72 in FIG. 46, the exposure control unit 40D proceeds to step S73.

At step S73, the exposure control unit 40D sets the target wavelength λt(n) to the wavelength $\lambda_M(n)$. After step S73, the exposure control unit 40D proceeds to step S74.

When the result of the determination at step S74 satisfies $\lambda_S(n) \leq \lambda_M(n) \leq \lambda_L(n)$, the exposure control unit 40D proceeds to step S145.

At step S145, the exposure control unit 40D sets the target focus position Fc(n) to the reference focus position F0.

When the result of the determination at step S74 satisfies $\lambda_M(n) < \lambda_S(n)$, the exposure control unit 40D proceeds to step S146. At step S146, the exposure control unit 40D calculates the focus position Fc(n) such that the CD value is in the allowable range when the wavelength is equal to $\lambda_M(n)$.

When the result of the determination at step S74 satisfies $\lambda_L(n) < \lambda_M(n)$, the exposure control unit 40D proceeds to step S147. Step S147 may be the same as step S146.

After step S145, step S146, or step S147, the exposure control unit 40D proceeds to step S149. At step S149, the exposure control unit 40D writes data of Fcy(n), $\lambda_S(n)$, λL(n), βcy(n), $\lambda_M(n)$, λt(n), and Fc(n) to the file B.

After step S149, the exposure control unit 40D ends the flowchart in FIG. 46 and returns to the flowchart in FIG. 45.

Figures 47, 48:
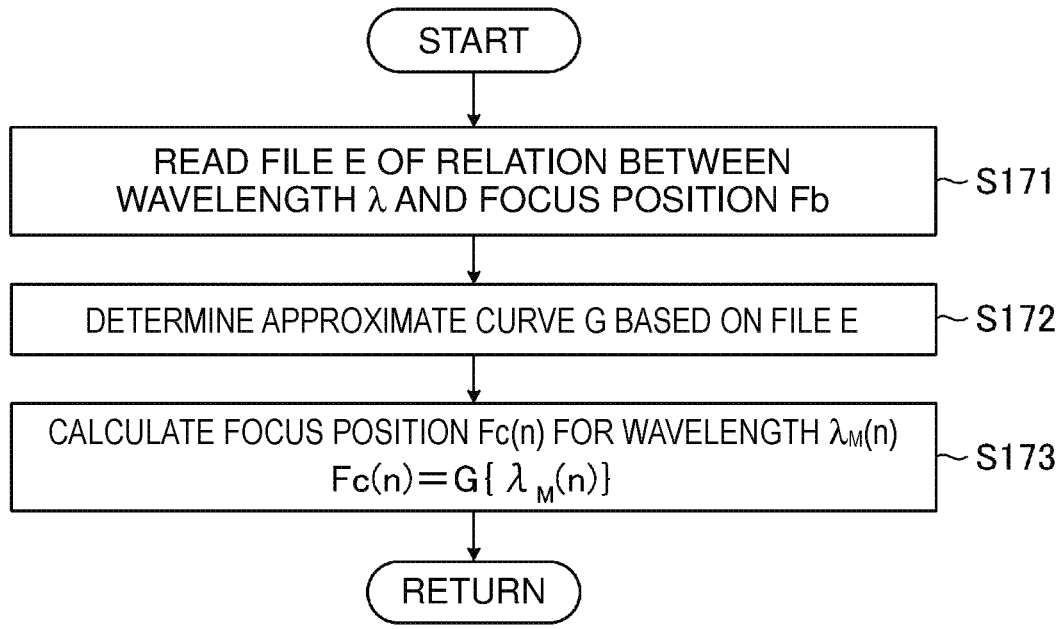
FIG. 47 is a flowchart illustrating an exemplary subroutine applied to steps S146 and S147 in FIG. 46.
FIG. 48 is a table listing exemplary table data stored in a file E.

FIG. 47 is a flowchart illustrating an exemplary subroutine applied to steps S146 and S147 in FIG. 46. At step S171 in FIG. 47, the exposure control unit 40D reads the file E of the relation between the wavelength λ and a focus position Fb. Note that, before step S171, the file E of the relation between the wavelength λ and the focus position Fb of the projection optical system 50 is calculated or measured and is stored in advance. FIG. 48 illustrates an example of the file E. The exposure control unit 40D reads the file E stored in advance. Note that the CD value in the allowable range can be maintained at the focus position Fb.

Subsequently at step S172, the exposure control unit 40D determines an approximate curve G based on the file E.

Subsequently at step S173, the exposure control unit 40D calculates the focus position Fc(n) for the wavelength $\lambda_M(n)$ by using the function of the approximate curve G. When the function of the approximate curve G is represented by Fb=G{λ}, the exposure control unit 40D calculates the focus position by Fc(n)=G{$\lambda_M(n)$}.

After step S173, the exposure control unit 40D ends the flowchart in FIG. 47 and returns to the flowchart in FIG. 46.

Figure 49:
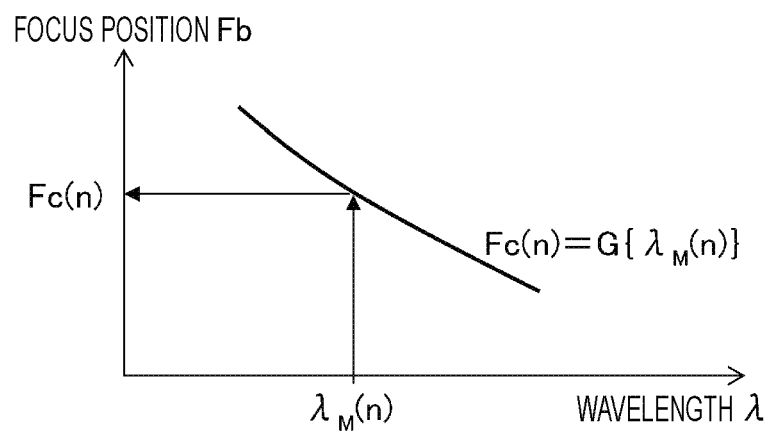
FIG. 49 is a graph illustrating an exemplary approximate curve G obtained at step S172 in FIG. 47.

FIG. 49 is a graph illustrating an example of the approximate curve G obtained at step S172 in FIG. 47. The horizontal axis represents the wavelength λ, and the vertical axis represents the focus position Fb. FIG. 49 illustrates the idea of a calculation method of determining Fc(n) as the focus position corresponding to the wavelength $\lambda_M(n)$ by using the function of the approximate curve G.

8.3 Effect

With the lithography system 104 according to Embodiment 4, magnification can be set closer to target magnification by controlling the focus position in a region in which the magnification cannot be corrected with the configuration of Embodiment 1, in other words, a region of $\lambda_M(n)<\lambda_S(n)$ or $\lambda L(n)<\lambda_M(n)$, and the CD is maintained in the allowable range. Accordingly, overlay accuracy further improves.

8.4 Modification 1

Figure 50:
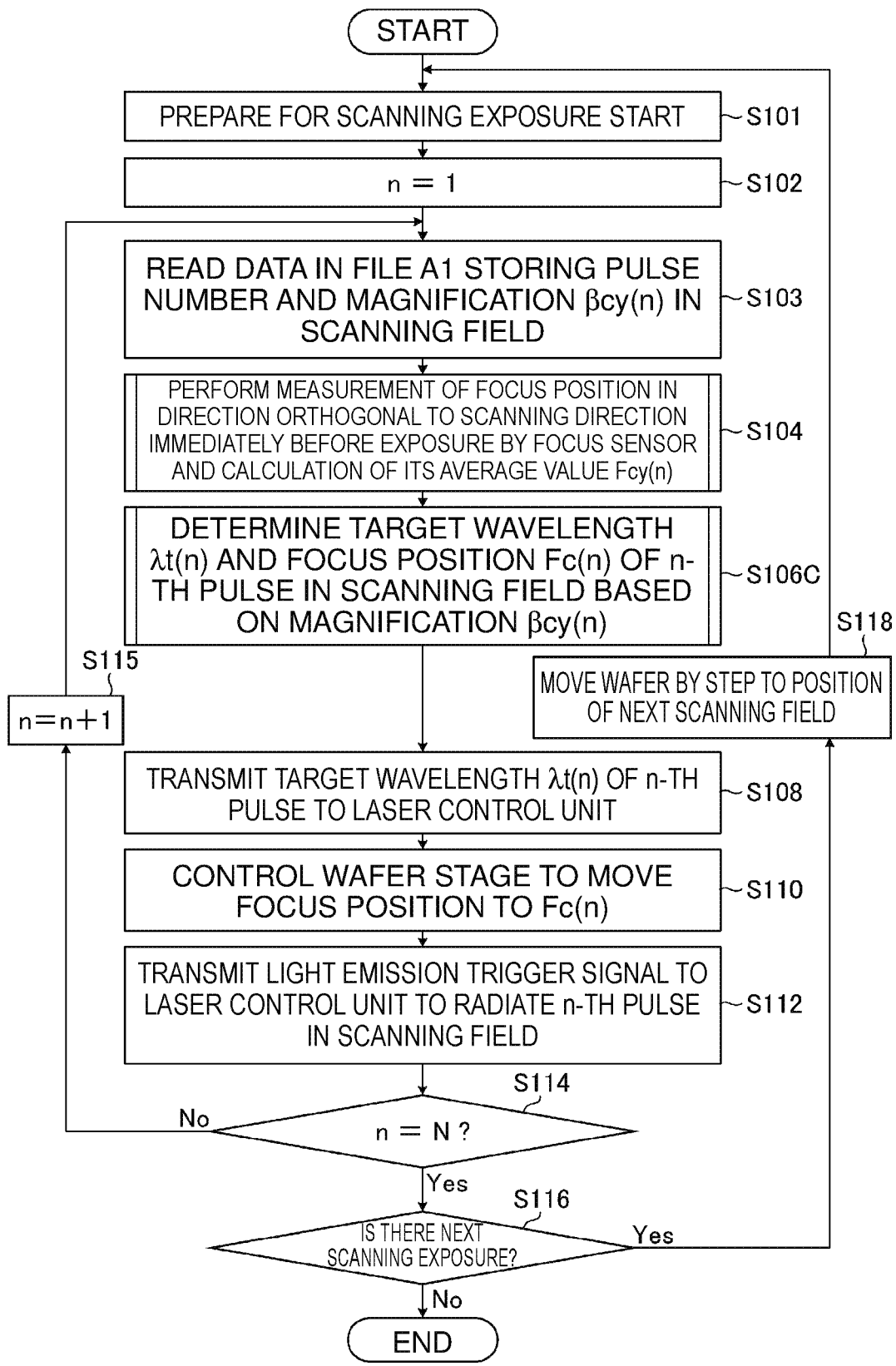
FIG. 50 is a flowchart illustrating exemplary contents of processing by the exposure control unit according to a modification of Embodiment 4.

FIG. 50 is a flowchart illustrating exemplary contents of processing by the exposure control unit 40D according to a modification of Embodiment 4. The flowchart illustrated in FIG. 50 may be applied in place of the flowchart in FIG. 45. Description will be made on the difference of the flowchart illustrated in FIG. 50 from the flowchart illustrated in FIG. 45. The flowchart illustrated in FIG. 50 includes step S106C in place of step S106B in FIG. 45. The other steps may be the same as in FIG. 45.

At step S106C in FIG. 50, the exposure control unit 40D determines the target wavelength $\lambda t(n)$ and the focus position Fc(n) of the n-th pulse in the scanning field SF based on the magnification βcy(n).

Figure 51:
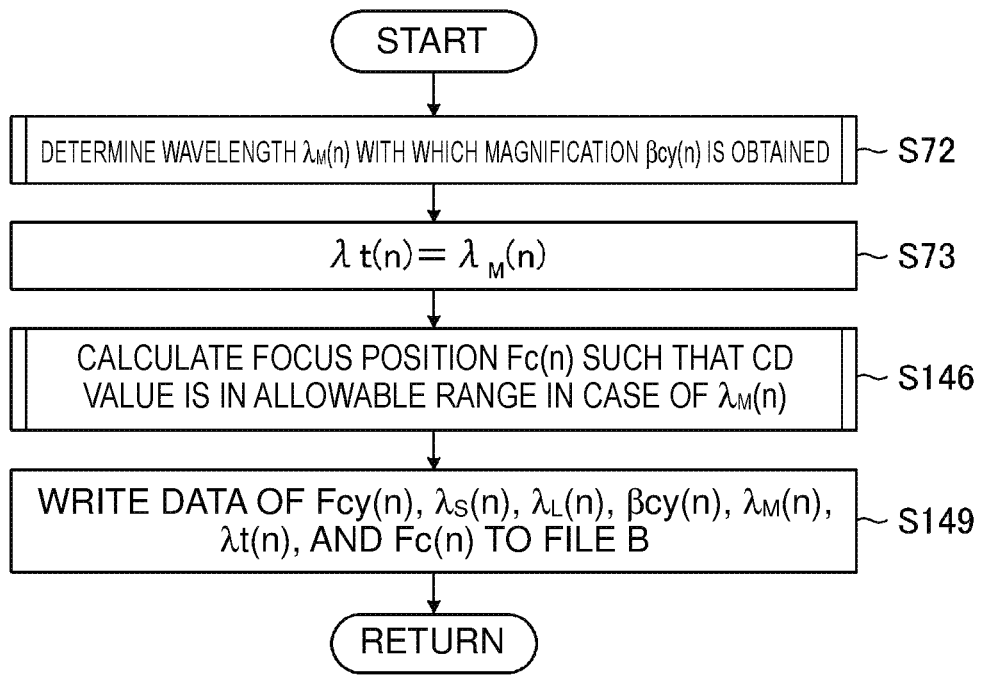
FIG. 51 is a flowchart illustrating an exemplary subroutine applied to step S106C in FIG. 50.

FIG. 51 is a flowchart illustrating an exemplary subroutine applied to step S106C in FIG. 50. Description will be made on the difference of the flowchart illustrated in FIG. 51 from the flowchart illustrated in FIG. 46. The flowchart illustrated in FIG. 51 does not include steps S71, S74, and S145 in FIG. 46 and processing proceeds to step S146 after step S73. The other steps may be the same as in FIG. 46.

8.5 Modification 2

In Embodiment 4, the height of the wafer WF is measured by the focus sensor 58 of the exposure apparatus 14, but the present invention is not limited to this example. Similarly to Embodiment 1, the wafer height may be measured by the wafer examination device 310 in advance and then processing may be performed.

Specifically, the lithography control unit 110 may execute the calculation processing at step S106B in FIG. 45 and may transmit data of the target wavelength $\lambda t(n)$ of the first pulse to the final pulse in the scanning field SF to the laser control unit 20 through the exposure control unit 40D and transmit data of the focus position Fc(n) to the exposure control unit 40D in advance.

Then, the laser control unit 20 may output a laser beam having the target wavelength $\lambda t(n)$ for each pulse, and the exposure control unit 40D may control the wafer stage 54 to achieve the focus position Fc(n) for each pulse.

9. Embodiment 5

9.1 Configuration

Figure 52:
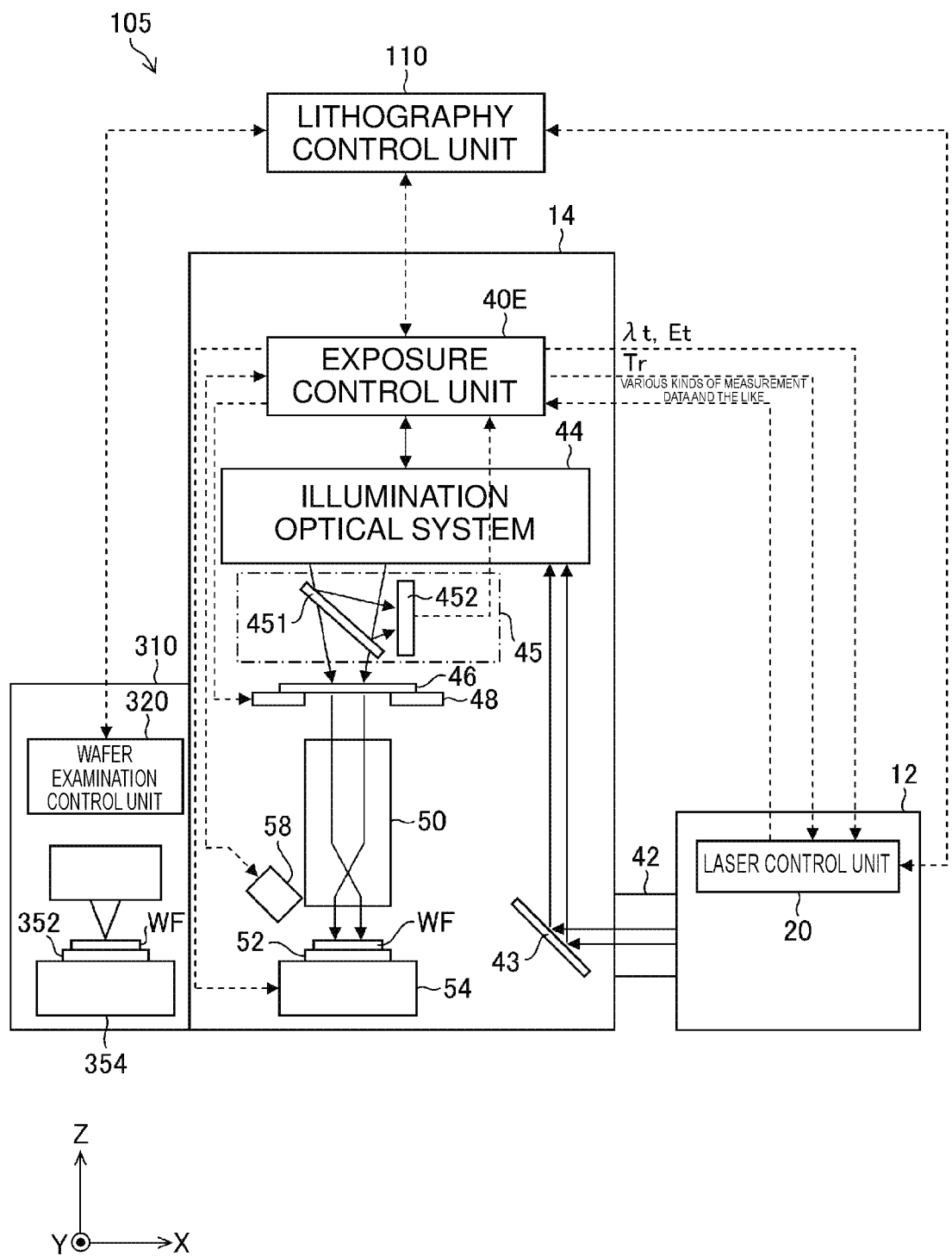
FIG. 52 schematically illustrates an exemplary configuration of a lithography system according to Embodiment 5.

FIG. 52 schematically illustrates an exemplary configuration of a lithography system 105 according to Embodiment 5. Description will be made on the difference of the configuration illustrated in FIG. 52 from the configuration illustrated in FIG. 11. The lithography system 105 illustrated in FIG. 52 includes a pulse energy sensor unit 45 for measuring a dose on the wafer surface in addition to the configuration illustrated in FIG. 11. The lithography system 105 illustrated in FIG. 52 also includes an exposure control unit 40E in place of the exposure control unit 40 in FIG. 11.

The pulse energy sensor unit 45 includes a beam splitter 451 disposed on the optical path between the illumination optical system 44 and the reticle stage 48, and a pulse energy sensor 452 configured to receive a pulse laser beam sampled by the beam splitter 451. The pulse energy sensor 452 is connected to the exposure control unit 40E through a signal line.

9.2 Operation

The lithography control unit 110 or the exposure control unit 40E corrects magnification by using the target wavelength $\lambda t$ of a laser beam output from the laser apparatus 12. In a region in which the CD value deviates from the allowable range despite the correction, the exposure control unit 40E controls the dose on the surface of the wafer WF so that the CD value enters the allowable range.

The exposure control unit 40E transmits the target pulse energy Et to the laser control unit 20 to control the dose on the surface of the wafer WF for each pulse.

The lithography control unit 110 may perform the same flowchart as in FIG. 37.

Figure 53:
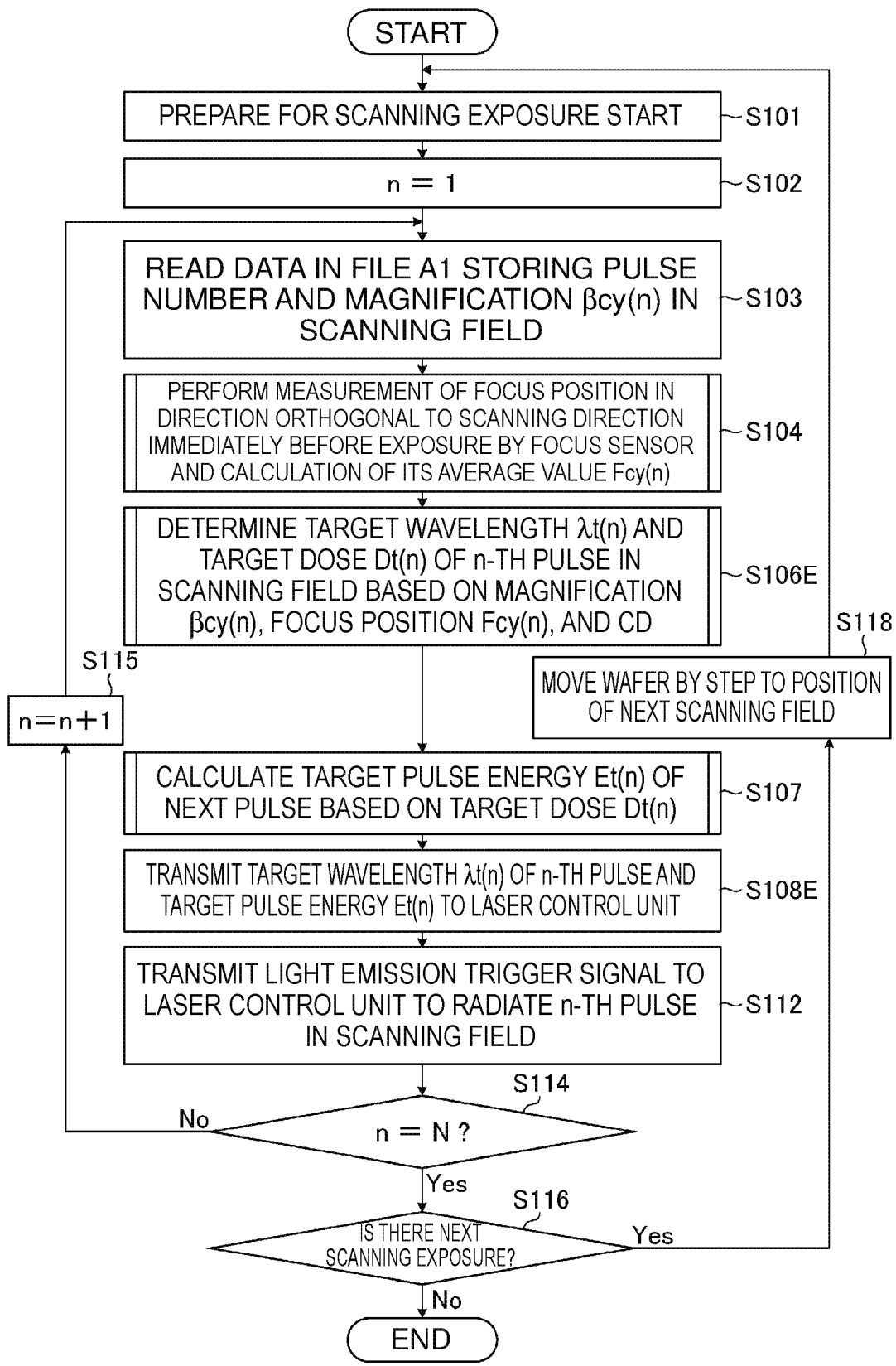
FIG. 53 is a flowchart illustrating exemplary contents of processing by the exposure control unit in the lithography system according to Embodiment 5.

FIG. 53 is a flowchart illustrating exemplary contents of processing by the exposure control unit 40E in the lithography system 105 according to Embodiment 5. The exposure control unit 40E may execute processing in the flowchart illustrated in FIG. 53 in place of the flowchart described above with reference to FIG. 38. Description will be made on the difference of the flowchart illustrated in FIG. 53 from the flowchart illustrated in FIG. 38. The flowchart illustrated in FIG. 53 includes steps S106E and S108E in place of steps S106 and S108 in FIG. 38 and additionally includes step S107 between steps S106E and S108E.

At step S106E, the exposure control unit 40E determines the target wavelength $\lambda t(n)$ and a target dose Dt(n) of the n-th pulse in the scanning field SF based on the magnification βcy(n), the focus position Fcy(n), and the CD.

Subsequently at step S107, the exposure control unit 40E calculates target pulse energy Et(n) of the next pulse based on the target dose Dt(n).

Then, at step S108E, the exposure control unit 40E transmits the target wavelength $\lambda t(n)$ of the n-th pulse and the target pulse energy Et(n) to the laser control unit 20. The other steps may be the same as in FIG. 38.

Figure 54:
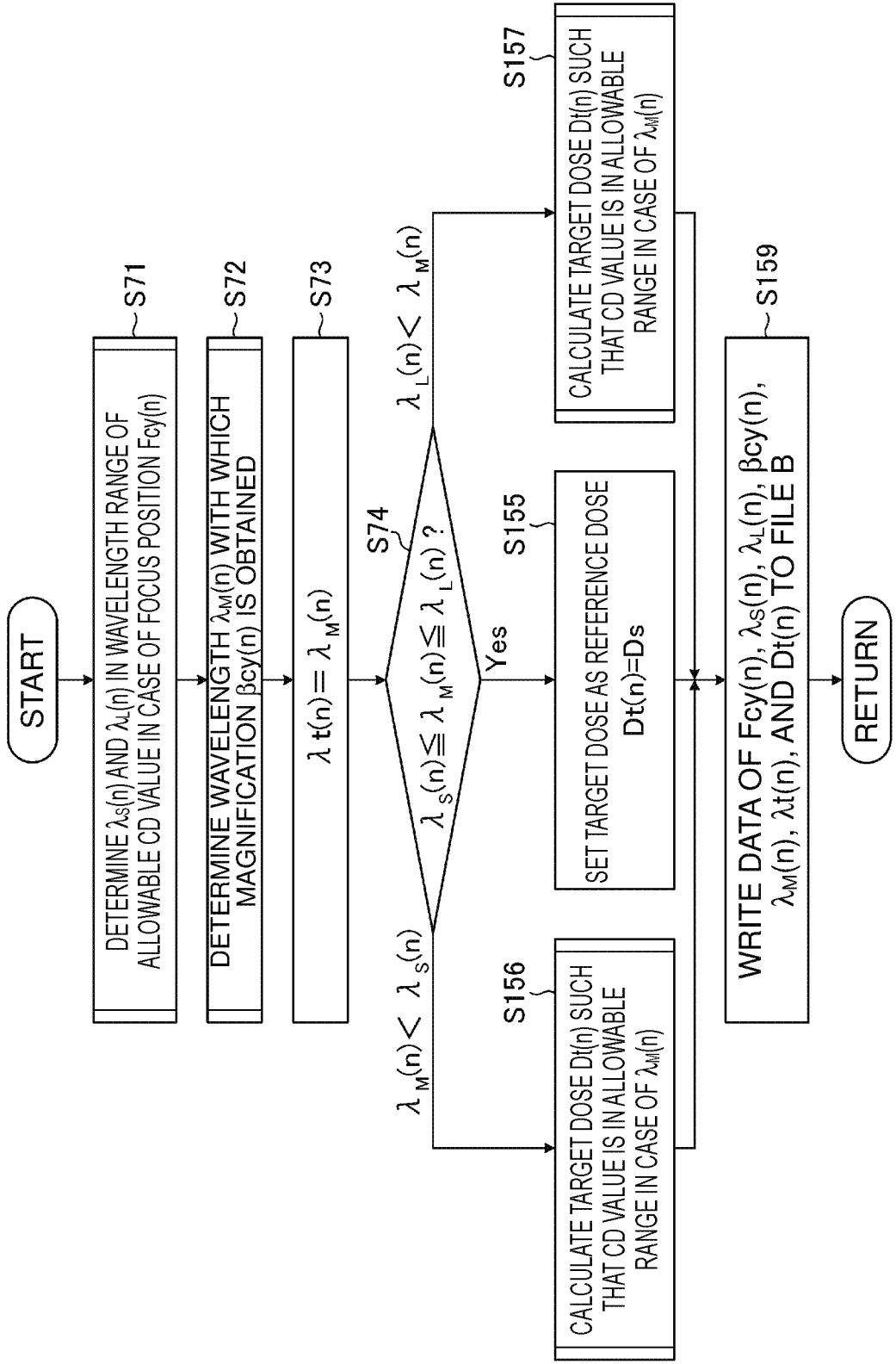
FIG. 54 is a flowchart illustrating an exemplary subroutine applied to step S106E in FIG. 53.

FIG. 54 is a flowchart illustrating an exemplary subroutine applied to step S106E in FIG. 53. Steps S71 to S74 in FIG. 54 are the same as in FIG. 46. Description will be made on the difference of the flowchart illustrated in FIG. 54 from the flowchart illustrated in FIG. 46.

The flowchart illustrated in FIG. 54 includes steps S155, S156, S157, and S159 in place of steps S145, S146, S147, and S149 in FIG. 46.

When the result of the determination at step S74 in FIG. 54 satisfies $\lambda_S(n) \le \lambda_M(n) \le \lambda_L(n)$, the exposure control unit 40E proceeds to step S155.

At step S155, the exposure control unit 40E sets the target dose Dt(n) as a reference dose Ds.

When the result of the determination at step S74 satisfies $\lambda_M(n)<\lambda_S(n)$, the exposure control unit 40E proceeds to step S156. At step S156, the exposure control unit 40E calculates the target dose Dt(n) such that the CD value is in the allowable range when the wavelength is equal to $\lambda_M(n)$.

When the result of the determination at step S74 satisfies $\lambda_L(n)<\lambda_M(n)$, the exposure control unit 40E proceeds to step S157. Step S157 may be the same as step S156.

After step S155, step S156, or step S157, the exposure control unit 40E proceeds to step S159. At step S159, the exposure control unit 40E writes data of Fcy(n), $\lambda_S(n)$, $\lambda L(n)$, βcy(n), $\lambda_M(n)$, $\lambda t(n)$, and Dt(n) to the file B.

After step S159, the exposure control unit 40E ends the flowchart in FIG. 54 and returns to the flowchart in FIG. 53.

Figure 55:
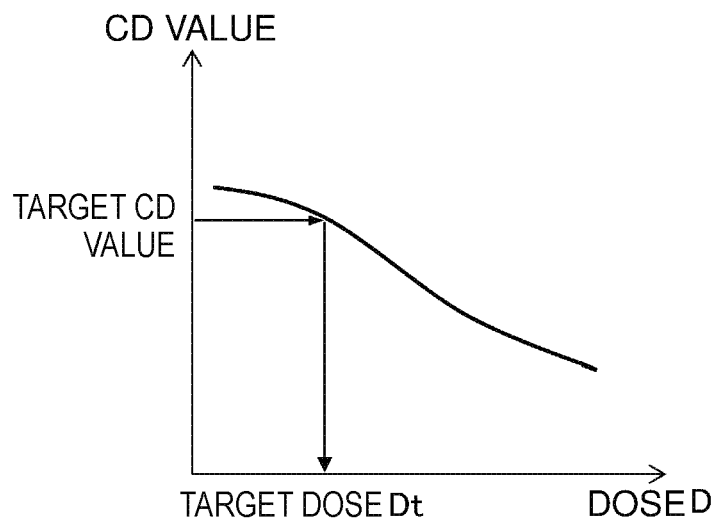
FIG. 55 is a graph illustrating an exemplary relation between the CD value and a dose.

FIG. 55 is a graph illustrating an exemplary relation between the CD value and the dose D. The horizontal axis represents the dose D, and the vertical axis represents the CD value. A curve representing the relation as illustrated in FIG. 55 is referred to as a "CD-dose curve". For example, the exposure control unit 40E sorts data in the file A0 described above with reference to FIG. 31 into data of the relation between the CD value and the dose D for a wafer exposed in the past under the same exposure condition as the wafer WF to be exposed this time, and stores the relation data in a file F.

Then, the exposure control unit 40E produces an approximate curve representing the relation between the CD value and the dose D based on the file F, and the value of a target dose Dt for a target CD value can be obtained by using the function of the approximate curve (in other words, CD-dose curve). Note that the approximate curve of the relation between the CD value and the dose D can be obtained by using an exposure simulator software program. The CD-dose curve illustrated in FIG. 55 is an example of a "third approximate curve" in the present disclosure.

Figure 56:
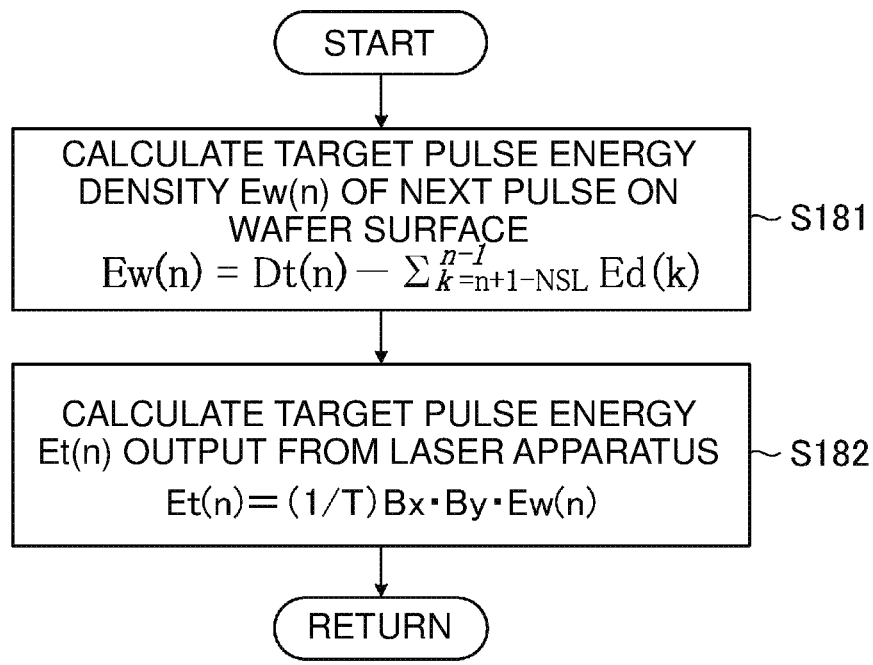
FIG. 56 is a flowchart illustrating an exemplary subroutine applied to step S107 in FIG. 53.

FIG. 56 is a flowchart illustrating an exemplary subroutine applied to step S107 in FIG. 53. At step S181, the exposure control unit 40E calculates target pulse energy density Ew(n) of the next pulse on the surface of the wafer WF by using Expression (6) below.

[Expression 2]

$$Ew(n) = Dt(n) - \sum_{k=n+1-NSL}^{n-1} Ed(k) \quad (6)$$

In the expression, NSL represents the number of pulses with which the resist is irradiated. In addition, Ed(k) represents energy density of each pulse on the wafer. The energy density Ed(k) is measured by the pulse energy sensor 452 disposed in the exposure apparatus 14, and data thereof is stored in a non-illustrated storage unit.

Subsequently at step S182, the exposure control unit 40E calculates the target pulse energy Et(n) output from the laser apparatus 12 by using Expression (7) below.

$$Et(n)=(1/T)Bx \cdot By \cdot Ew(n) \quad (7)$$

In the expression, T represents the transmittance of a pulse laser beam in the exposure apparatus 14 from a laser exit of the laser apparatus 12 to the wafer WF. In addition, Bx·By represents the area of the static exposure area SEA of a laser beam with which the wafer WF is irradiated (refer to FIG. 8).

After step S182, the exposure control unit 40E ends the flowchart in FIG. 56 and returns to the flowchart in FIG. 53.

9.3 Effect

With the lithography system 105 according to Embodiment 5, magnification can be set closer to target magnification by controlling the dose in a region in which the magnification cannot be corrected with the configuration of Embodiment 1, in other words, a region of $\lambda_M(n)<\lambda_S(n)$ or $\lambda_L(n)<\lambda_M(n)$, and in addition, the CD is maintained in the allowable range by dose control. Accordingly, overlay accuracy and CD uniformity improve.

9.4 Modification

In Embodiment 5, the height of the wafer WF is measured by the focus sensor 58 of the exposure apparatus 14, but the present invention is not limited to this example. Similarly to Embodiment 1, the wafer height may be measured by the wafer examination device 310 in advance and then processing may be performed.

Specifically, the lithography control unit 110 may execute the calculation processing at steps S106E and S107 in FIG. 53 and may transmit data of the target wavelength $\lambda t(n)$ and the target pulse energy Et(n) of the first pulse to the final pulse in the scanning field SF to the laser control unit 20 through the exposure control unit 40E in advance. Then, the laser control unit 20 may output a laser beam controlled to the target wavelength $\lambda t(n)$ and the target pulse energy Et(n) for each pulse.

9.5 Other

As described above in Embodiments 3, 4, and 5, control to set the CD value in the allowable range is possible through correction control by the magnification correction lens 502, correction control of the focus position, and correction control of the dose. These three kinds of correction control may be combined to further improve magnification correction in the direction (scanning width direction) orthogonal to the scanning direction while the CD value is maintained in the allowable range.

10. Exemplary Excimer Laser Apparatus that Uses Solid-State Laser Device as Oscillator

10.1 Configuration

The laser apparatus 12 of the configuration exemplarily described with reference to FIG. 9 includes a line narrowed gas laser apparatus as the oscillator 22, but the configuration of a laser apparatus is not limited to the example in FIG. 9. A laser apparatus 212 illustrated in FIG. 57 may be used in place of the laser apparatus 12 illustrated in FIG. 9. In the configuration illustrated in FIG. 57, an element common or similar to that in FIG. 9 is denoted by the same reference sign, and thus description will be omitted.

Figure 57:
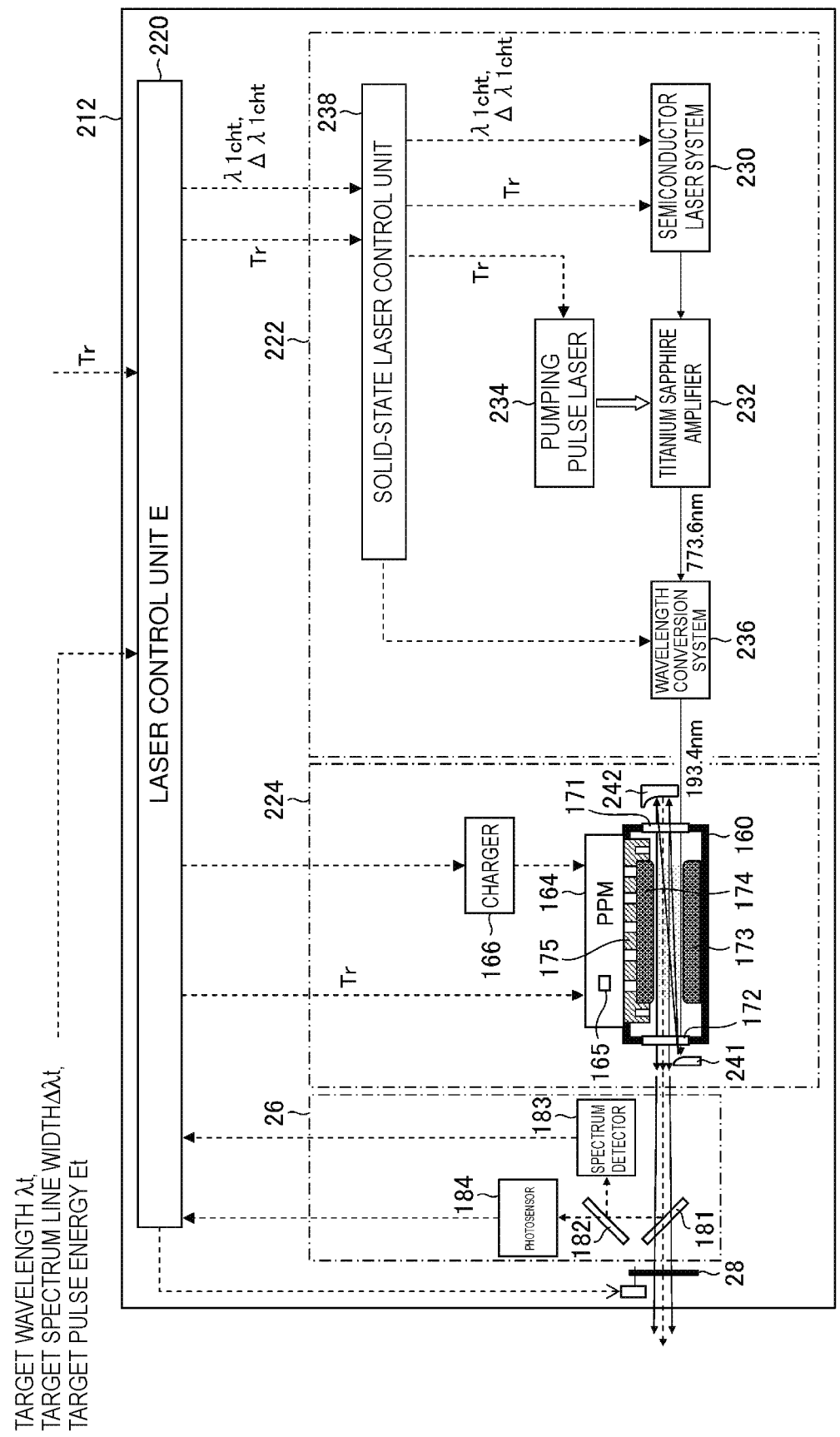
FIG. 57 schematically illustrates another exemplary configuration of the laser apparatus.

The laser apparatus 212 illustrated in FIG. 57 is an excimer laser apparatus that uses a solid-state laser device as an oscillator, and includes a solid-state laser system 222, an excimer amplifier 224, and a laser control unit 220.

The solid-state laser system 222 includes a semiconductor laser system 230, a titanium sapphire amplifier 232, a pumping pulse laser 234, a wavelength conversion system 236, and a solid-state laser control unit 238.

The semiconductor laser system 230 includes a distributed-feedback (DFB) semiconductor laser 250 configured to output a CW laser beam having a wavelength of 773.6 nm approximately, and a semiconductor optical amplifier (SOA) 260 configured to generate pulses of the CW laser beam. An exemplary configuration of the semiconductor laser system 230 will be described later with reference to FIG. 58.

The titanium sapphire amplifier 232 includes titanium sapphire crystal. The titanium sapphire crystal is disposed on the optical path of a pulse laser beam subjected to pulse amplification at the SOA of the semiconductor laser system 230. The pumping pulse laser 234 may be a laser apparatus configured to output second-order harmonic light of a YLF laser. Yttrium lithium fluoride (YLF) is solid-state laser crystal expressed by the chemical formula $LiYF_4$.

The wavelength conversion system 236 includes a plurality of non-linear optical crystals, performs wavelength conversion of an incident pulse laser beam, and outputs a fourth-order harmonic pulse laser beam. The wavelength conversion system 236 includes, for example, LBO crystal and KBBF crystal. The LBO crystal is non-linear optical crystal expressed by the chemical formula $LiB_3O_5$. The KBBF crystal is non-linear optical crystal expressed by the chemical formula $KBe_2BO_3F_2$. Each crystal is disposed on a non-illustrated rotation stage so that the incident angle on the crystal can be changed.

The solid-state laser control unit 238 controls the semiconductor laser system 230, the pumping pulse laser 234, and the wavelength conversion system 236 in accordance with a command from the laser control unit 220.

The excimer amplifier 224 includes the chamber 160, the PPM 164, the charger 166, a convex mirror 241, and a concave mirror 242. The chamber 160 includes the windows 171 and 172, the pair of electrodes 173 and 174, and the electrically insulating member 175. ArF laser gas is introduced into the chamber 160. The PPM 164 includes the switch 165 and the charging capacitor.

The excimer amplifier 224 has a configuration in which seed light having a wavelength of 193.4 nm is amplified by passing through a discharge space between the pair of electrodes 173 and 174 three times. The seed light having a wavelength of 193.4 nm is a pulse laser beam output from the solid-state laser system 222.

The convex mirror 241 and the concave mirror 242 are disposed outside the chamber 160 so that the pulse laser beam output from the solid-state laser system 222 is expanded by passing three times.

The seed light having a wavelength of 193.4 nm approximately and having entered the excimer amplifier 224 passes through a discharge space between a pair of discharge electrodes 412 and 413 three times by being reflected at the convex mirror 241 and the concave mirror 242. Accordingly, the beam of the seed light is enlarged and amplified.

10.2 Operation

When having received the target wavelength $\lambda t$, a target spectrum line width $\Delta\lambda t$, and the target pulse energy Et from the exposure control unit 40, the laser control unit 220 calculates, from table data, an approximate expression, or the like, a target wavelength $\lambda 1 cht$ and a target spectrum line width $\Delta\lambda 1 cht$ of a pulse laser beam from the semiconductor laser system 230 with which the target values are achieved.

The laser control unit 220 transmits the target wavelength $\lambda 1 cht$ and the target spectrum line width $\Delta\lambda 1 cht$ to the solid-state laser control unit 238 and sets charging voltage to the charger 166 such that a pulse laser beam output from the excimer amplifier 224 has the target pulse energy Et.

The solid-state laser control unit 238 controls the semiconductor laser system 230 such that the wavelength and spectrum line width of a pulse laser beam output from the semiconductor laser system 230 become closer to the target wavelength $\lambda 1 cht$ and the target spectrum line width $\Delta\lambda 1 cht$. The scheme of the control performed by the solid-state laser control unit 238 will be described later with reference to FIGS. 58 to 61.

In addition, the solid-state laser control unit 238 controls two non-illustrated rotation stages to achieve such an incident angle that wavelength conversion efficiency of the LBO crystal and the KBBF crystal of the wavelength conversion system 236 is maximum.

When the light emission trigger signal Tr is transmitted from the exposure control unit 40 to the laser control unit 220, a trigger signal is input to the semiconductor laser system 230, the pumping pulse laser 234, and the switch 165 of the PPM 164 of the excimer amplifier 224 in synchronization with the light emission trigger signal Tr. As a result, pulse current is input to the SOA of the semiconductor laser system 230, and a pulse-amplified pulse laser beam is output from the SOA.

The pulse laser beam is output from the semiconductor laser system 230 and further pulse-amplified at the titanium sapphire amplifier 232. The pulse laser beam then enters the wavelength conversion system 236. As a result, the pulse laser beam of the target wavelength $\lambda t$ is output from the wavelength conversion system 236.

When having received the light emission trigger signal Tr from the exposure control unit 40, the laser control unit 220 transmits a trigger signal to each of the SOA 260 of the semiconductor laser system 230 to be described later, the switch 165 of the PPM 164, and the pumping pulse laser 234 such that discharge occurs when a pulse laser beam output from the solid-state laser system 222 enters the discharge space of the chamber 160 of the excimer amplifier 224.

As a result, the pulse laser beam output from the solid-state laser system 222 is amplified at the excimer amplifier 224 through three-time passing. The pulse laser beam amplified by the excimer amplifier 224 is sampled by the beam splitter 181 of the monitor module 26, the pulse energy E is measured by using the photosensor 184, and the wavelength $\lambda$ and the spectrum line width $\Delta\lambda$ are measured by using the spectrum detector 183.

The laser control unit 220 may correct and control the charging voltage of the charger 166 and a wavelength $\lambda 1 ch$ and a spectrum line width $\Delta\lambda 1 ch$ of the pulse laser beam output from the semiconductor laser system 230 based on the pulse energy E, the wavelength $\lambda$, and the spectrum line width $\Delta\lambda$ measured by using the monitor module 26 such that the difference between the pulse energy E and the target pulse energy Et, the difference between the wavelength $\lambda$ and the target wavelength $\lambda t$, and the difference between the spectrum line width $\Delta\lambda$ and the target spectrum line width $\Delta\lambda t$ each become closer to zero.

10.3 Description of Semiconductor Laser System 10.3.1 Configuration

Figure 58:
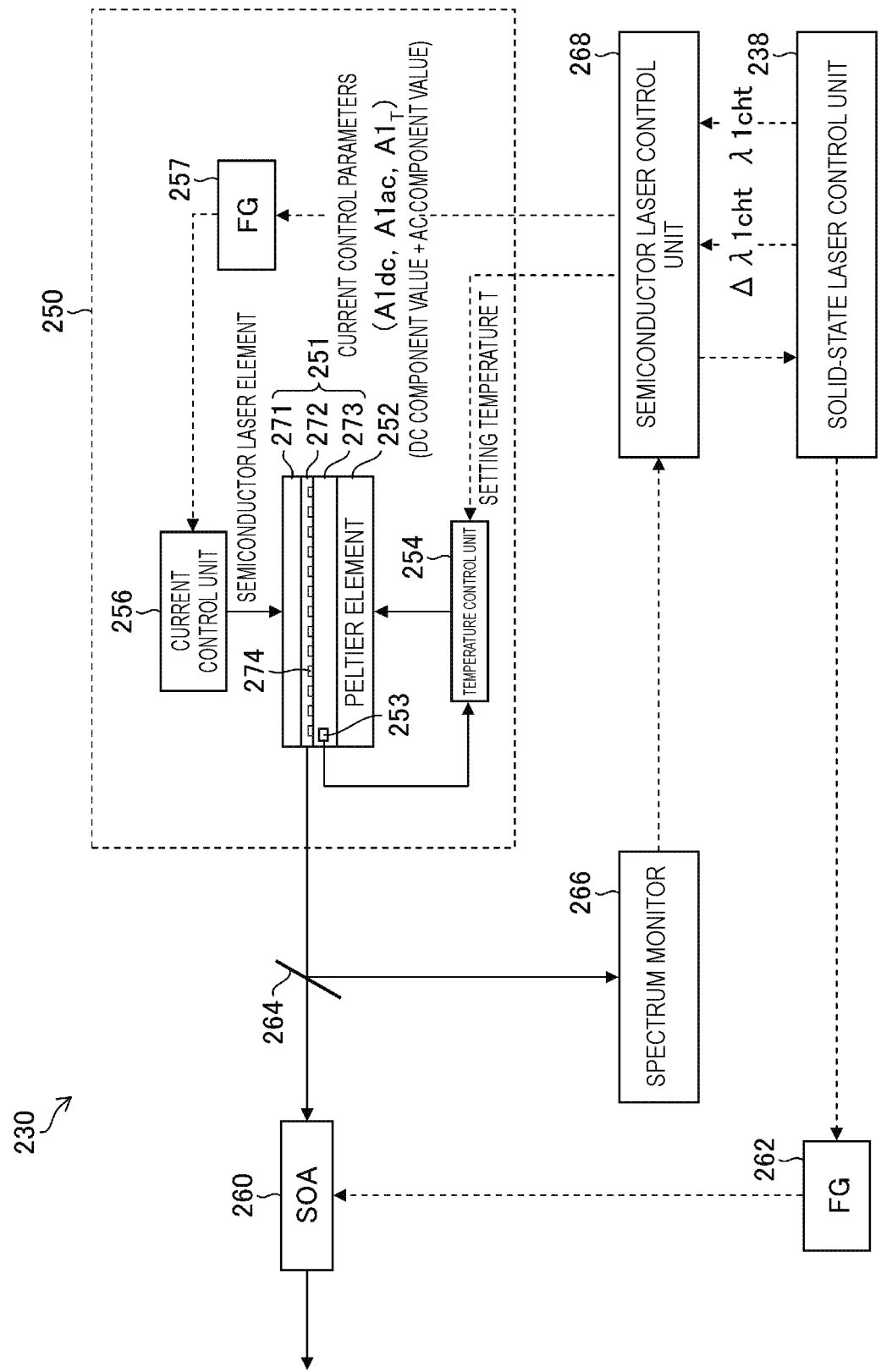
FIG. 58 schematically illustrates an exemplary configuration of a semiconductor laser system.

FIG. 58 illustrates an exemplary configuration of the semiconductor laser system 230. The semiconductor laser system 230 includes the distributed-feedback semiconductor laser 250 of a single longitudinal mode, the SOA 260, a function generator (FG) 262, a beam splitter 264, a spectrum monitor 266, and a semiconductor laser control unit 268. The distributed-feedback semiconductor laser is referred to as a "DFB laser".

The DFB laser 250 outputs a continuous wave (CW) laser beam having a wavelength of 773.6 nm approximately. The DFB laser 250 can change its oscillation wavelength by current control and/or temperature control.

The DFB laser 250 includes a semiconductor laser element 251, a Peltier element 252, a temperature sensor 253, a temperature control unit 254, a current control unit 256, and a function generator 257. The semiconductor laser element 251 includes a first clad layer 271, an active layer 272, and a second clad layer 273 and includes a grating 274 at the boundary between the active layer 272 and the second clad layer 273.

10.3.2 Operation

The DFB laser 250 has an oscillation central wavelength that can be changed by changing a setting temperature T and/or a current value A of the semiconductor laser element 251.

When a spectrum line width is controlled by chirping the oscillation wavelength of the DFB laser 250 at high speed, the control of the spectrum line width can be performed by changing the current value A of current flowing through the semiconductor laser element 251 at high speed.

Specifically, the central wavelength $\lambda 1ch$ and the spectrum line width $\Delta\lambda 1ch$ of the pulse laser beam output from the semiconductor laser system 230 can be controlled at high speed by transmitting values of parameters of a DC component value $A1dc$, a variation width $A1ac$ of an AC component, and a period $A1_T$ of the AC component as current control parameters from the semiconductor laser control unit 268 to the function generator 257.

The spectrum monitor 266 may measure wavelength by using, for example, a spectrometer or a heterodyne interferometer.

The function generator 257 outputs, to the current control unit 256, an electric signal having a waveform in accordance with a current control parameter designated by the semiconductor laser control unit 268. The current control unit 256 performs current control such that current in accordance with the electric signal from the function generator 257 flows through the semiconductor laser element 251. Note that the function generator 257 may be provided outside the DFB laser 250. For example, the function generator 257 may be included in the semiconductor laser control unit 268.

Figure 59:
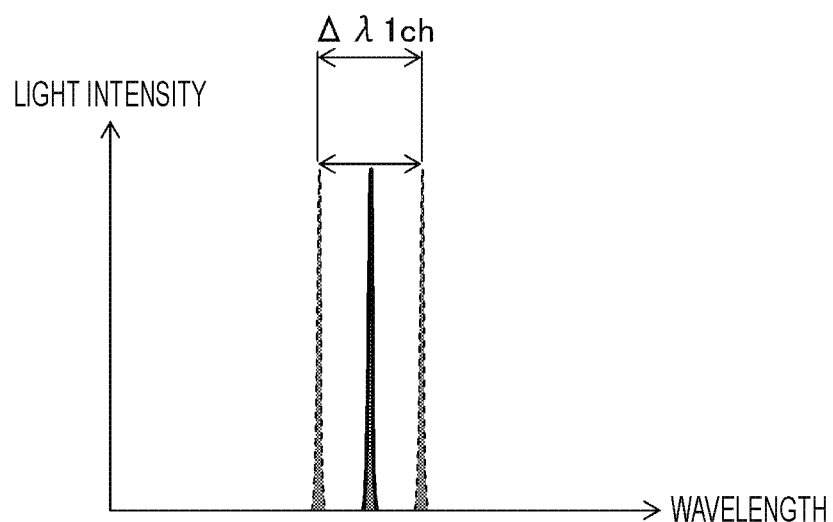
FIG. 59 is a conceptual diagram of a spectrum line width achieved by chirping.

FIG. 59 is a conceptual diagram of a spectrum line width achieved by chirping. The spectrum line width $\Delta\lambda 1ch$ is measured as the difference between a longest wavelength and a shortest wavelength generated by chirping.

Figure 60:
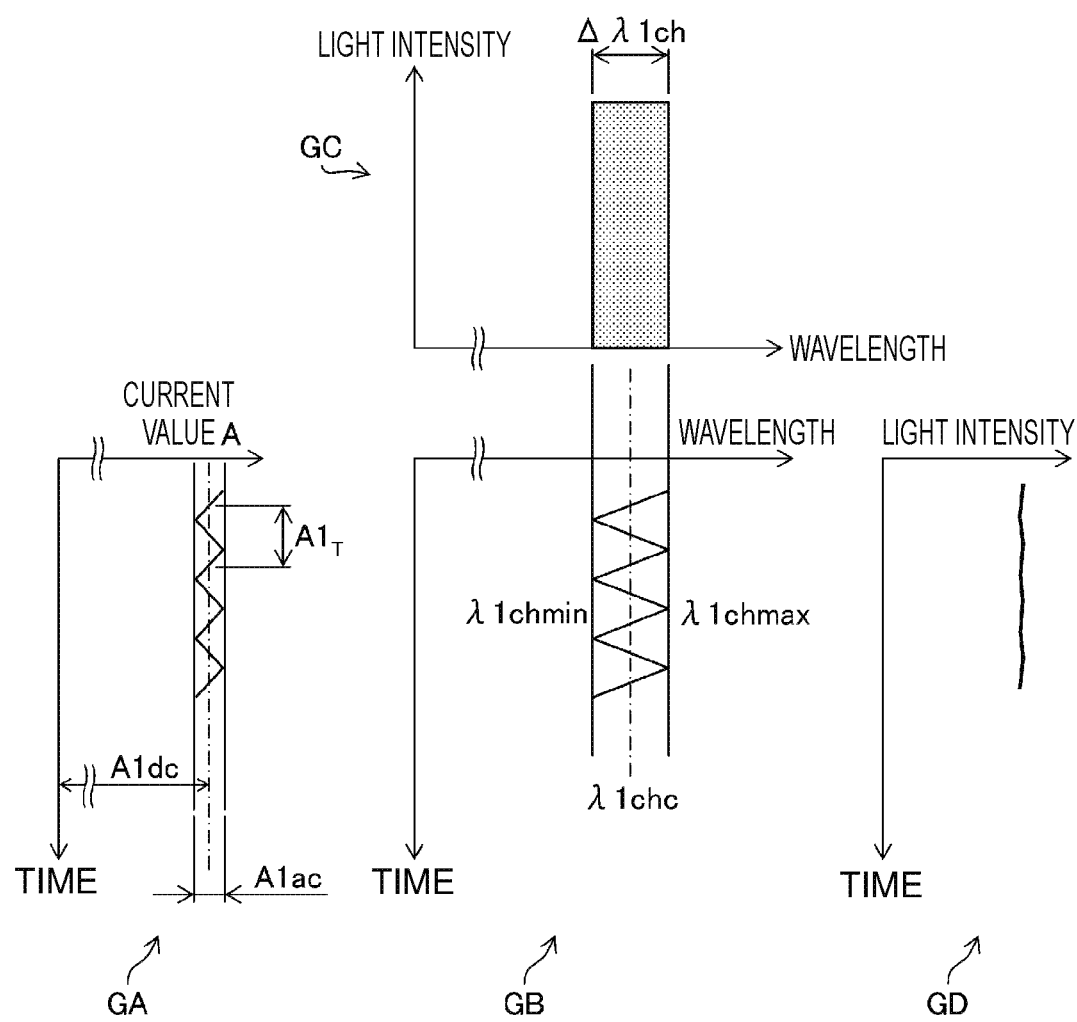
FIG. 60 is a schematic diagram illustrating the relation among current flowing through a semiconductor laser, wavelength change by chirping, a spectrum waveform, and light intensity.

FIG. 60 is a schematic diagram illustrating the relation among current flowing through the DFB laser 250, wavelength change by chirping, a spectrum waveform, and light intensity. A graph GA displayed at a lower-left part of FIG. 60 is a graph illustrating change of the current value A of current flowing through the semiconductor laser element 251. A graph GB displayed at a lower-central part of FIG. 60 is a graph illustrating chirping caused by the current of the graph GA. A graph GC displayed at an upper part of FIG. 60 is a schematic diagram of a spectrum waveform obtained by the chirping of the graph GB. A graph GD displayed at a lower-right part of FIG. 60 is a graph illustrating change of the light intensity of a laser beam output from the semiconductor laser system 230 due to the current of the graph GA.

Current control parameters of the semiconductor laser system 230 include the following values as illustrated in the graph GA.

$A1dc$: DC component value of current flowing through the semiconductor laser element $A1ac$: variation width of the AC component of current flowing through the semiconductor laser element (the difference between a maximal value and a minimal value of the current)

$A1_T$: period of the AC component of current flowing through the semiconductor laser element In the example illustrated in FIG. 60, triangular wave is illustrated as an exemplary AC component of a current control parameter, and variation of light intensity of the CW laser beam output from the DFB laser 250 due to variation of triangular-wave current is small.

The relation between a time width $D_{TW}$ of an amplification pulse of the SOA 260 and the period $A1_T$ of the AC component preferably satisfies Expression (8) below.

$$D_{TW}=n \cdot A1_T \qquad (8)$$

In Expression (8), n is an integer equal to or larger than one.

When the relation of Expression (8) is satisfied, change of the spectrum waveform of an amplified pulse laser beam can be suppressed irrespective of the timing of pulse amplification at the SOA 260.

Even when Expression (8) is not satisfied, a pulse width range at the SOA 260 is, for example, 10 ns to 50 ns. The period $A1_T$ of the AC component of current flowing through the semiconductor laser element 251 is sufficiently shorter than the pulse width of the SOA 260 (the time width $D_TW$ of an amplification pulse). For example, the period $A1_T$ is preferably 1/1000 or more and 1/10 or less of the pulse width of the SOA 260, more preferably 1/1000 or more and 1/100 or less thereof.

Figure 61:
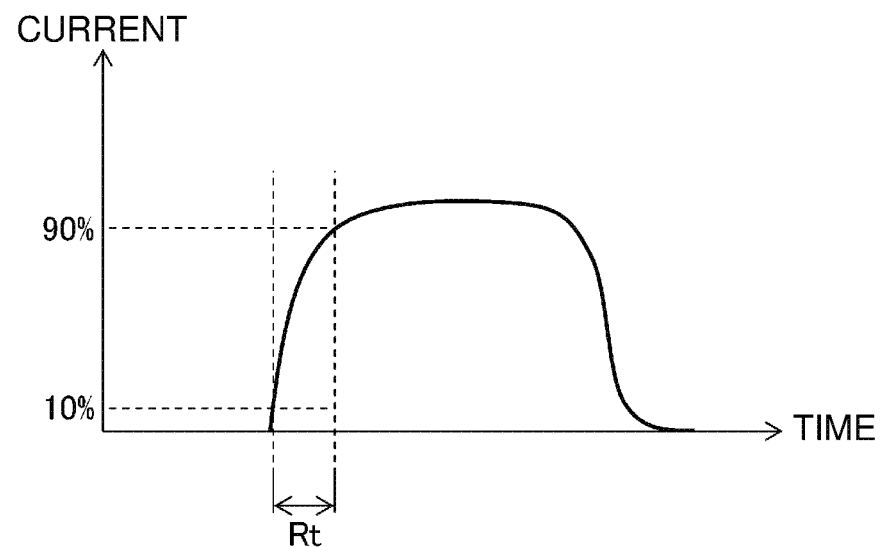
FIG. 61 is a graph for description of a rising time of a semiconductor optical amplifier.

The SOA 260 preferably has a rising time that is, for example, equal to or smaller than 2 ns, more preferably equal to or smaller than 1 ns. The rising time is a time Rt required when the amplitude of the waveform of pulse current increases from 10% to 90% of a maximum amplitude as illustrated in FIG. 61.

10.4 Effect

The laser apparatus 212, which uses the solid-state laser system 222 as an oscillator, has the following advantages over a case in which an excimer laser is used as an oscillator.
- [1] The solid-state laser system 222 can control the wavelength $\lambda$ and the spectrum line width $\Delta\lambda$ at high speed and high accuracy by controlling the current value A of the DFB laser 250. Specifically, the laser apparatus 212 can control the oscillation wavelength and the spectrum line width $\Delta\lambda$ at high speed by controlling the current value A of the DFB laser 250 immediately after receiving data of the target wavelength $\lambda t$ and the target spectrum line width $\Delta\lambda t$. Thus, the wavelength $\lambda$ and the spectrum line width $\Delta\lambda$ of a pulse laser beam output from the laser apparatus 212 can be changed and controlled at high speed and high accuracy for each pulse.
- [2] Moreover, spectrum waveforms of various functions, which are different from a normal spectrum waveform can be generated through chirping by controlling the current value A of the DFB laser 250.
- [3] Thus, a laser apparatus that includes an oscillator using a solid-state laser system 222 including a DFB laser 250 and includes an excimer amplifier 224 is preferable for controlling the wavelength or spectrum line width obtained from a spectrum waveform of the moving integrated value of a spectrum waveform as a laser control parameter.

10.5 Modification

In the example illustrated in FIG. 60, triangular wave is illustrated as an exemplary waveform of the AC component of current, but the present invention is not limited to this example and the waveform may be any waveform that changes in a constant period, for example. Examples of the waveform of the AC component other than triangular wave include sine wave and square wave. Various target spectrum waveforms can be generated by controlling the waveform of the AC component.

10.6 Other

An embodiment of a solid-state laser device is not limited to the examples illustrated in FIGS. 57 to 61 and may be, for example, a solid-state laser system including a DFB laser having a wavelength of 1547.2 nm approximately and a SOA, and a wavelength conversion system may be a laser apparatus configured to output eighth-order harmonic light of 193.4 nm. Another solid-state laser device may be a system including a CW oscillation DFB laser and a SOA and configured to pulse-amplify wavelength by controlling the current value of current flowing through the DFB laser and causing pulse current to flow through the SOA.

In the example illustrated in FIG. 57, a multi-pass amplifier is illustrated as an exemplary excimer amplifier, but the present invention is not limited to this embodiment, and the excimer amplifier may be, for example, an amplifier including an optical resonator such as a Fabry-Perot resonator or a ring resonator.

11. Hardware Configurations of Various Control Units

A control device that functions as the laser control unit 20, the exposure control unit 40, the lithography control unit 110, the solid-state laser control unit 238, the semiconductor laser control unit 268, and any other control unit can be achieved by hardware and software combination of one or a plurality of computers. The software is synonymous with a program. The computers conceptually include a programmable controller. Each computer may include a central processing unit (CPU) and a storage device such as a memory. The CPU is an example of a processor.

A storage device is a non-transitory computer-readable medium as a tangible entity and includes, for example, a memory that is a main storage device and a storage that is an auxiliary storage device. The computer-readable medium may be, for example, a semiconductor memory, a hard disk drive (HDD) device, a solid-state drive (SSD) device, or a combination of a plurality of these devices. A program executed by a processor is stored in the computer-readable medium.

Some or all of processing functions of the control device may be implemented by using an integrated circuit such as a field programmable gate array (FPGA) or an application specific integrated circuit (ASIC).

Functions of a plurality of control devices can be implemented by a single control device. Moreover, in the present disclosure, the control device may be connected with each other through a communication network such as a local area network or the Internet. In a distributed computing environment, a program unit may be stored in local and remote memory storage devices.

12. Electronic Device Manufacturing Method

Figure 62:
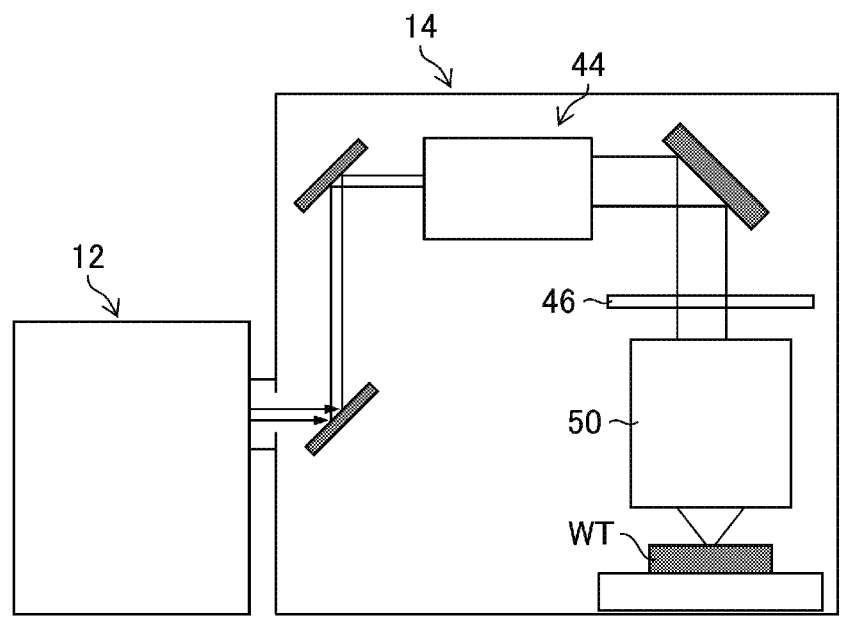
FIG. 62 schematically illustrates an exemplary configuration of an exposure apparatus.

FIG. 62 schematically illustrates an exemplary configuration of the exposure apparatus 14. The exposure apparatus 14 includes the illumination optical system 44 and the projection optical system 50. The illumination optical system 44 illuminates, with a laser beam incident from the laser apparatus 12, the reticle pattern of the reticle 46 disposed on the non-illustrated reticle stage 48. The laser beam having transmitted through the reticle 46 is subjected to reduced projection through the projection optical system 50 and imaged on a non-illustrated workpiece disposed on a workpiece table WT. The workpiece may be a photosensitive substrate such as a semiconductor wafer to which resist is applied. The workpiece table WT may be the wafer stage 54.

The exposure apparatus 14 translates the reticle stage 48 and the workpiece table WT in synchronization so that the workpiece is exposed to the laser beam on which the reticle pattern is reflected. A semiconductor device can be manufactured through a plurality of processes after the reticle pattern is transferred onto the semiconductor wafer through the exposure process as described above. The semiconductor device is an example of an "electronic device" in the present disclosure.

The laser apparatus 12 in FIG. 62 may be, for example, the laser apparatus 212 including the solid-state laser system 222, which is described with reference to FIG. 57.

13. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:
1. An electronic device manufacturing method comprising performing scanning exposure of a wafer to a pulse laser beam in an exposure apparatus, the electronic device manufacturing method further comprising:
determining magnification that is a distortion component in a scanning width direction orthogonal to a scanning direction based on a pattern formed on the wafer in a scanning field of the wafer;
measuring a wafer height at a plurality of points in the scanning field of the wafer and determining an average value of the wafer height in the scanning width direction in the scanning field based on results of the measurement of the wafer height;
determining a wavelength range of the pulse laser beam in which an allowable critical dimension (CD) value is obtained in a case of a focus position based on the average value of the wafer height;
determining a first wavelength of the pulse laser beam at which the magnification is obtained;
determining a target wavelength of the pulse laser beam based on the wavelength range and the first wavelength;

generating, by a laser apparatus, the pulse laser beam that has the target wavelength for each pulse and outputting the pulse laser beam to the exposure apparatus; and performing exposure of the scanning field of the wafer to the pulse laser beam.

2. The electronic device manufacturing method according to claim 1, wherein the target wavelength is determined such that $\lambda t=\lambda_M$ holds for $\lambda_S \leq \lambda_M \leq \lambda_L$,
$\lambda t=\lambda_S$ holds for $\lambda_M<\lambda_S$, and
$\lambda t=\lambda_L$ holds for $\lambda_L<\lambda_M$, where $\lambda_S$ represents a shortest wavelength in the wavelength range, $\lambda_L$ represents a longest wavelength in the wavelength range, $\lambda_M$ represents the first wavelength, and $\lambda t$ represents the target wavelength.

3. The electronic device manufacturing method according to claim 1, wherein the wavelength range is determined based on a first approximate curve representing a relation between the CD value and the wavelength of the pulse laser beam.

4. The electronic device manufacturing method according to claim 1, wherein the first wavelength is determined based on a second approximate curve representing a relation between the magnification and the wavelength of the pulse laser beam.

5. The electronic device manufacturing method according to claim 1, wherein the wafer height is measured by using a wafer examination device.

6. The electronic device manufacturing method according to claim 1, wherein the average value of the wafer height is determined for each of pulse numbers indicating radiation orders of respective pulses of the pulse laser beam radiated in the scanning field.

7. The electronic device manufacturing method according to claim 1, wherein the focus position based on the average value of the wafer height is determined by subtracting the average value of the wafer height from a reference focus position.

8. An electronic device manufacturing method comprising performing scanning exposure of a wafer to a pulse laser beam in an exposure apparatus, the electronic device manufacturing method further comprising:

determining magnification that is a distortion component in a scanning width direction orthogonal to a scanning direction based on a pattern formed on the wafer in a scanning field of the wafer;

measuring a focus position at a plurality of points in the scanning field of the wafer and determining an average value of the focus position in the scanning width direction in the scanning field based on results of the measurement of the focus position;

determining a wavelength range of the pulse laser beam in which an allowable critical dimension (CD) value is obtained in a case of the average value of the focus position;

determining a first wavelength of the pulse laser beam at which the magnification is obtained;

determining a target wavelength of the pulse laser beam based on the wavelength range and the first wavelength;

generating, by a laser apparatus, the pulse laser beam that has the target wavelength for each pulse and outputting the pulse laser beam to the exposure apparatus; and performing exposure of the scanning field of the wafer to the pulse laser beam.

9. The electronic device manufacturing method according to claim 8, wherein the target wavelength is determined such that $\lambda t=\lambda_M$ holds for $\lambda_S \leq \lambda_M \leq \lambda_L$,
$\lambda t=\lambda_S$ holds for $\lambda_M<\lambda_S$, and
$\lambda t=\lambda_L$ holds for $\lambda_L<\lambda_M$, where $\lambda_S$ represents a shortest wavelength in the wavelength range, $\lambda_L$ represents a longest wavelength in the wavelength range, $\lambda_M$ represents the first wavelength, and $\lambda t$ represents the target wavelength.

10. The electronic device manufacturing method according to claim 9, wherein the exposure apparatus includes a projection optical system, and some lenses of the projection optical system are used as a magnification correction lens, and the electronic device manufacturing method further comprises:

determining a control value of the magnification correction lens with which a difference between $\lambda_M$ and $\lambda_S$ approaches zero in a case of $\lambda_M<\lambda_S$;

determining a control value of the magnification correction lens with which a difference between $\lambda_M$ and $\lambda_L$ approaches zero in a case of $\lambda_L<\lambda_M$; and controlling the magnification correction lens based on the control value of the magnification correction lens.

11. The electronic device manufacturing method according to claim 8, further comprising:

setting the target wavelength $\lambda t$ to $\lambda_M$, where $\lambda_S$ represents a shortest wavelength in the wavelength range, $\lambda_L$ represents a longest wavelength in the wavelength range, $\lambda_M$ represents the first wavelength, and $\lambda t$ represents the target wavelength;

determining a target focus position with which the CD value is in an allowable range in a case of $\lambda_M<\lambda_S$ or $\lambda_L<\lambda_M$; and controlling a wafer stage of the exposure apparatus based on the determined target focus position.

12. The electronic device manufacturing method according to claim 8, further comprising:

setting the target wavelength $\lambda t$ to $\lambda_M$, where $\lambda_S$ represents a shortest wavelength in the wavelength range, $\lambda_L$ represents a longest wavelength in the wavelength range, $\lambda_M$ represents the first wavelength, and $\lambda t$ represents the target wavelength;

determining a target dose with which the CD value is in an allowable range in a case of $\lambda_M<\lambda_S$ or $\lambda_L<\lambda_M$; and controlling pulse energy of the pulse laser beam based on the target dose.

13. The electronic device manufacturing method according to claim 12, wherein the exposure apparatus includes a pulse energy sensor unit for measuring a dose on the surface of the wafer.

14. The electronic device manufacturing method according to claim 13, wherein the exposure apparatus includes
a reticle stage, and
an illumination optical system configured to irradiate a reticle on the reticle stage with the pulse laser beam, and the pulse energy sensor unit includes
a beam splitter disposed on an optical path between the illumination optical system and the reticle, and
a pulse energy sensor.

15. The electronic device manufacturing method according to claim 13, wherein the target dose is determined based on a third approximate curve representing a relation between the CD value and the dose.

16. The electronic device manufacturing method according to claim 8, wherein
the exposure apparatus includes a focus sensor configured to measure the focus position at the plurality of points in the scanning field of the wafer, and
the measurement of the focus position is performed by the focus sensor.

17. The electronic device manufacturing method according to claim 16, wherein the focus sensor includes a pre-reading autofocus sensor configured to measure the focus position at the plurality of points in an unexposed region of the scanning field ahead of the exposure by the pulse laser beam.

18. An electronic device manufacturing method comprising performing scanning exposure of a wafer to a pulse laser beam in an exposure apparatus, the electronic device manufacturing method further comprising:
   determining magnification that is a distortion component in a scanning width direction orthogonal to a scanning direction based on a pattern formed on the wafer in a scanning field of the wafer;
   measuring a focus position at a plurality of points in the scanning field of the wafer and determining an average value of the focus position in the scanning width direction in the scanning field based on results of the measurement of the focus position;
   determining a first wavelength of the pulse laser beam at which the magnification is obtained;
   setting a target wavelength of the pulse laser beam to the first wavelength;
   determining a target focus position at which a critical dimension (CD) value is in an allowable range when the wavelength of the pulse laser beam is the first wavelength;
   controlling a wafer stage of the exposure apparatus based on the determined target focus position;
   generating, by a laser apparatus, the pulse laser beam that has the target wavelength for each pulse and outputting the pulse laser beam to the exposure apparatus; and
   performing exposure of the scanning field of the wafer to the pulse laser beam.

19. The electronic device manufacturing method according to claim 18, wherein
the exposure apparatus includes a focus sensor configured to measure the focus position at the plurality of points in the scanning field of the wafer, and
the measurement of the focus position is performed by the focus sensor.

* * * * *